(12) United States Patent
Seo et al.

(10) Patent No.: US 12,418,002 B2
(45) Date of Patent: Sep. 16, 2025

(54) DISPLAY DEVICE AND METHOD FOR MANUFACTURING THE SAME

(71) Applicant: Samsung Display Co., LTD., Yongin-si (KR)

(72) Inventors: Ki Seong Seo, Seoul (KR); Jin Woo Choi, Seoul (KR); Sung Eun Baek, Suwon-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 926 days.

(21) Appl. No.: 17/570,379

(22) Filed: Jan. 6, 2022

(65) Prior Publication Data
US 2022/0352268 A1    Nov. 3, 2022

(30) Foreign Application Priority Data
Apr. 30, 2021    (KR) .................. 10-2021-0056208

(51) Int. Cl.
| | |
|---|---|
| H10K 59/122 | (2023.01) |
| H01L 25/075 | (2006.01) |
| H10H 20/851 | (2025.01) |
| H10K 50/115 | (2023.01) |
| H10K 59/38 | (2023.01) |
| H10D 86/40 | (2025.01) |

(Continued)

(52) U.S. Cl.
CPC ....... *H01L 25/0753* (2013.01); *H10H 20/851* (2025.01); *H10K 50/115* (2023.02); *H10K 59/122* (2023.02); *H10K 59/38* (2023.02); *H10D 86/451* (2025.01); *H10H 29/142* (2025.01); *H10K 59/1201* (2023.02); *H10K 71/00* (2023.02)

(58) Field of Classification Search
CPC .... H10K 50/115; H10K 59/122; H10K 59/38; H01L 25/167; H10H 20/851; H10H 29/142; H10D 86/451
See application file for complete search history.

(56) References Cited

U.S. PATENT DOCUMENTS

| | | | |
|---|---|---|---|
| 2017/0077448 A1* | 3/2017 | Sakamoto | ............ H10K 59/879 |
| 2023/0232699 A1* | 7/2023 | Mizukoshi | ........... H10K 71/221 438/99 |

(Continued)

FOREIGN PATENT DOCUMENTS

KR    1020170084139    7/2017

*Primary Examiner* — Jeff W Natalini
*Assistant Examiner* — Brandon C Fox
(74) *Attorney, Agent, or Firm* — CANTOR COLBURN LLP

(57) ABSTRACT

A display device includes a substrate, a pixel electrode disposed on the substrate, a bank covering an edge of the pixel electrode and defining a light-emitting area, a first organic layer disposed on the bank and non-overlapping the light-emitting area, a plurality of light-emitting elements arranged on the pixel electrode, where each of the plurality of light-emitting elements extends perpendicular to the pixel electrode, a planarization layer disposed on the pixel electrode, the bank and the first organic layer, where the planarization layer is filled between the plurality of light-emitting elements, and a common electrode disposed on the planarization layer and the plurality of light-emitting elements, where the first organic layer is disposed between the bank and the planarization layer, and overlaps the bank.

27 Claims, 47 Drawing Sheets

(51) Int. Cl.
    *H10H 29/14*    (2025.01)
    *H10K 59/12*    (2023.01)
    *H10K 71/00*    (2023.01)

(56) References Cited

U.S. PATENT DOCUMENTS

2024/0188399 A1* 6/2024 Sung .................... H10K 50/858
2025/0143025 A1* 5/2025 Seo ..................... H10H 20/857

* cited by examiner

DISPLAY DEVICE AND METHOD FOR MANUFACTURING THE SAME

This application claims priority to Korean Patent Application No. 10-2021-0056208 filed on Apr. 30, 2021, and all the benefits accruing therefrom under 35 U.S.C. § 119, the content of which in its entirety is herein incorporated by reference.

BACKGROUND

1. Field

Embodiments of the invention relate to a display device, and a method for manufacturing the display device.

2. Description of Related Art

Importance of a display device is increasing under development of multimedia. Thus, various types of display devices such as an organic light-emitting diode ("OLED") display device, a liquid crystal display ("LCD") device, etc., are being used.

The display device includes a display panel that displays an image. The display panel includes an organic light-emitting display panel or a liquid crystal display panel. An light-emitting display panel may include a light-emitting element. A light-emitting diode ("LED") may include an OLED using an organic material as a fluorescent material, and an inorganic light-emitting diode using an inorganic material as a fluorescent material, for example.

SUMMARY

A purpose of the invention is to provide a display device and a manufacturing method thereof in which a light-emitting element is easily formed or provided, and a short circuit is prevented.

Purposes according to the invention are not limited to the above-mentioned purpose. Other purposes and advantages according to the invention that are not mentioned may be understood based on following descriptions, and may be more clearly understood based on embodiments according to the invention. Further, it will be easily understood that the purposes and advantages according to the invention may be realized using means shown in the claims and any combinations thereof.

In an embodiment of the invention, the display device includes a substrate, a pixel electrode disposed on the substrate, a bank covering an edge of the pixel electrode and defining a light-emitting area, a first organic layer disposed on the bank and non-overlapping the light-emitting area, a plurality of light-emitting elements arranged on the pixel electrode, where each of the plurality of light-emitting elements extends perpendicular to the pixel electrode, a planarization layer disposed on the pixel electrode, the bank and the first organic layer, where the planarization layer is filled between the plurality of light-emitting elements, and a common electrode disposed on the planarization layer and the plurality of light-emitting elements, where the first organic layer is disposed between the bank and the planarization layer, and overlaps the bank.

In an embodiment, each of the first organic layer and the bank may include a polyimide-based compound, where the first organic layer and the bank include different polyimide-based compounds from each other.

In an embodiment, the first organic layer may include the polyimide-based compound including a cyano group.

In an embodiment, a transmittance at which light of a wavelength of about 308 nanometers (nm) transmits through the first organic layer may be smaller than a transmittance at which the light of the wavelength of about 308 nm transmits through the bank.

In an embodiment, the transmittance at which light of a wavelength of 308 nm may transmit through the first organic layer is about 0 percent (%), where an absorption at which the first organic layer absorbs the light of the wavelength of about 308 nm is about 100%.

In an embodiment, at least a portion of each of the plurality of light-emitting elements may protrude upwardly beyond a top face of the planarization layer.

In an embodiment, a vertical dimension of the planarization layer from a top face of the pixel electrode may be smaller than a vertical dimension of each of the plurality of light-emitting elements from the top face of the pixel electrode.

In an embodiment, each of the plurality of light-emitting elements may have one end connected to the pixel electrode and an opposite end connected to the common electrode.

In an embodiment, each of the plurality of light-emitting elements may include a first semiconductor layer, an active layer disposed on the first semiconductor layer, a second semiconductor layer disposed on the active layer, and a third semiconductor layer disposed on the second semiconductor layer In an embodiment, the first semiconductor layer may include a p-type dopant and be adjacent to the pixel electrode, where the second semiconductor layer includes an n-type dopant, and where the third semiconductor layer is adjacent to the common electrode.

In an embodiment, the device may further include a connection electrode disposed on the first semiconductor layer of each of the plurality of light-emitting elements, where the connection electrode contacts the pixel electrode.

In an embodiment, the connection electrode and the pixel electrode may include a same material as each other.

In an embodiment, the pixel electrode may include at least a reflective layer and an upper electrode layer disposed on the reflective layer, where the upper electrode layer is in contact with the connection electrode, where the connection electrode and the upper electrode layer include the same material.

In an embodiment, each of the connection electrode and the upper electrode layer may include indium-tin-oxide ("ITO").

In an embodiment, the second semiconductor layer and the third semiconductor layer of each of the plurality of light-emitting elements may protrude upwardly beyond a top face of the planarization layer.

In an embodiment, the common electrode may cover a top face of the third semiconductor layer and be in contact with side faces of each of the third semiconductor layer and the second semiconductor layer.

In an embodiment of the invention, the display device includes a substrate, a plurality of pixel electrodes disposed on the substrate, a bank covering an edge of each of the plurality of pixel electrodes and defining each of a plurality of light-emitting areas, a first organic layer disposed on the bank and non-overlapping the plurality of light-emitting areas, a plurality of light-emitting elements arranged on each of the pixel electrodes, where each of the plurality of light-emitting elements extends in a perpendicular to each pixel electrode, a planarization layer disposed on the pixel electrode, the bank and the first organic layer, where the planarization layer is interposed between the plurality of light-emitting elements, and a common electrode disposed on the planarization layer and the plurality of light-emitting elements, where the first organic layer and the bank include different materials from each other, and where the first organic layer includes a polyimide-based compound including a cyano group.

In an embodiment, the device may further include a partitioning wall which is disposed on the common electrode and in which a plurality of openings is defined, a wavelength conversion layer received in each of the plurality of openings, and a plurality of color filters, where each of the plurality of color filters is disposed on the wavelength conversion layer and the partitioning wall.

In an embodiment, the partitioning wall may overlap the bank and the first organic layer, where the plurality of openings respectively overlaps the plurality of light-emitting areas.

In an embodiment, the plurality of color filters may include a first color filter which transmits therethrough first light emitting from each of the plurality of light-emitting elements, a second color filter which transmits therethrough second light having a wavelength band different from a wavelength band of the first light, and a third color filter which transmits therethrough third light having a wavelength band different from the wavelength bands of the first light and the second light.

In an embodiment, the wavelength conversion layer may convert a portion of the first light into fourth light, and outputs fifth light as a combination of the first light and the fourth light, where the fifth light emitting from the wavelength conversion layer is converted to the first light through the first color filter, where the fifth light emitting from the wavelength conversion layer is converted to the second light through the second color filter, and where the fifth light emitting from the wavelength conversion layer is converted to the third light through the third color filter.

In an embodiment, the wavelength conversion layer may include a light-transmissive pattern that transmits the first light therethrough, a first wavelength conversion pattern that converts the first light to the second light, and a second wavelength conversion pattern that converts the first light to the third light, where the light-transmissive pattern overlaps the first color filter, the first wavelength conversion pattern overlaps the second color filter, and the second wavelength conversion pattern overlaps the third color filter.

In an embodiment of the invention, the display device may include a substrate, a pixel electrode disposed on the substrate, a first organic layer covering an edge of the pixel electrode and defining a light-emitting area, a plurality of light-emitting elements arranged on the pixel electrode, where each of the plurality of light-emitting elements extends perpendicular to the pixel electrode, a planarization layer disposed on the pixel electrode and the first organic layer, where the planarization layer is interposed between the plurality of light-emitting elements, and a common electrode disposed on the planarization layer and the plurality of light-emitting elements, where the first organic layer includes a polyimide-based compound including a cyano group.

In an embodiment, the device may further include an insulating layer disposed between the substrate and the pixel electrode, where the first organic layer includes a first area in which the first organic layer has a first thickness from a top face of the insulating layer, and a second area in which the first organic layer has a second thickness from a top face of the insulating layer, where the second thickness is smaller than the first thickness.

In an embodiment, a bottom face of the first organic layer may be in contact with the insulating layer, while a top face of the first organic layer is in contact with the planarization layer.

In an embodiment of the invention, the method for manufacturing a display device includes forming a plurality of light-emitting elements on a base substrate, forming a display substrate including a pixel electrode and a first organic layer, bonding the base substrate and the display substrate to each other such that the plurality of light-emitting elements is adhered onto the pixel electrode and the first organic layer, irradiating first laser to the base substrate such that the base substrate is removed from the plurality of light-emitting elements, irradiating second laser to the first organic layer such that the plurality of light-emitting elements adhered on the first organic layer is removed from the first organic layer, forming a planarization layer on the pixel electrode and the first organic layer, and forming a common electrode on the planarization layer.

In an embodiment, the forming the display substrate may include forming the pixel electrode on a first substrate, forming a bank on the pixel electrode, and forming the first organic layer on the bank.

In an embodiment, the first organic layer may include a polyimide-based compound including a cyano group.

In an embodiment, the first laser may include KrF excimer laser having a wavelength of about 248 nm, where the second laser includes XeCl excimer laser having a wavelength of about 308 nm.

In an embodiment, upon absorbing the second laser, the first organic layer may be ablated, such that the plurality of light-emitting elements adhered on the first organic layer is removed from the first organic layer.

In the embodiments of the display device, the inorganic light-emitting diode may be disposed on the pixel electrode, thereby eliminating disadvantages that the organic light-emitting diode is vulnerable to external moisture or oxygen, and thus improving a lifespan and reliability of the display device.

Further, in the embodiments the display device, the light-emitting element formed or provided in the non-light-emitting area may be detached such that a short circuit may be prevented which may be otherwise caused by the light-emitting element.

Further, the embodiments of the display device may include the wavelength conversion layer including the light-transmissive pattern, the first wavelength conversion pattern and the second wavelength conversion pattern, thereby improving light emission efficiency of each of blue, green and red color light beams.

Further, in the embodiments of the manufacturing method of the display device, a density of the light-emitting elements may be controlled based on a pixel size, using the transfer film. Thus, the display device having various sizes of pixels may be easily manufactured.

Effects of the invention are not limited to the above-mentioned effects, and other effects as not mentioned will be clearly understood by those skilled in the art from following descriptions.

BRIEF DESCRIPTION OF DRAWINGS

The above and other advantages and features of the invention will become more apparent by describing in detail embodiments thereof with reference to the attached drawings, in which.

DETAILED DESCRIPTIONS

Embodiments of the invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc., may be used herein to describe various elements, these elements should not be limited by these terms. These terms are only used to distinguish one element from another element. For instance, a first element discussed below could be termed a second element without departing from the teachings of the invention. Similarly, the second element could also be termed the first element.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, 20%, 10%, 5% of the stated value, for example.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Each of the features of the various embodiments of the invention may be combined or combined with each other, in part or in whole, and technically various interlocking and driving are possible. Each embodiment may be implemented independently of each other or may be implemented together in an association.

Hereinafter, predetermined embodiments will be described with reference to the accompanying drawings.

Figure 1A:
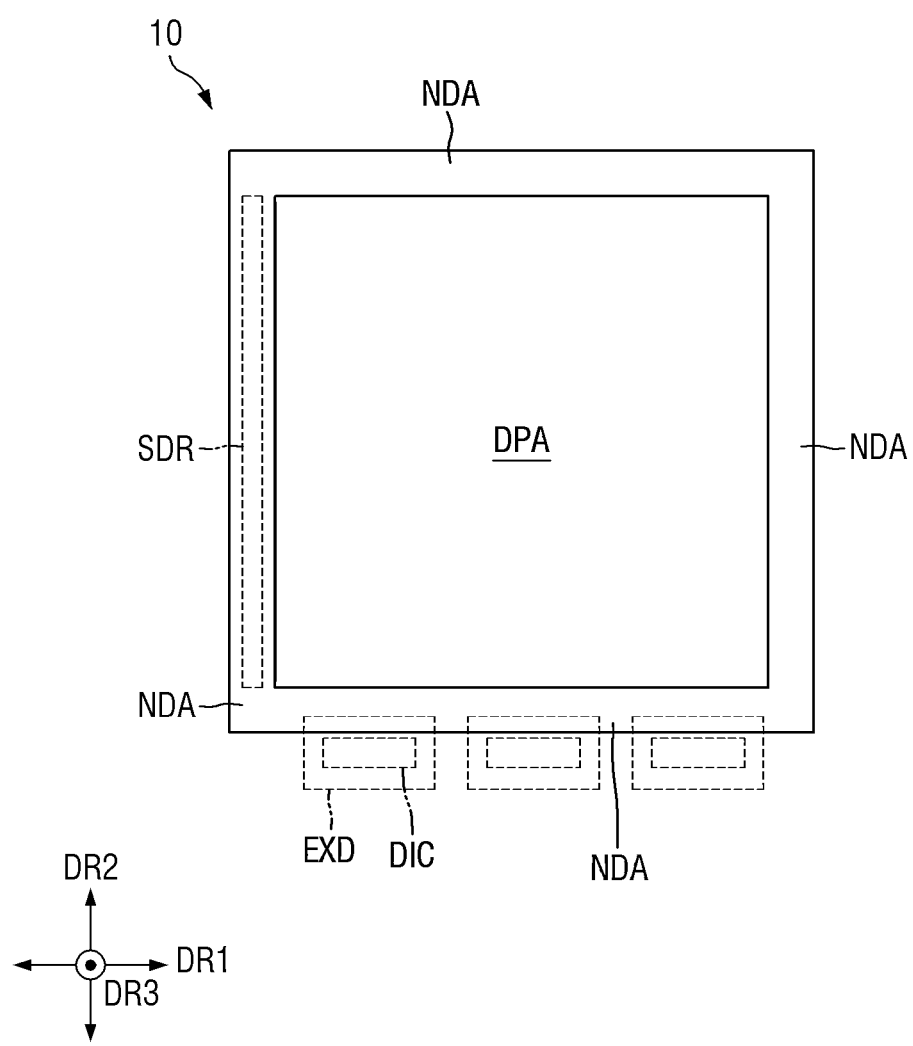
FIG. 1A is a plan view of an embodiment of a display device.
Figure 1B:
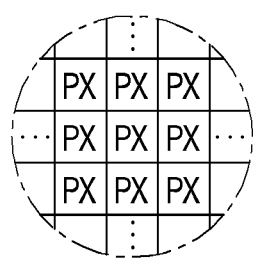
FIG. 1B is an enlarged view of a dotted portion of the display device of FIG. 1A.

FIG. 1A is a plan view of an embodiment of a display device and FIG. 1B is an enlarged view of a dotted portion of the display device of FIG. 1A.

Referring to FIGS. 1A and 1B, a display device 10 in an embodiment may be applied to a smartphone, a mobile phone, a tablet personal computer ("PC"), a personal digital assistant ("PDA"), a portable multimedia player ("PMP"), a television, a game console, a wrist watch type electronic device, a head mounted display, a personal computer monitor, a notebook computer, a vehicle navigation system, a vehicle dashboard, a digital camera, a camcorder, an outdoor billboard, an electronic billboard, a medical device, an inspection device, various home appliances such as a refrigerator and a washing machine, or an internet-of-things ("IoT") device.

In the invention, one example in which the display device is applied to the television is described. The television may have high to ultra-high resolutions such as high-definition ("HD") resolution, ultra-high-definition ("UHD") resolution, horizontal resolution of 4096 pixels ("4K"), and horizontal resolution of 7680 pixels ("8K"). However, the invention is not limited thereto.

Further, the display device 10 in an embodiment may be classified based on a display scheme. In an embodiment, the display device may include an organic light-emitting diode ("OLED") display device, an inorganic LED display device, a quantum dot light-emitting diode ("QED") display device, a micro-light-emitting diode ("micro-LED") display device, a nano-LED display device, a plasma display device ("PDP"), a field emission display ("FED") device, a cathode-ray tube ("CRT"), a liquid crystal display ("LCD") device, an electrophoretic display ("EPD") device, or the like, for example. Hereinafter, a case in which the display device is embodied as the OLED display device will be described by way of example. Unless special distinction is desired, the organic light-emitting display device applied to an embodiment will be simply abbreviated as the display device. However, the display device 10 is not limited to the organic light-emitting display device. When the same technical idea is applicable to other display devices, the invention may also be applied to the other display devices.

Further, in following drawings, the first direction DR1 indicates a longitudinal or horizontal direction of the display device 10, the second direction DR2 indicates a transverse or vertical direction of the display device 10, and the third direction DR3 indicates a thickness direction of the display device 10. In this case, "left", "right", "upper", and "lower" indicate directions of the display device 10 in a plan view. In an embodiment, "right" indicates one side in the first direction DR1, "left" indicates the opposite side in the first direction DR1, "upper" indicates one side in the second direction DR2, and "lower" indicates the opposite side in the second direction DR2. Further, "top" refers to one side in the third direction DR3, and "bottom" refers to the opposite side in the third direction DR3, for example.

The display device 10 in an embodiment may have a square shape in a plan view and, for example, may have a regular square shape. Further, when the display device 10 is applied to a television, a planar shape thereof may have another quadrangular (e.g., rectangular) shape having a long side extending in the horizontal or longitudinal direction. However, the invention is not limited thereto. The long side may extend in the vertical or transverse direction. In an alternative embodiment, the display device 10 may be rotatable so that an extension direction of the long side may change to the horizontal or vertical direction. In an alternative embodiment, the display device 10 may have a circular or elliptical planar shape.

The display device 10 may include a display area DPA and a non-display area NDA. The display area DPA may refer to an active area in which an image is displayed. The display area DPA may have a regular square shape in a plan view similar to the planar shape of the display device 10. However, the invention is not limited thereto.

The display area DPA may include a plurality of pixels PX. The plurality of pixels PX may be arranged in a matrix form. A shape of each pixel PX may be a rectangular or regular square shape in a plan view, but may not be limited thereto. A shape of each pixel PX may have a rhombus shape having each side which is inclined with respect to one side of the display device 10. The plurality of pixels PX may render various colors. In an embodiment, the plurality of pixels PX may include, but may not be limited to, a first color pixel PX for rendering a red color, a second color pixel PX for rendering a green color, and a third color pixel PX for rendering a blue color, for example. The pixels PX may be arranged in a stripe type manner or in a pentile type manner.

The non-display area NDA may be disposed around the display area DPA. The non-display area NDA may entirely or partially surround the display area DPA. The display area DPA may have a regular square shape, while the non-display area NDA may have four portions respectively adjacent to four sides of the display area DPA. The non-display area NDA may constitute a bezel of the display device 10.

A driver circuit or a driver element for driving the display area DPA may be disposed in the non-display area NDA. In an embodiment, in a portion of the non-display area NDA disposed adjacent to a first side (e.g., a lower side in FIG. 1A) of the display device 10, a pad area may be disposed on a display substrate (e.g., 100 in FIGS. 4 to 8) of the display device 10, and an external device EXD may be disposed (e.g., mounted) on a pad electrode of the pad area. Examples of the external device EXD may include a connection film, a printed circuit board, a driver chip DIC, a connector, and a line connection film. In a portion of the non-display area NDA disposed adjacent to a second side (e.g., a left side in FIG. 1A) of the display device 10, a scan driver SDR, etc., formed or disposed directly on the display substrate of the display device 10 may be disposed.

Figure 2:
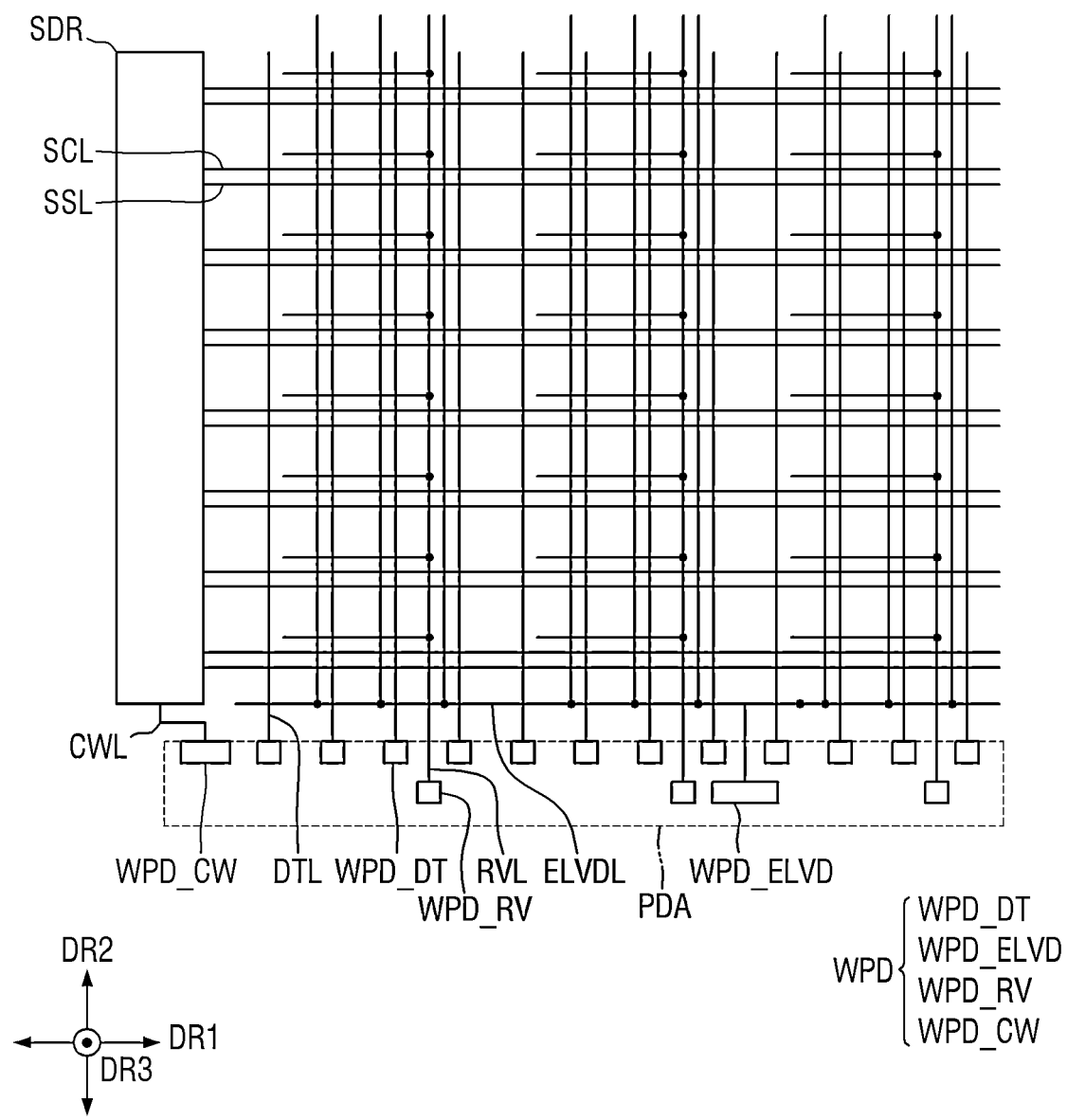
FIG. 2 is a schematic layout diagram of an embodiment of a circuit of a display substrate of a display device.

FIG. 2 is a schematic layout diagram of an embodiment of a circuit of a display substrate of a display device.

Referring to FIG. 2, a plurality of lines is disposed on the first substrate (e.g., 110 in FIGS. 4 to 8). The plurality of lines may include a scan line SCL, a sensing signal line SSL, a data line DTL, a reference voltage line RVL, a first power line ELVDL, or the like.

Each of the scan line SCL and the sensing signal line SSL may extend in the first direction DR1. Each of the scan line SCL and the sensing signal line SSL may be connected to the scan driver SDR. The scan driver SDR may include a driver circuit. The scan driver SDR may be disposed in one side portion of the non-display area NDA and on the display substrate (e.g., 100 in FIGS. 4 to 8). However, the invention is not limited thereto. The scan driver SDR may be disposed on each of both opposing side portions of the non-display area NDA. The scan driver SDR may be connected to a signal connection line CWL. At least one end of the signal connection line CWL may be connected to a pad WPD_CW on a first non-display area NDA and/or a second non-display area NDA. The pad WPD_CW may be connected to the external device (EXD in FIG. 1A).

Each of the data line DTL and the reference voltage line RVL may extend in the second direction DR2 intersecting the first direction DR1. The first power line ELVDL may include a portion extending in the second direction DR2. The first power line ELVDL may further include a portion extending in the first direction DR1. Thus, the first power line ELVDL may have a mesh structure. However, the invention is not limited thereto.

A line pad WPD may be disposed at and connected to at least one end of each of the data line DTL, the reference voltage line RVL, and the first power line ELVDL. The line pads WPD may be disposed in a pad area PDA of the non-display area NDA. In an embodiment, a line pad WPD_DT (hereinafter, also referred to as 'data pad') connected to the data line DTL, a line pad WPD_RV (hereinafter, also referred to as 'reference voltage pad') connected to the reference voltage line RVL, and a line pad WPD_ELVD (hereinafter, also referred to as 'first power pad') connected to the first power line ELVDL may be disposed in the pad area PDA of the non-display area NDA. In another embodiment, the data pad WPD_DT, the reference voltage pad WPD_RV, and the first power pad WPD_ELVD may be further disposed in another non-display area NDA. As described above, the external device (EXD in FIG. 1A) may be disposed (e.g., mounted) on the line pad WPD. The external device EXD may be disposed (e.g., mounted) on the line pad WPD via an anisotropic conductive film or an ultrasonic bonding.

Each pixel PX on the display substrate includes a pixel driver circuit. The above-described lines may pass through or around each pixel PX and may apply a driving signal to each pixel driver circuit. The pixel driver circuit may include a transistor and a capacitor. Each of the number of transistors and the number of capacitors in each pixel driver circuit may be variously modified. Hereinafter, a 3T1C structure in which each pixel driver circuit includes three transistors and one capacitor will be described by way of example. However, the invention is not limited thereto. Various modified pixel PX structures such as a 2T1C structure, a 7T1C structure, and a 6T1C structure may be applied to the invention.

Figure 3:
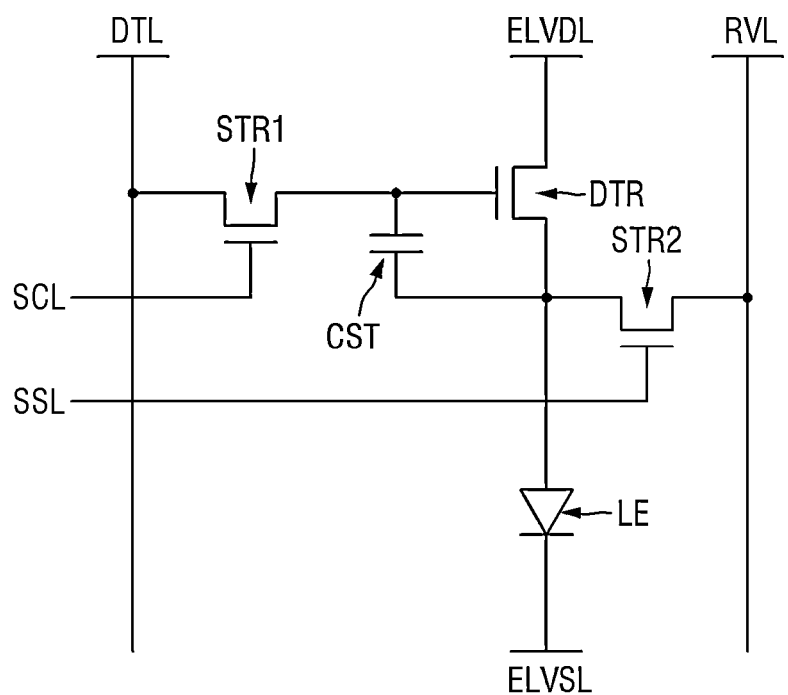
FIG. 3 is an equivalent circuit diagram of an embodiment of one pixel of a display device.

FIG. 3 is an equivalent circuit diagram of an embodiment of one pixel of a display device.

Referring to FIG. 3, each pixel PX of the display device in an embodiment includes not only a light-emitting element LE, but also three transistors DTR, STR1, and STR2, and one capacitor CST as a storage capacitor.

The light-emitting element LE emits light based on current supplied through a driving transistor DTR. The light-emitting element LE may be implemented as an inorganic LED, an OLED, a micro-LED, a nano-LED, or the like.

A first electrode, e.g., an anode of the light-emitting element LE may be connected to a source electrode of the driving transistor DTR, while a second electrode, e.g., a cathode thereof may be connected to a second power line ELVSL to which a low-potential voltage (second power voltage) lower than a high-potential voltage (first power voltage) of the first power line ELVDL is supplied.

The driving transistor DTR adjusts current flowing from the first power line ELVDL to which the first power voltage is supplied to the light-emitting element LE, based on a voltage difference between a voltage of the gate electrode and a voltage of the source electrode thereof. The gate electrode of the driving transistor DTR may be connected to a first source/drain electrode of a first switching transistor STR1, the source electrode thereof may be connected to the first electrode of the light-emitting element LE, and a drain electrode thereof may be connected to the first power line ELVDL to which the first power voltage is applied.

The first switching transistor STR1 is turned on based on a scan signal of the scan line SCL to connect the data line DTL to the gate electrode of the driving transistor DTR. A gate electrode of the first switching transistor STR1 may be connected to the scan line SCL, a first source/drain electrode thereof may be connected to the gate electrode of the driving transistor DTR1, and a second source/drain electrode thereof may be connected to the data line DTL.

The second switching transistor STR2 is turned on based on a sensing signal of the sensing signal line SSL to connect the reference voltage line RVL to the source electrode of the driving transistor DTR. A gate electrode of the second switching transistor STR2 may be connected to the sensing signal line SSL, a first source/drain electrode thereof may be connected to the reference voltage line RVL, and a second source/drain electrode thereof may be connected to the source electrode of the driving transistor DTR.

In an embodiment, the first source/drain electrode of each of the first and second switching transistors STR1 and STR2 may act as a source electrode, while the second source/drain electrode thereof may act as a drain electrode. However, the invention is not limited thereto. The first source/drain electrode of each of the first and second switching transistors STR1 and STR2 may act as a drain electrode, while the second source/drain electrode thereof may act as a source electrode.

The capacitor CST is disposed between the gate electrode and the source electrode of the driving transistor DTR. The capacitor (e.g., storage capacitor) CST stores therein the difference voltage between the gate voltage and the source voltage of the driving transistor DTR.

Each of the driving transistor DTR and the first and second switching transistors STR1 and STR2 may be embodied as a thin-film transistor ("TFT"). Further, in FIG. 3, an embodiment in which each of the driving transistor DTR and the first and second switching transistors STR1 and STR2 is embodied as an N-type metal oxide semiconductor field effect transistor ("MOSFET") is described. However, the invention is not limited thereto. That is, each of the driving transistor DTR and the first and second switching transistors STR1 and STR2 may be embodied as a P-type MOSFET. In an alternative embodiment, some of the driving transistor DTR and the first and second switching transistors STR1 and STR2 may be embodied as an N-type MOSFET, while the other thereof may be embodied as a P-type MOSFET.

Figure 4:
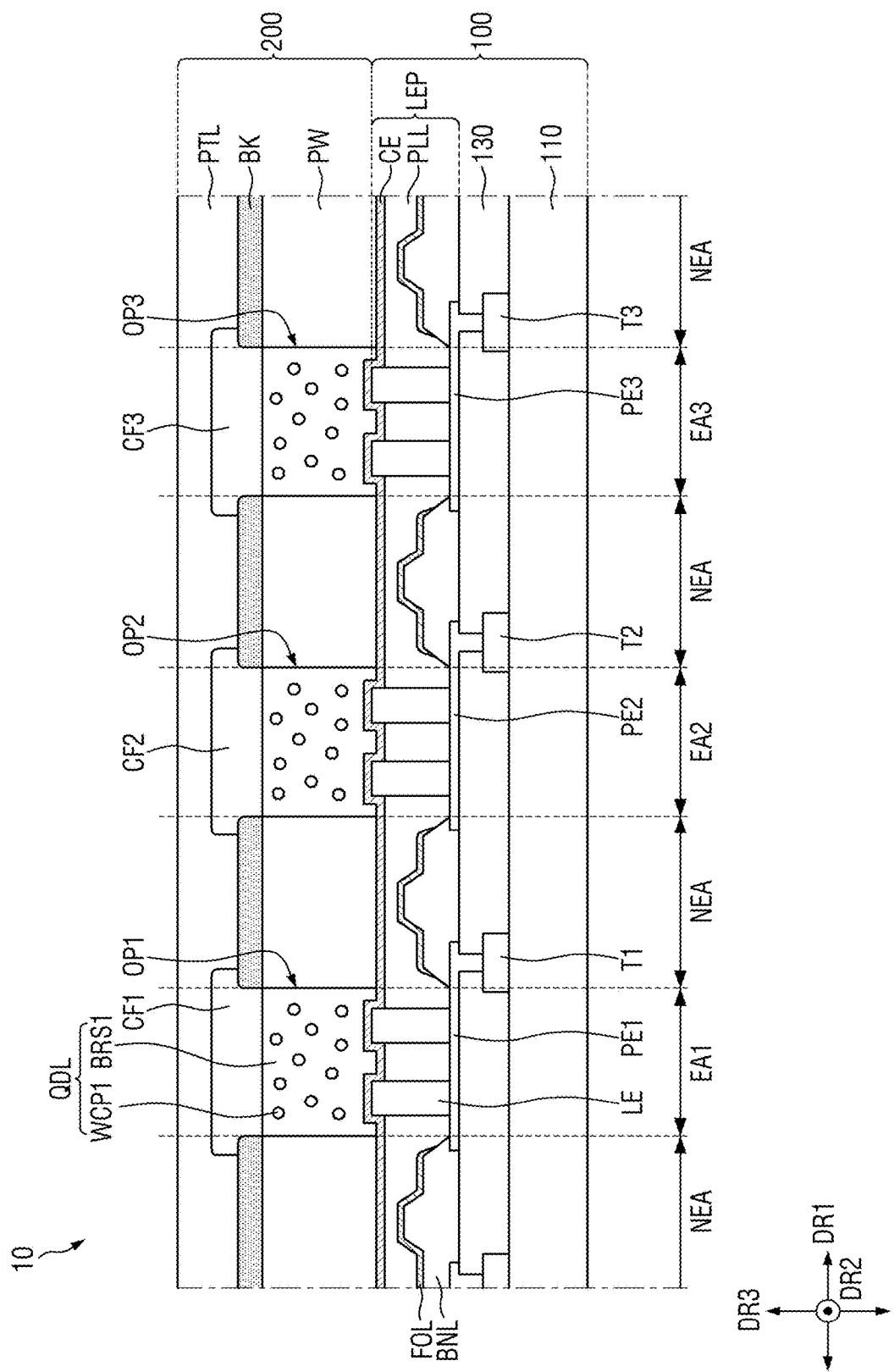
FIG. 4 is a cross-sectional view schematically showing an embodiment of a display device.
Figure 5:
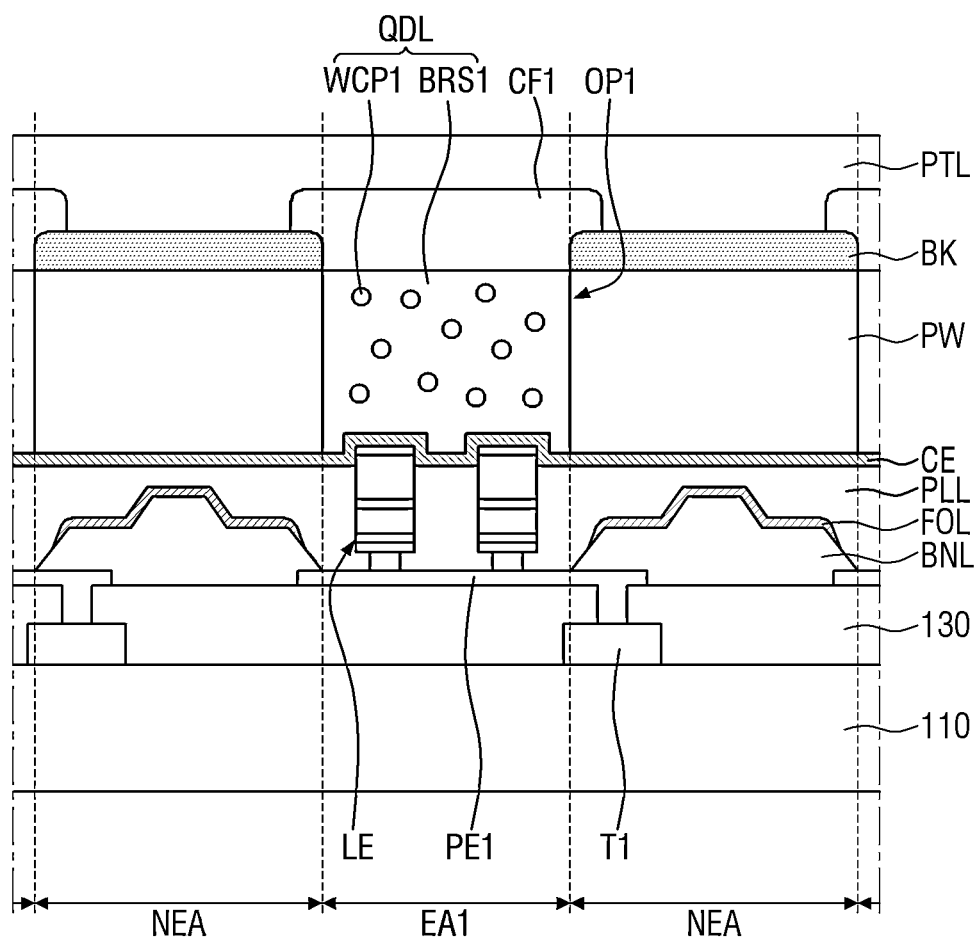
FIG. 5 is an enlarged view schematically showing an embodiment of a first light-emitting area.
Figure 6:
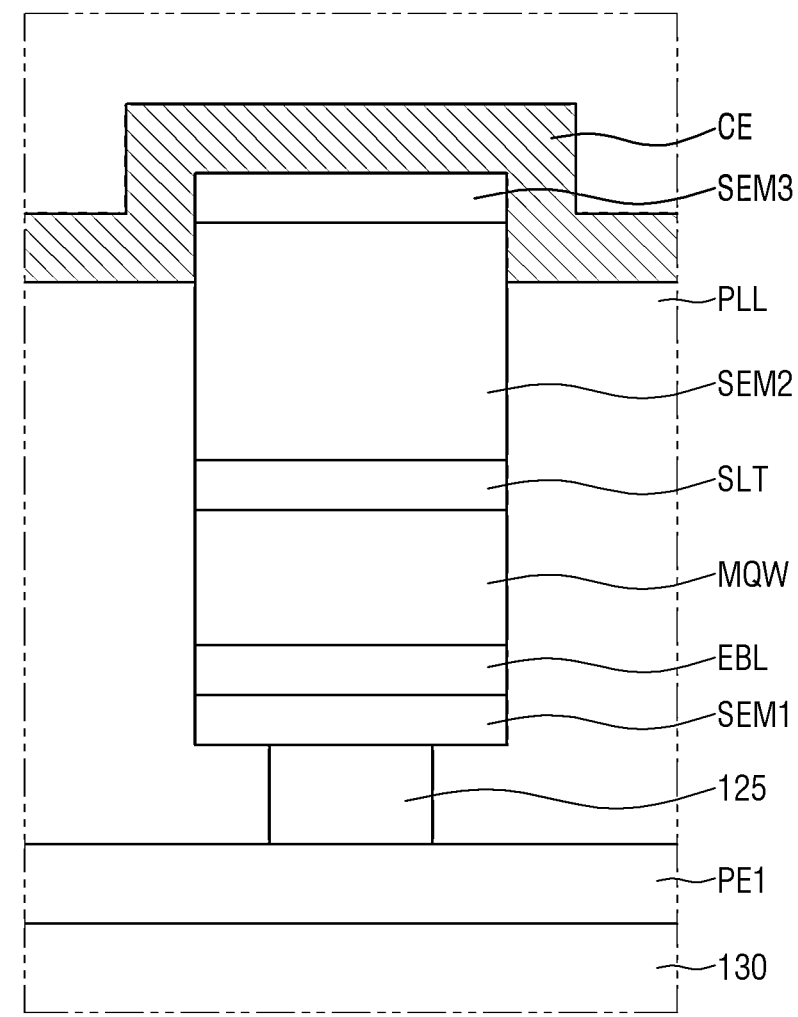
FIG. 6 is a cross-sectional view showing an embodiment of a light-emitting element.
Figure 7:
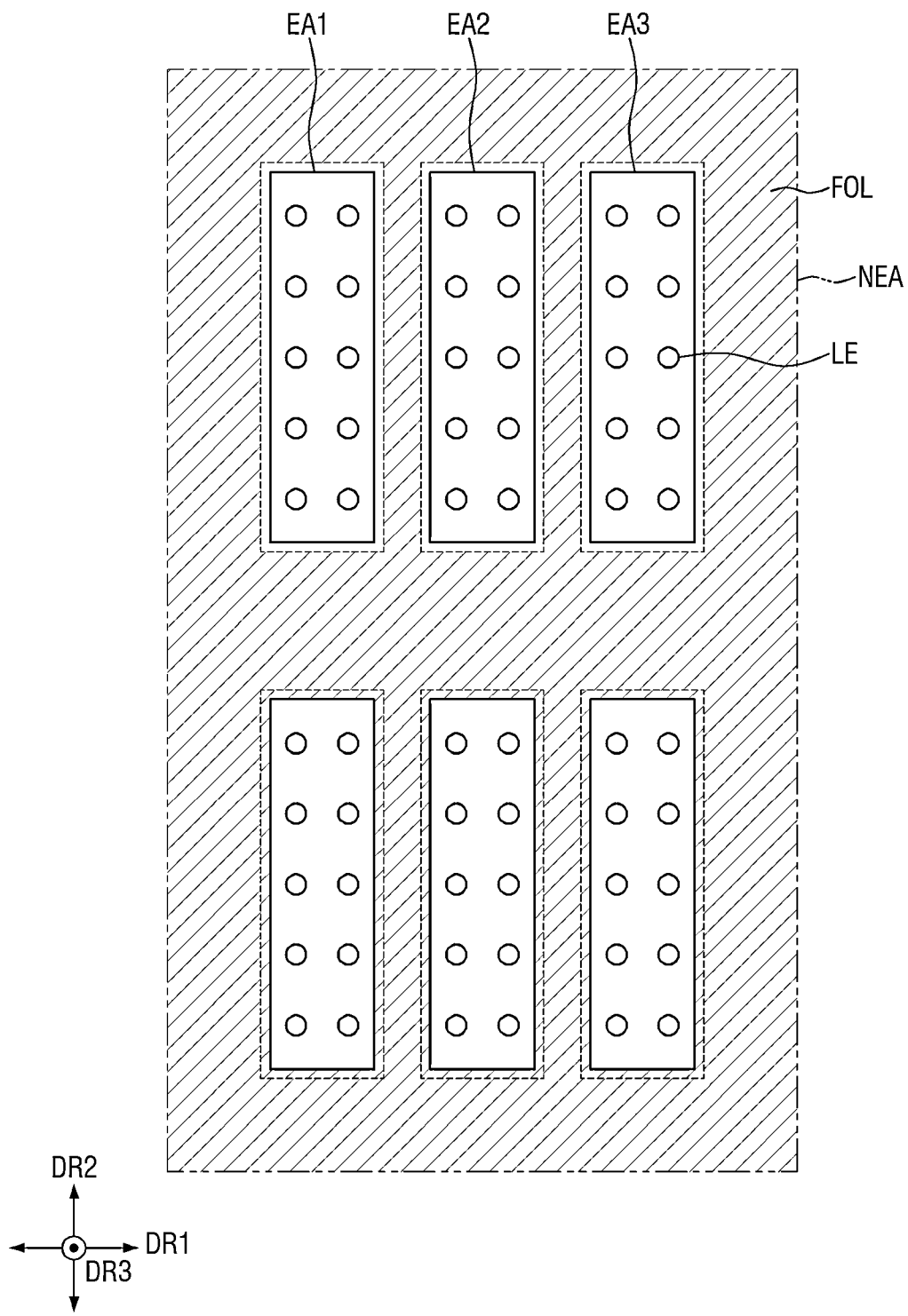
FIG. 7 is a plan view schematically showing an embodiment of a plurality of light-emitting areas.
Figure 8:
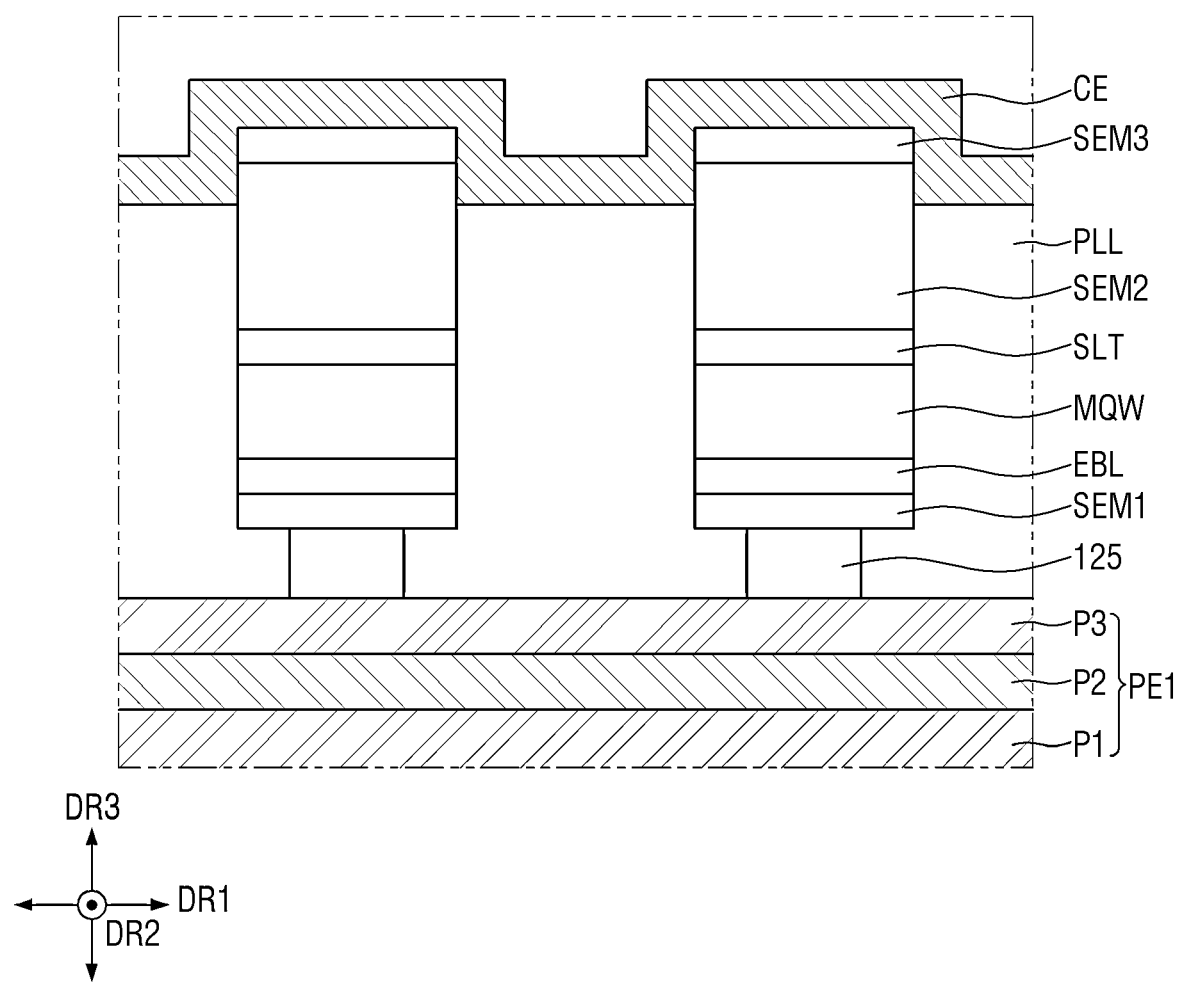
FIG. 8 is a cross-sectional view schematically showing a plurality of light-emitting elements.
Figure 9:
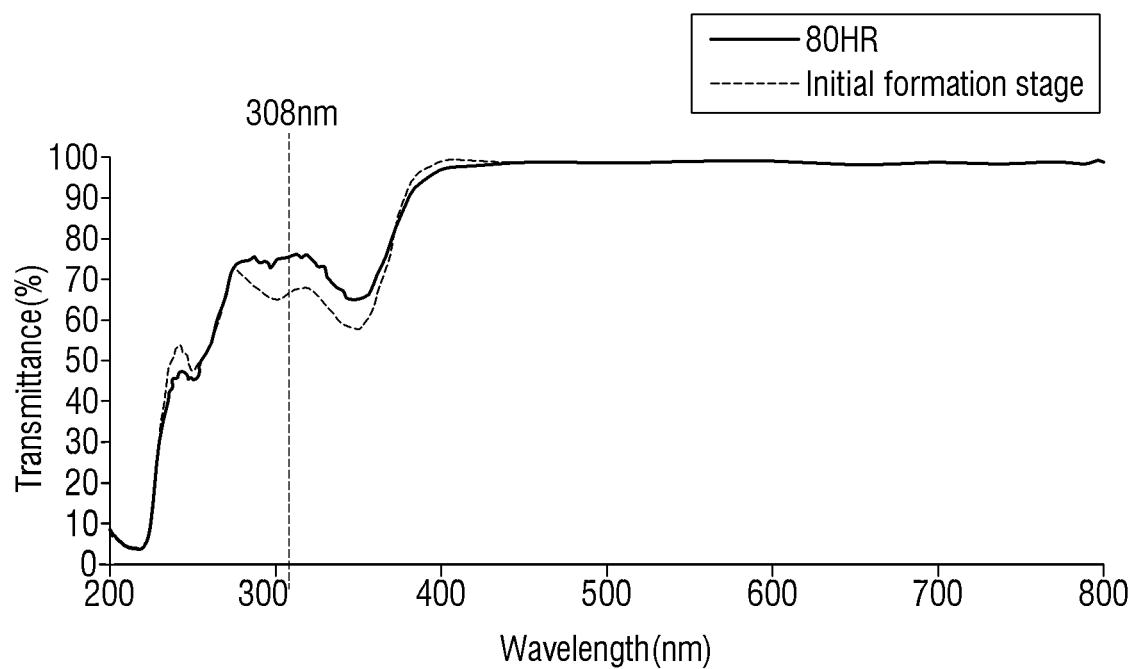
FIG. 9 is a graph showing light transmittance of polyimide free of a cyano group, based on a wavelength of the light.
Figure 10:
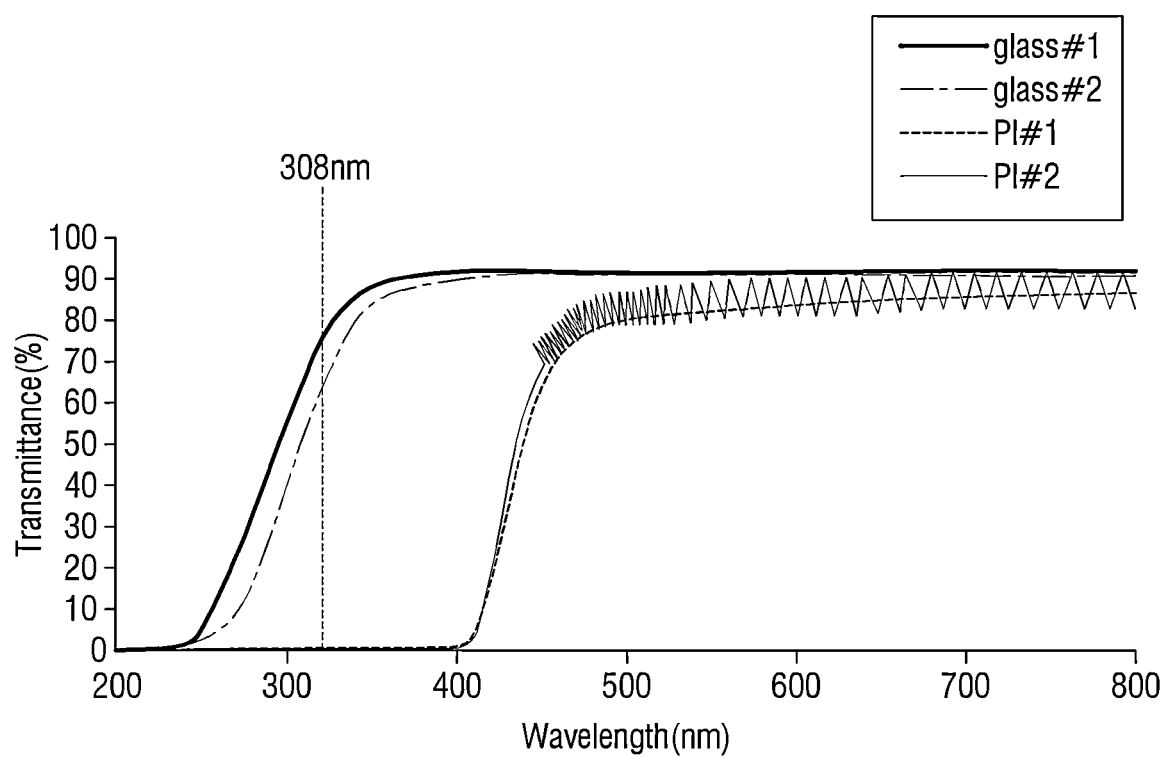
FIG. 10 is a graph showing light transmittance of each of a glass substrate and a first organic layer coated on the glass substrate, based on a wavelength of the light.
Figure 11:
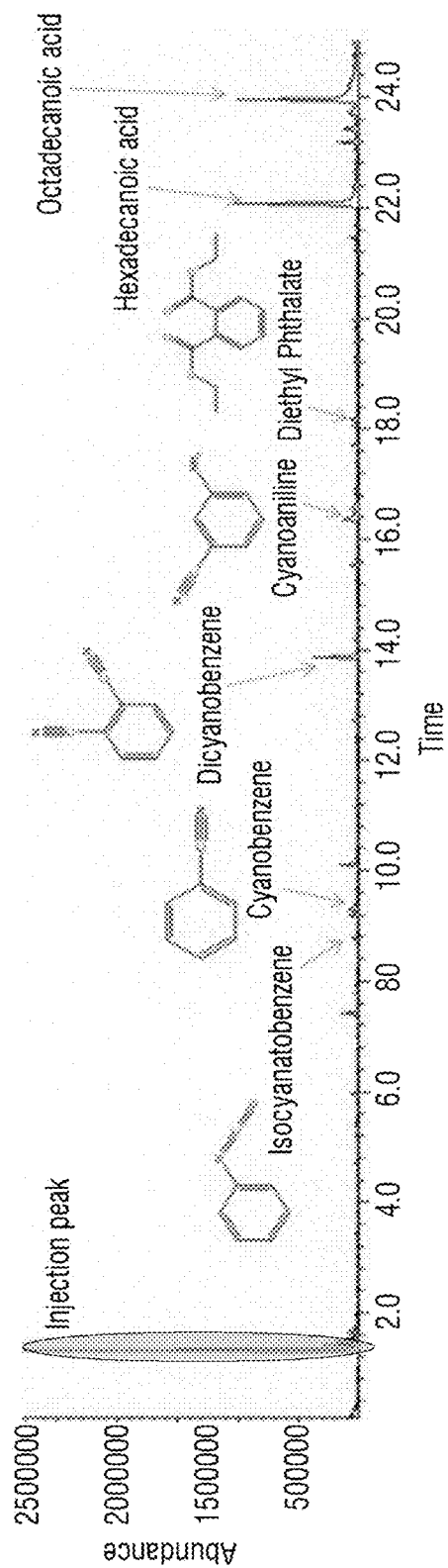
FIG. 11 is a graph showing energy dispersive X-ray spectroscopy analysis of the first organic layer after laser-irradiation thereto.
Figure 12:
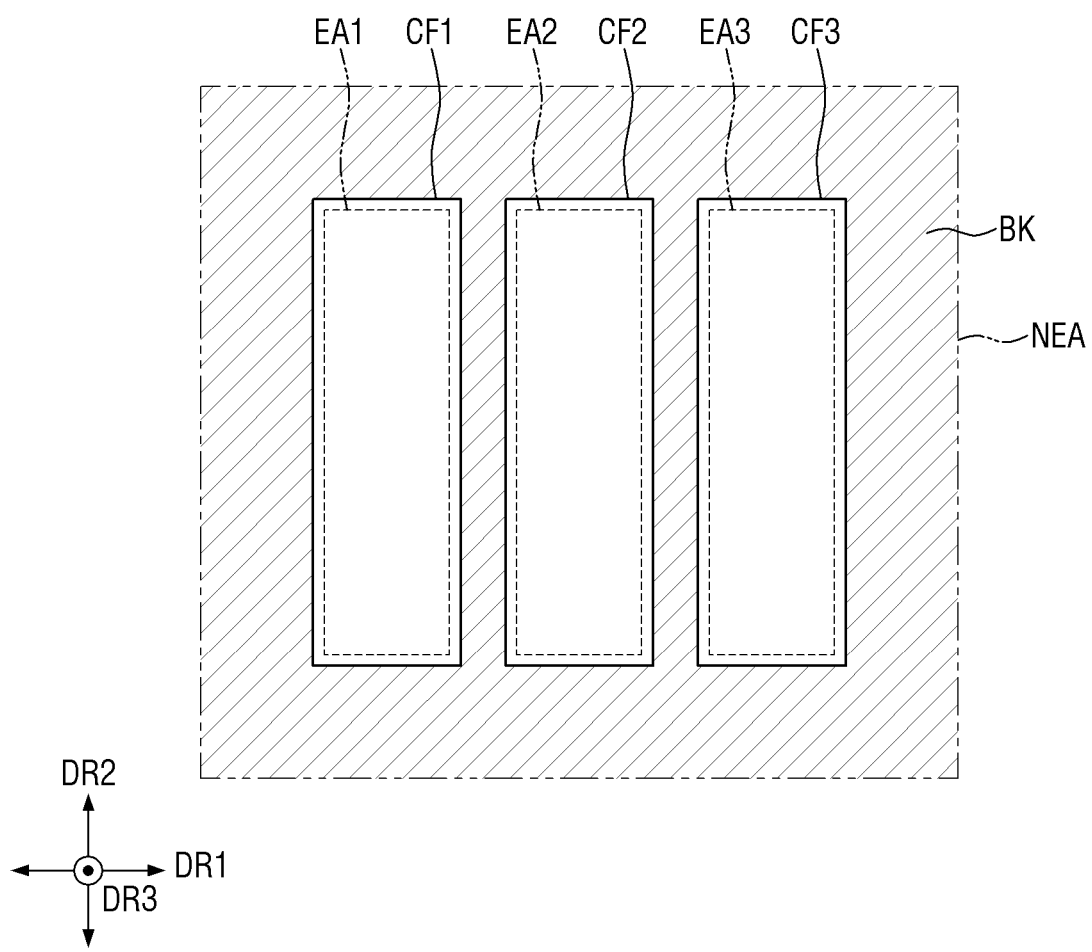
FIG. 12 is a schematic plan view of a plurality of light-emitting areas and a plurality of color filters.

FIG. 4 is a cross-sectional view schematically showing an embodiment of a display device. FIG. 5 is an enlarged view schematically showing a first light-emitting area. FIG. 6 is a cross-sectional view showing an embodiment of a light-emitting element. FIG. 7 is a plan view schematically showing an embodiment of a plurality of light-emitting areas. FIG. 8 is a cross-sectional view schematically showing an embodiment of a plurality of light-emitting elements. FIG. 9 is a graph showing light transmittance of polyimide free of a cyano group, based on a wavelength of the light. FIG. 10 is a graph showing light transmittance of each of a glass substrate and a first organic layer coated on the glass substrate, based on a wavelength of the light. FIG. 11 is a graph showing energy dispersive X-ray spectroscopy analysis of the first organic layer after laser-irradiation thereto. FIG. 12 is a schematic plan view of a plurality of light-emitting areas and a plurality of color filters.

Referring to FIG. 4 to FIG. 8, the display device 10 may include a display substrate 100 and a wavelength converter 200 disposed on the display substrate 100.

The display substrate 100 may include a first substrate 110 and a light-emitter LEP disposed on the first substrate 110. The first substrate 110 may act as an insulating substrate. The first substrate 110 may include a transparent material. In an embodiment, the first substrate 110 may include a transparent insulating material such as glass, quartz, or the like, for example. The first substrate 110 may be embodied as a rigid substrate. However, the first substrate 110 may not be limited thereto, and may include plastic such as polyimide or the like, or may be flexible, for example, may be bendable, foldable, or rollable. A plurality of light-emitting areas EA1, EA2, and EA3 and a plurality of non-light-emitting areas NEA may be defined on the first substrate 110.

Switching elements T1, T2, and T3 may be disposed on the first substrate 110. In an embodiment, a first switching element T1 may be disposed in a first light-emitting area EA1 of the first substrate 110, a second switching element T2 may be disposed in a second light-emitting area EA2 thereof, and a third switching element T3 may be disposed in a third light-emitting area EA3 thereof. However, the invention is not limited thereto. In another embodiment, at least one of the first switching element T1, the second switching element T2, or the third switching element T3 may be disposed in the non-light-emitting area NEA.

In an embodiment, each of the first switching element T1, the second switching element T2, and the third switching element T3 may be embodied as a TFT including an amorphous silicon, a polysilicon, or an oxide semiconductor. Although not shown in the drawings, a plurality of signal lines (e.g., a gate line, a data line, and a power line) for transmitting a signal to each of the switching elements may be further disposed on the first substrate 110.

The insulating layer 130 may be disposed on the first switching element T1, the second switching element T2, and the third switching element T3. In an embodiment, the insulating layer 130 may act as a planarization layer, and may include an organic material. In an embodiment, the insulating layer 130 may include an acrylic-based resin, an epoxy-based resin, an imide-based resin, an ester-based resin, or the like, for example. In an embodiment, the insulating layer 130 may include a positive photosensitive material or a negative photosensitive material.

The light-emitter LEP may be disposed on the insulating layer 130. The light-emitter LEP may include a plurality of pixel electrodes PE1, PE2, and PE3, a plurality of light-emitting elements LE, and a common electrode CE.

The plurality of pixel electrodes PE1, PE2, and PE3 may include a first pixel electrode PE1, a second pixel electrode PE2, and a third pixel electrode PE3. Each of the first pixel electrode PE1, the second pixel electrode PE2 and the third pixel electrode PE3 may serve as the first electrode of the light-emitting element LE, and may act as an anode or a cathode. The first pixel electrode PE1 may be disposed in the first light-emitting area EA1, while at least a portion thereof may extend into the non-light-emitting area NEA. The second pixel electrode PE2 may be disposed in the second light-emitting area EA2, while at least a portion thereof may extend into the non-light-emitting area NEA. The third pixel electrode PE3 may be disposed in the third light-emitting area EA3, while at least a portion thereof may extend into the non-light-emitting area NEA. The first pixel electrode PE1 may extend through the insulating layer 130 and may be connected to the first switching element T1. The second pixel electrode PE2 may extend through the insulating layer 130 and may be connected to the second switching element T2. The third pixel electrode PE3 may extend through the insulating layer 130 and may be connected to the third switching element T3.

Each of the first pixel electrode PE1, the second pixel electrode PE2, and the third pixel electrode PE3 may be act as a reflective electrode. Each of the first pixel electrode PE1, the second pixel electrode PE2, and the third pixel electrode PE3 may have a stack structure in which a layer including a material having a higher work function such as titanium oxide ($TiO_2$), indium-tin-oxide ("ITO"), indium-zinc-oxide ("IZO"), zinc oxide (ZnO), indium-tin-zinc-oxide ("ITZO") or magnesium oxide (MgO), and a reflective material layer including silver (Ag), magnesium (Mg), aluminum (Al), platinum (Pt), lead (Pb), palladium (Pd), gold (Au), nickel (Ni), neodymium (Nd), iridium (Ir), chromium (Cr), lithium (Li), calcium (Ca) or any combinations thereof are stacked one on top of the other. In this connection, the layer including the material having the higher work function may be disposed on a top face of the reflective material layer and may be closer to the light-emitting element LE. Each of the first pixel electrode PE1, the second pixel electrode PE2, and the third pixel electrode PE3 may have a multilayer structure of ITO/Mg, ITO/MgF, ITO/Ag, and ITO/Ag/ITO, but may not be limited thereto.

A bank BNL may be disposed on the first pixel electrode PE1, the second pixel electrode PE2, and the third pixel electrode PE3. An opening that partially exposes the first pixel electrode PE1, an opening that partially exposes the second pixel electrode PE2, and an opening that partially exposes the third pixel electrode PE3 may be defined in the bank BNL such that the first light-emitting area EA1, the second light-emitting area EA2, the third light-emitting area EA3, and the non-light-emitting area NEA may be distinguished from each other. That is, an exposed partial area of the first pixel electrode PE1 not covered with the bank BNL may act as the first light-emitting area EA1, an exposed partial area of the second pixel electrode PE2 not covered with the bank BNL and exposed may act as the second light-emitting area EA2, and an exposed partial area of the third pixel electrode PE3 not covered with the bank BNL may act as the third light-emitting area EA3. In addition, an area in which the bank BNL is disposed may act as a non-light-emitting area NEA.

The bank BNL may include an organic insulating material, for example, a polyacrylates resin, an epoxy resin, a phenolic resin, a polyamides resin, a polyimides rein, an unsaturated polyesters resin, a poly-phenyleneethers resin, a polyphenylenesulfides resin or benzocyclobutene ("BCB"), etc.

In an embodiment, the bank BNL may overlap with the color filters CF1, CF2, and CF3 and a light-blocking member BK of the wavelength converter 200 to be described later. In an embodiment, the bank BNL may overlap with an entirety of the light-blocking member BK. Further, the bank BNL may overlap with the first color filter CF1, the second color filter CF2, and the third color filter CF3.

A plurality of light-emitting elements LE may be disposed on each of the first pixel electrode PE1, the second pixel electrode PE2, and the third pixel electrode PE3.

As shown in FIG. 5 and FIG. 6, the light-emitting elements LE may be disposed in each of the first light-emitting area EA1, the second light-emitting area EA2, and the third light-emitting area EA3. The light-emitting element LE may be embodied as a vertical LED element that extends in the third direction DR3 in an elongate manner. That is, a length in the third direction DR3 of the light-emitting element LE may be larger than a length in the horizontal direction thereof. The length in the horizontal direction indicates a length in the first direction DR1 or the length of the second direction DR2. In an embodiment, the length in the third direction DR3 of the light-emitting element LE may be in a range of approximately 1 micrometer (μm) to approximately 5um, for example.

The light-emitting element LE may be embodied as a micro-LED. The light-emitting element LE may include an connection electrode 125, a first semiconductor layer SEM1, an electron blocking layer EBL, an active layer MQW, a superlattice layer SLT, a second semiconductor layer SEM2, and a third semiconductor layer SEM3 which are arranged in the thickness direction of the display substrate 100, that is, in the third direction DR3. The connection electrode 125, the first semiconductor layer SEM1, the electron blocking layer EBL, the active layer MQW, the superlattice layer SLT, the second semiconductor layer SEM2, and the third semiconductor layer SEM3 may be sequentially stacked in the third direction DR3.

The light-emitting element LE may have a cylindrical shape, a disk-shape, or a rod-shape in which a width is larger than a height. However, the invention is not limited thereto. In an embodiment, the light-emitting element LE may have various shape including a shape of a rod, a wire, a tube, etc., a shape of a cube, a cuboid, or a polygonal prism such as a hexagonal prism, or a shape extending in one direction but having a partially inclined outer face.

The connection electrode 125 may be disposed on each of the plurality of pixel electrodes PE1, PE2, and PE3. Hereinafter, the light-emitting element LE disposed on the first pixel electrode PE1 will be described by way of example.

The connection electrode 125 may bond to the first pixel electrode PE1 and may apply a light-emission signal to the light-emitting element LE. The connection electrode 125 may be embodied as an ohmic connection electrode. However, the invention may not be limited thereto, and may be embodied as a Schottky connection electrode. The light-emitting element LE may include at least one connection electrode 125. FIG. 5 and FIG. 6 show that the light-emitting element LE includes one connection electrode 125. However, the invention is not limited thereto. In some cases, the light-emitting element LE may include a larger number of connection electrodes 125, or the connection electrode 125 may be omitted. Descriptions of the light-emitting element LE which will be made later may be equally applied to a case where the number of connection electrodes 125 varies or a case where the light-emitting element LE further includes another component.

In the display device 10 in an embodiment, when the light-emitting element LE is electrically connected to the first pixel electrode PE1, the connection electrode 125 may reduce resistance between the light-emitting element LE and the first pixel electrode PE1 and improve adhesion therebetween. The connection electrode 125 may include a conductive metal oxide. In an embodiment, the connection electrode 125 may include ITO. Since the connection electrode 125 is in direct contact with the underlying first pixel electrode PE1, the connection electrode 125 may include the same material as that of the first pixel electrode PE1, for example. Accordingly, adhesiveness between the connection electrode 125 and the first pixel electrode PE1 may be improved, so that the contact characteristics therebetween may be increased.

As shown in FIG. 8, in an embodiment, the first pixel electrode PE1 may include a lower electrode layer P1, a reflective layer P2 and an upper electrode layer P3. The lower electrode layer P1 may be a bottom portion of the first pixel electrode PE1 and may be electrically connected to the switching element. The lower electrode layer P1 may include a metal oxide, for example, titanium oxide ($TiO_2$), ITO, IZO, zinc oxide (ZnO), ITZO or magnesium oxide (MgO).

The reflective layer P2 may be disposed on the lower electrode layer P1 to upwardly reflect light emitting from the light-emitting element LE. The reflective layer P2 may include a metal having high reflectivity, for example, silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca), or any combinations thereof.

The upper electrode layer P3 may be disposed on the reflective layer P2 and directly contact the light-emitting element LE. The upper electrode layer P3 may be disposed between the reflective layer P2 and the connection electrode 125 of the light-emitting element LE, and may be in direct contact with the connection electrode 125. As described above, the connection electrode 125 may include a metal oxide. Thus, the upper electrode layer P3 may also include the same metal oxide as that of the connection electrode 125. The upper electrode layer P3 may include, for example, titanium oxide ($TiO_2$), ITO, IZO, zinc oxide (ZnO), ITZO or magnesium oxide (MgO). In an embodiment, when the connection electrode 125 includes ITO, the first pixel electrode PE1 may have a multilayer structure of ITO/Ag/ITO.

Referring to FIG. 6, the first semiconductor layer SEM1 may be disposed on the connection electrode 125. The first semiconductor layer SEM1 may include a p-type semiconductor, and may include a semiconductor material of a chemical formula $Al_xGa_yIn_{1-x-y}N$ ($0 \le x \le 1$, $0 \le y \le 1$, $0 \le x+y \le 1$). In an embodiment, the first semiconductor layer SEM1 may include at least one of AlGaInN, GaN, AlGaN, InGaN, AN, or InN doped with p-type dopants, for example. The first semiconductor layer SEM1 may be doped with a p-type dopant. The p-type dopant may be Mg, Zn, Ca, Se, Ba, or the like. In an embodiment, the first semiconductor layer SEM1 may include p-GaN doped with p-type Mg. A thickness of the first semiconductor layer SEM1 may in a range of approximately 30 nanometers (nm) to approximately 200 nm, for example, but may not be limited thereto.

The electron blocking layer EBL may be disposed on the first semiconductor layer SEM1. The electron blocking layer EBL may function to inhibit or prevent excessive electrons from flowing into the active layer MQW. In an embodiment, the electron blocking layer EBL may include p-AlGaN doped with p-type Mg. A thickness of the electron blocking layer EBL may be in a range of approximately 10 nm to approximately 50 nm, for example, but may not be limited thereto. In another embodiment, the electron blocking layer EBL may be omitted.

The active layer MQW may be disposed on the electron blocking layer EBL. The active layer MQW may emit light via combinations between electrons and holes using an electric signal applied through the first semiconductor layer SEM1 and the second semiconductor layer SEM2. The active layer MQW may emit first light having a central wavelength band in a range of approximately 450 nm to approximately 495 nm, that is, light having a blue wavelength band.

The active layer MQW may include a material having a single or multi quantum well structure. When the active layer MQW includes a material having a multi-quantum well structure, a plurality of well layers and a plurality of barrier layers may be alternately stacked one on top of another. In this connection, the well layer may include InGaN, and the barrier layer may include GaN or AlGaN. However, the invention is not limited thereto. A thickness of the well layer along the third direction DR3 may be approximately in a range of approximately 1 nm to approximately 4 nm, and a thickness of the barrier layer may be in a range of approximately 3 nm to approximately 10 nm.

In an alternative embodiment, the active layer MQW may have a structure in which a semiconductor material having a large bandgap energy and a semiconductor material having a small bandgap energy are alternately stacked one on top of another. The active layer MQW may include groups III to V semiconductor materials depending on a wavelength band of light emitting therefrom. The light emitting from the active layer MQW is not limited to the first light (e.g., having blue wavelength band). In some cases, the light emitting from the active layer MQ may be second light (e.g., having a green wavelength band) or third light (e.g., having a red wavelength band).

The superlattice layer SLT may be disposed on the active layer MQW. The superlattice layer SLT may function to relieve stress between the second semiconductor layer SEM2 and the active layer MQW. In an embodiment, the superlattice layer SLT may include InGaN or GaN. A thickness of the superlattice layer SLT may be in a range of approximately 50 nm to approximately 200 nm, for example. In another embodiment, the superlattice layer SLT may be omitted.

The second semiconductor layer SEM2 may be disposed on the superlattice layer SLT. The second semiconductor layer SEM2 may be embodied as an n-type semiconductor. The second semiconductor layer SEM2 may include a semiconductor material having a chemical formula $Al_xGa_yIn_{1-x-y}N$ ($0 \leq x \leq 1, 0 \leq y \leq 1, 0 \leq x+y \leq 1$). In an embodiment, the second semiconductor layer SEM2 may include at least one of AlGaInN, GaN, AlGaN, InGaN, AlN, or InN doped with n-type dopants, for example. The second semiconductor layer SEM2 may be doped with an n-type dopant. The n-type dopant may be Si, Ge, Sn, or the like. In an embodiment, the second semiconductor layer SEM2 may include n-GaN doped with n-type Si. A thickness of the second semiconductor layer SEM2 may in a range of 2 micrometers (µm) to 4 µm, for example, but may not be limited thereto.

The third semiconductor layer SEM3 may be disposed on the second semiconductor layer SEM2. The third semiconductor layer SEM3 may be disposed between the second semiconductor layer SEM2 and a common electrode CE. The third semiconductor layer SEM3 may include an undoped semiconductor. The third semiconductor layer SEM3 may include a material which is the same as that of the second semiconductor layer SEM2 but is undoped with an n-type or p-type dopant. In an embodiment, the third semiconductor layer SEM3 may include at least one of InAlGaN, GaN, AlGaN, InGaN, AlN or InN as undoped. However, the invention is not limited thereto.

A planarization layer PLL may be disposed on the bank BNL and the plurality of pixel electrodes PE1, PE2, and PE3. The planarization layer PLL may planarize underlying steps formed or provided on top faces of the bank BNL and the plurality of pixel electrodes PE1, PE2, and PE3 so that the common electrode CE which will be described later may be formed or disposed on a planarize top face of the planarization layer PLL. The planarization layer PLL may have a predetermined vertical dimension such that at least a portion, for example, a top portion of each of the plurality of light-emitting elements LE may protrude upwardly beyond a top face of the planarization layer PLL. That is, the vertical dimension of the planarization layer PLL from the top face of the first pixel electrode PE1 may be smaller than a vertical dimension of the light-emitting element LE from the top face of the first pixel electrode PE1.

The planarization layer PLL may include an organic material to planarize the underlying steps. In an embodiment, the planarization layer PLL may include a polyacrylates resin, an epoxy resin, a phenolic resin, a polyamides resin, a polyimides rein, an unsaturated polyesters resin, a poly-phenyleneethers resin, a polyphenylenesulfides resin or BCB, etc., for example.

The common electrode CE may be disposed on the planarization layer PLL and the plurality of light-emitting elements LE. Specifically, the common electrode CE may be disposed on one face of the first substrate 110 on which the light-emitting element LE is formed or disposed, and may be disposed throughout the display area DPA and the non-display area NDA. The common electrode CE may overlap each of the light-emitting areas EA1, EA2, and EA3 in the display area DPA, and may have a small thickness so that light may transmit through the common electrode CE.

The common electrode CE may be disposed directly on a top face and a side faces of each of the plurality of light-emitting elements LE. The common electrode CE may directly contact a partial side face of the second semiconductor layer SEM2 and an entire side face of the third semiconductor layer SEM3 of the light-emitting element LE. As shown in FIG. 6, the common electrode CE may be embodied as a common layer that covers the plurality of light-emitting elements LE and connects the plurality of light-emitting elements LE to each other. Since the conductive second semiconductor layer SEM2 of each of the light-emitting elements LE has a patterned structure, the common electrode CE may directly contact a side face of the second semiconductor layer SEM2 of each light-emitting element LE so that a common voltage may be applied therefrom to each light-emitting element LE.

The common electrode CE may be disposed over an entirety of the first substrate 110 and may receive the common voltage. For this reason, the common electrode CE may include a material having low electrical resistance. Further, the common electrode CE may have a small thickness such that light transmission therethrough is realized. In an embodiment, the common electrode CE may include a material having low electrical resistance such as aluminum (Al), silver (Ag), copper (Cu), or the like, for example. The thickness of the common electrode CE may be in a range of about 10 angstroms (Å) to about 200 Å, but may not be limited thereto.

Each of the above-described light-emitting elements LE may receive a pixel voltage or an anode voltage from each pixel electrode via each connection electrode 125, and may receive a common voltage via the common electrode CE. The light-emitting element LE may emit light at a predefined luminance level based on a voltage difference between the pixel voltage and the common voltage.

In this embodiment, respectively disposing the plurality of light-emitting elements LE, that is, inorganic LEDs on the pixel electrodes PE1, PE2, and PE3 may eliminate an disadvantage of the OLEDs that the OLEDs are vulnerable to external moisture or oxygen, thereby improving lifespan and reliability thereof.

In one example, a first organic layer FOL may be disposed on a portion of the bank BNL disposed in the non-light-emitting area NEA.

As shown in FIG. 5 and FIG. 7, the first organic layer FOL may overlap the non-light-emitting area NEA and may not overlap the light-emitting areas EA1, EA2, and EA3. The first organic layer FOL may be disposed directly on the bank BNL, and may be spaced apart from each of the plurality of pixel electrodes PE1, PE2, and PE3 adjacent thereto. The first organic layer FOL may be disposed over an entire area of the first substrate 110 and may surround each of the plurality of light-emitting areas EA1, EA2, and EA3. The first organic layer FOL may be formed or disposed in a grid-like pattern over an entire area of the first substrate 110.

The first organic layer FOL may allow the plurality of light-emitting elements LE in contact with the first organic layer FOL in the non-light-emitting area NEA to be detached therefrom, as will be described in a manufacturing process to be described later. When the first organic layer FOL is irradiated with laser light, the first organic layer FOL absorbs energy and thus a temperature thereof instantaneously increases and thus may be ablated. Accordingly, the plurality of light-emitting elements LE in contact with a top face of the first organic layer FOL may be detached from the top face of the first organic layer FOL.

The first organic layer FOL may include a polyimide-based compound. The polyimide-based compound of the first organic layer FOL may include a cyano group to absorb light of a wavelength of approximately 308 nm, for example, laser light. The polyimide-based compound that does not include the cyano group transmits the laser light of the wavelength of approximately 308 nm therethrough, whereas the polyimide-based compound including the cyano group absorbs 100 percent (%) of the laser light of the wavelength of approximately 308 nm. That is, the polyimide-based compound including the cyano group may have 100% absorption of the laser light of the wavelength of approximately 308 nm.

In an embodiment, each of the first organic layer FOL and the bank BNL may include a polyimide-based compound, but may include different types of polyimide-based compounds. In an embodiment, the bank BNL may include the polyimide-based compound that does not include the cyano group, while the first organic layer FOL may include the polyimide-based compound that includes the cyano group, for example. A transmittance of the laser light of the wavelength of approximately 308 nm through the first organic layer FOL may be smaller than that through the bank BNL. The transmittance thereof through the bank BNL may be about 60% or greater, while the transmittance thereof through the first organic layer FOL may be 0%. Further, the absorption of the laser light of the wavelength of approximately 308 nm by the first organic layer FOL may be 100%.

Referring to FIG. 9, the polyimide-based compound not including the cyano group was formed or disposed on a glass substrate. The transmittance therethrough based on a wavelength of light was measured at an initial formation stage and after 80 hours (80 HR). The transmittance of the laser light of the wavelength of approximately 308 nm through the polyimide-based compound not including the cyano group was 60% or greater.

Referring to FIG. 10, different glass substrates glass #1 and glass #2 were prepared and transmittances therethrough based on a wavelength were measured. Further, after the polyimide-based compound including the cyano group was formed or disposed on each of the glass substrates glass #1 and glass #2, transmittances therethrough based on the wavelength of light were measured. The transmittances of light of the wavelength of approximately 308 nm through the glass substrates glass #1 and glass #2 was about 60% or greater. On the contrary, the transmittances of light of the wavelength of approximately 308 nm through polyimide-based compounds PI #1 and PI #2 including the cyano group respectively formed or disposed on the glass substrates were 0%.

Referring to FIG. 11, after excimer laser light of the wavelength was irradiated to the polyimide-based compound including the cyano group formed or disposed on the glass substrate, energy dispersive X-ray spectroscopy analysis of the polyimide-based compound was performed. As a result, it was identified that a large number of components having the cyano group were detected.

As shown in FIG. 9 to FIG. 11, it may be identified that the first organic layer FOL in an embodiment includes the cyano group, and may absorb the laser light of the wavelength of approximately 308 nm.

In one example, the first organic layer FOL may have a thickness in a range of about 2 Å to about 10 μm. When the thickness of the first organic layer FOL is about 2 Å or greater, the absorption of the laser light of the wavelength of approximately 308 nm thereby may be improved. When the thickness of the first organic layer FOL is 10 μm or smaller, a size of a step between the first organic layer FOL and the pixel electrode (e.g., PE1) may be prevented from increasing, such that the light-emitting element LE may be easily adhered to on the pixel electrode in a process described below.

The wavelength converter 200 may be disposed on the light-emitter LEP. The wavelength converter 200 may include a partitioning wall PW, a wavelength conversion layer QDL, the color filters CF1, CF2, and CF3, a light-blocking member BK and a protective layer PTL.

The partitioning wall PW may be disposed on the common electrode CE in the display area DPA. The partitioning wall PW together with the bank BNL may define each of the plurality of light-emitting areas EA1, EA2, and EA3. The partitioning wall PW may extend in the first direction DR1 and the second direction DR2, and may be formed or provided in a grid-like pattern over an entire display area DPA. Further, the partitioning wall PW may not overlap the plurality of light-emitting areas EA1, EA2, and EA3, and may overlap the non-light-emitting area NEA.

A plurality of openings OP1, OP2, and OP3 partially exposing the underlying common electrode CE may be defined in the partitioning wall PW. The plurality of openings OP1, OP2, and OP3 may include a first opening OP1 overlapping the first light-emitting area EA1, a second opening OP2 overlapping the second light-emitting area EA2, and a third opening OP3 overlapping the third light-emitting area EA3. In this connection, the plurality of openings OP1, OP2, and OP3 may respectively correspond to the plurality of light-emitting areas EA1, EA2, and EA3. That is, the first opening OP1 may correspond to the first light-emitting area EA1, the second opening OP2 may correspond to the second light-emitting area EA2, and the third opening OP3 may correspond to the third light-emitting area EA3.

The partitioning wall PW may serve to provide a space in which the wavelength conversion layer QDL is formed or provided. To this end, the partitioning wall PW may have a predefined thickness. In an embodiment, the thickness of the partitioning wall PW may be in a range of 1 μm to 10 μm, for example. The partitioning wall PW may include an organic insulating material to achieve the predefined thickness. The organic insulating material may include, for example, an epoxy-based resin, an acrylic-based resin, a cardo-based resin or an imide-based resin.

The wavelength conversion layers QDL may be respectively disposed in the plurality of openings OP1, OP2, and OP3. The wavelength conversion layer QDL may convert or shift a peak wavelength of incident light thereto to light having a predetermined peak wavelength different therefrom and may output light having the predetermined peak wavelength. The wavelength conversion layer QDL may convert a portion of the first light (e.g., blue light) emitting from the light-emitting element LE into fourth light (e.g., yellow light). The wavelength conversion layer QDL may mix the first light and the fourth light with each other and thus emit fifth light (e.g., white light). The fifth light may be converted to the first light through the first color filter CF1, and may be converted to the second light through the second color filter CF2, and may be converted to the third light through the third color filter CF3.

The wavelength conversion layers QDL may be respectively disposed in the plurality of openings OP1, OP2, and OP3 and may be spaced apart from each other. That is, the wavelength conversion layer QDL may include a dot-shaped island pattern. In an embodiment, the wavelength conversion layers QDL may be disposed on the first opening OP1, the second opening OP2, and the third opening OP3, respectively, and may correspond thereto in an one-to-one manner, for example. Further, the wavelength conversion layers QDL may overlap the first light-emitting area EA1, the second light-emitting area EA2, and the third light-emitting area EA3, respectively. In an embodiment, each of the wavelength conversion layers QDL may entirely overlap with each of the first light-emitting area EA1, the second light-emitting area EA2 and the third light-emitting area EA3.

The wavelength conversion layer QDL may include a first base resin BRS1 and first wavelength conversion particles WCP1. The first base resin BRS1 may include a light-transmissive organic material. In an embodiment, the first base resin BRS1 may include an epoxy-based resin, an acrylic-based resin, a cardo-based resin or an imide-based resin, for example.

The first wavelength conversion particles WCP1 may convert the first light incident thereto from the light-emitting element LE to the fourth light. In an embodiment, the first wavelength conversion particles WCP1 may convert light of the blue wavelength band into light of a yellow wavelength band, for example. The first wavelength conversion particle WCP1 may include a quantum dot ("QD"), a quantum rod, a fluorescent material, or a phosphorescent material. In an embodiment, a quantum dot may refer to a particulate material that emits light of a predetermined color as electrons transition from a conduction band to a valence band, for example.

The quantum dot may include a semiconductor nanocrystal material. The quantum dot may have a predetermined bandgap based on a composition and a size thereof to absorb light and then emit light having a unique wavelength. Examples of the semiconductor nanocrystal material of the quantum dot may include group IV nanocrystal, group II-VI compound nanocrystal, group III-V compound nanocrystal, group IV-VI nanocrystal, or any combinations thereof.

A group II-VI compound may include a binary compound including one of CdSe, CdTe, ZnS, ZnSe, ZnTe, ZnO, HgS, HgSe, HgTe, MgSe, MgS, and any combinations thereof, a ternary compound including one of InZnP, AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and any combinations of thereof, and a quaternary compound selected including one of HgZnTeS, CdZnSeS, CdZnSeTe, CdZnSTe, CdHgSeS, CdHgSeTe, CdHgSTe, HgZnSeS, HgZnSeTe, HgZnSTe, and any combinations of thereof.

The group III-V compound may include a binary compound including one of GaN, GaP, GaAs, GaSb, AlN, AlP, AlAs, AlSb, InN, InP, InAs, InSb, and any combinations thereof, a ternary compound including one of GaNP, GaNAs, GaNSb, GaPAs, GaPSb, AlNP, AlNAs, AlNSb, AlPAs, AlPSb, InGaP, InNP, InAiP, InNAs, InNSb, InPAs, InPSb, GaAlNP, and any combinations thereof, and a quaternary compound including one of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and any combinations thereof.

The group IV-VI compound may include a binary compound including one of SnS, SnSe, SnTe, PbS, PbSe, PbTe, and any combinations thereof, a ternary compound including one of SnSeS, SnSeTe, SnSTe, PbSeS, PbSeTe, PbSTe, SnPbS, SnPbSe, SnPbTe, and any combinations thereof, and a quaternary compound including one of SnPbSSe, SnPbSeTe, SnPbSTe, and any combinations thereof. The IV group element may include one of Si, Ge, and a combination thereof. The IV group compound may include a binary compound including one of SiC, SiGe, and a combination thereof.

In this connection, the binary compound, the ternary compound, or the quaternary compound may be included at a uniform concentration and in the particle. In an alternative embodiment, the binary compound, the ternary compound, and the quaternary compound may be included at the same concentration and in the particle. In an alternative embodiment, the binary compound, the ternary compound, or the quaternary compound may be included at a concentration gradient manner and in the particle. In an alternative embodiment, the binary compound, the ternary compound, and the quaternary compound may be included at the same concentration and in the same particle. Further, the first wavelength conversion particle may have a core/shell structure in which one quantum dot surrounds another quantum dot. An interface between the core and the shell may have a concentration gradient in which a concentration of an element in the shell decreases as it goes toward a center.

In an embodiment, the quantum dot may have a core-shell structure including a core including the aforementioned nanocrystal and a shell surrounding the core. The shell of the quantum dot may serve as a protective layer to prevent chemical denaturation of the core to maintain semiconductor characteristics thereof and/or as a charging layer to impart electrophoresis ability to the quantum dot. The shell may consist of a single layer or multiple layers. Examples of the shell of the quantum dot may include an oxide of a metal or a non-metal, a semiconductor compound, or any combinations thereof.

In an embodiment, the oxide of the metal or the non-metal may include a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO, or a ternary compound such as $MgAl_2O_4$, $CoFe_2O_4$, $NiFe_2O_4$, and $CoMn_2O_4$, for example. However, the invention is not limited thereto.

Further, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc. However, the invention is not limited thereto The wavelength conversion layer QDL may further include a scattering material to scatter the light from the light-emitting element LE in random directions. The scattering material may have a refractive index different from that of the first base resin BRS1 such that an optical interface may be formed or provided between the scattering material and the first base resin BRS1. In an embodiment, the scattering material may be embodied as light scattering particles, for example. The scattering material is not particularly limited as long as the scattering material is capable of scattering at least a portion of light transmitting therethrough. In an embodiment, the scattering material may be embodied as metal oxide particles or organic particles, for example. The metal oxide may include titanium oxide ($TiO_2$), zirconium oxide ($ZrO_2$), aluminum oxide ($Al_2O_3$), indium oxide ($In_2O_3$), zinc oxide (ZnO), or tin oxide ($SnO_2$). The organic particle may include an acrylic-based resin or an urethane-based resin. The scattering material may scatter the light in a random direction regardless of an incidence direction of the incident light thereto while not substantially converting the wavelength of the light.

As a thickness of the wavelength conversion layer QDL in the third direction DR3 becomes greater, a content of the first wavelength conversion particles WCP1 included in the wavelength conversion layer QDL becomes higher. Thus, the optical conversion efficiency of the wavelength conversion layer QDL may be improved. Therefore, the thickness of the wavelength conversion layer QDL is preferably controlled in consideration of the optical conversion efficiency of the wavelength conversion layer QDL.

The wavelength conversion layer QDL of the above-described wavelength converter 200 may convert a portion of the first light emitting from the light-emitting element LE into the fourth light. The wavelength conversion layer QDL may mix the first light and the fourth light with each other and may emit the fifth light of the white color. The first color filter CF1 which will be described later may transmit therethrough only the first light from the fifth light emitting from the wavelength conversion layer QDL. The second color filter CF2 which will be described later may transmit therethrough only the second light from the fifth light emitting from the wavelength conversion layer QDL. The third color filter CF3 which will be described later may transmit therethrough only the third light from the fifth light emitting from the wavelength conversion layer QDL. Accordingly, the light emitting from the wavelength converter 200 may consist of the blue light beam as the first light, the red light beam as the second light, and the green light beam as the third light. In this manner, a full color may be realized.

Each of the plurality of color filters CF1, CF2, and CF3 may be disposed on the partitioning wall PW and each of the wavelength conversion layers QDL. Each of the plurality of color filters CF1, CF2, and CF3 may overlap each of the plurality of openings OP1, OP2, and OP3 and each of the wavelength conversion layers QDL. The plurality of color filters CF1, CF2, and CF3 may include a first color filter CF1, a second color filter CF2, and a third color filter CF3.

The first color filter CF1 may overlap the first light-emitting area EA1. Further, the first color filter CF1 may be disposed on the first opening OP1 of the partitioning wall PW and may overlap with the first opening OP1. The first color filter CF1 transmits the first light emitting from the light-emitting element LE therethrough, and may absorb or block the second light and the third light. In an embodiment, the first color filter CF1 may transmit light of the blue wavelength band therethrough, and may absorb or block light of other wavelength bands such as green and red wavelength bands, for example.

The second color filter CF2 may overlap the second light-emitting area EA2. Further, the second color filter CF2 may be disposed on the second opening OP2 of the partitioning wall PW and may overlap the second opening OP2. The second color filter CF2 may transmit the second light therethrough and absorb or block the first light and the third light. In an embodiment, the second color filter CF2 may transmit light of the green wavelength band therethrough, and may absorb or block the light of other wavelength bands such as blue and red wavelength bands, for example.

The third color filter CF3 may overlap the third light-emitting area EA3. Further, the third color filter CF3 may be disposed on the third opening OP3 of the partitioning wall PW and may overlap the third opening OP3. The third color filter CF3 may transmit the third light therethrough and absorb or block the first light and the second light. In an embodiment, the third color filter CF3 may transmit light of a red wavelength band therethrough, and may absorb or block light of other wavelength bands such as blue and green wavelength bands, for example.

As shown in FIG. 12, a planar area of each of the plurality of color filters CF1, CF2, and CF3 may be larger than a planar area of each of the plurality of light-emitting areas EA1, EA2, and EA3. In an embodiment, a planar area of the first color filter CF1 may be larger than a planar area of the first light-emitting area EA1. A planar area of the second color filter CF2 may be larger than a planar area of the second light-emitting area EA2. A planar area of the third color filter CF3 may be larger than a planar area of the third light-emitting area EA3. However, the invention is not limited thereto. In another embodiment, the planar area of each of the plurality of color filters CF1, CF2, and CF3 may be equal to the planar area of each of the plurality of light-emitting areas EA1, EA2, and EA3.

Referring to FIG. 4 and FIG. 5, the light-blocking member BK may be disposed on the partitioning wall PW. The light-blocking member BK may overlap the non-light-emitting area NEA to block light transmission. The light-blocking member BK may be formed or provided roughly in a grid pattern in a plan view, in a similar manner to the bank BNL or the partitioning wall PW. The light-blocking member BK may overlap the bank BNL, the first organic layer FOL and the partitioning wall PW, and may not overlap the light-emitting areas EA1, EA2 and EA3.

In an embodiment, the light-blocking member BK may include an organic light-blocking material, and may be formed or provided via coating and exposure processes of an organic light-blocking material. The light-blocking member BK may include dyes or pigments having light blocking ability and may be a black matrix. The light-blocking member BK may partially overlap each of the color filters CF1, CF2, and CF3 adjacent thereto. Each of the color filters CF1, CF2, and CF3 may be disposed on at least a portion of the light-blocking member BK.

External light incident from an outside of the display device 10 may distort color gamut of the wavelength converter 200. When the light-blocking member BK is included in the wavelength converter 200 according to this embodiment, at least a portion of the external light is absorbed by the light-blocking member BK. Accordingly, color distortion due to external light reflection may be reduced. Further, the light-blocking member BK may prevent mutual light invasion between adjacent light-emitting areas and thus may prevent color mixing. Accordingly, color gamut may be further improved.

The protective layer PTL may be disposed on the plurality of color filters CF1, CF2, and CF3 and the light-blocking member BK. The protective layer PTL may be disposed on a top of the display device 10 to protect the plurality of color filters CF1, CF2, and CF3 and the light-blocking member BK disposed thereunder. One face, for example, a bottom face of the protective layer PTL may contact a top face of each of the plurality of color filters CF1, CF2, and CF3 and a top face of the light-blocking member BK.

The protective layer PTL may include an inorganic insulating material to protect the plurality of color filters CF1, CF2, and CF3 and the light-blocking member BK. In an embodiment, the protective layer PTL may include silicon oxide ($SiO_x$), silicon nitride ($SiN_x$), silicon oxynitride ($SiO_xN_y$), aluminum oxide ($Al_xO_y$), aluminum nitride (AlN), or the like, for example. However, the invention is not limited thereto. The protective layer PTL may have a predetermined thickness which may be in a range of 0.01 μm to 1 μm. However, the invention is not limited thereto.

In the above-described embodiment, respectively disposing the plurality of light-emitting elements LE, that is, the inorganic LEDs on the pixel electrodes PE1, PE2, and PE3 may eliminate the disadvantage of the OLEDs that the OLEDs are vulnerable to external moisture or oxygen, thereby improving lifespan and reliability of the display device 10.

Hereinafter, a display device 10 in another embodiment will be described with reference to other drawings.

Figure 13:
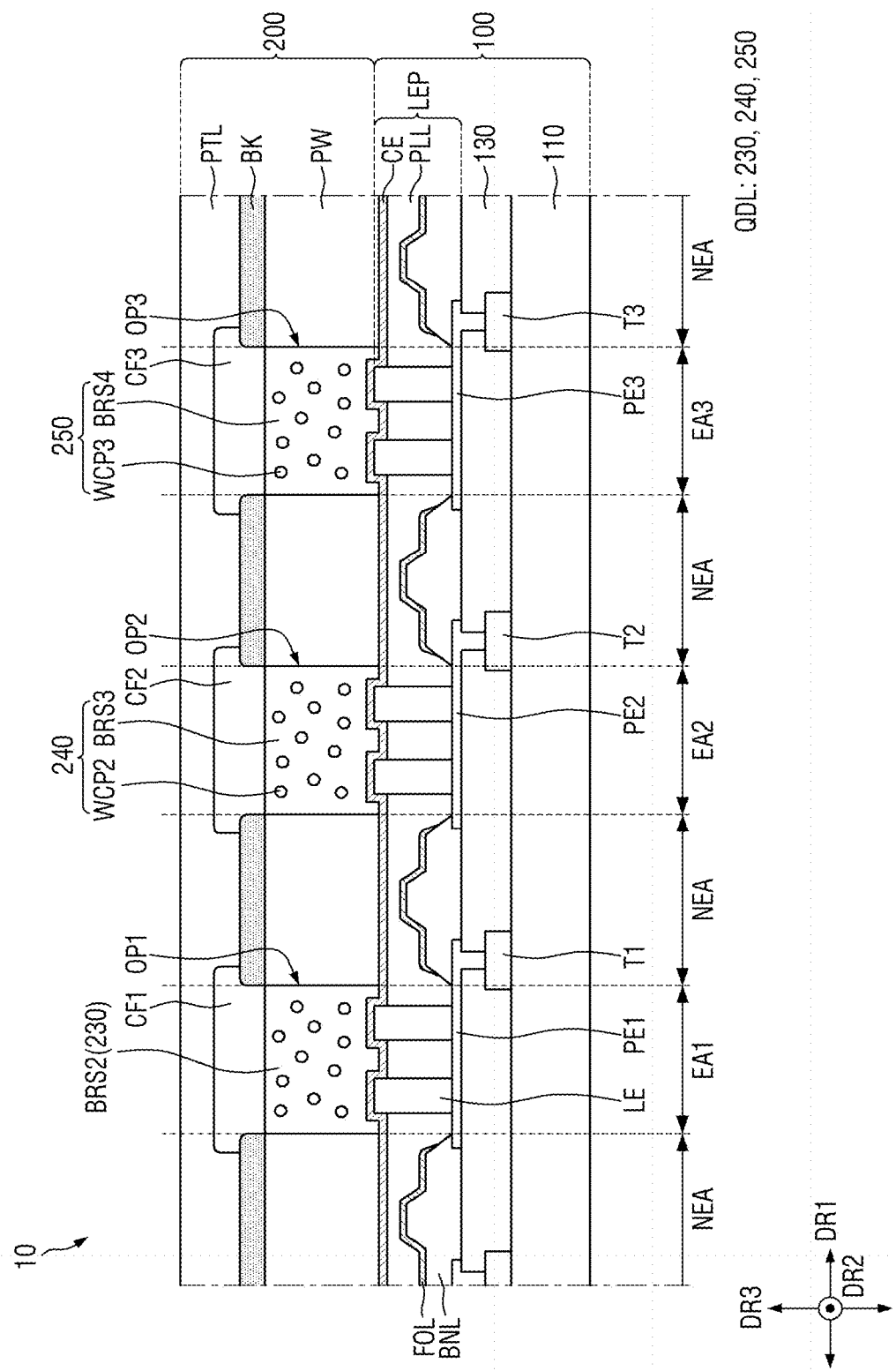
FIG. 13 is a cross-sectional view schematically showing another embodiment of a display device.

FIG. 13 is a cross-sectional view schematically showing another embodiment of a display device.

Referring to FIG. 13, a configuration of the wavelength conversion layer QDL of the display device 10 may be modified. This embodiment is different from the embodiment of FIG. 4 as described above in that the wavelength conversion layer QDL of this embodiment includes a light-transmissive pattern 230, a first wavelength conversion pattern 240, and a second wavelength conversion pattern 250. Hereinafter, the description of the same components therebetween will be simplified or omitted, and the differences therebetween will be described in detail.

The wavelength conversion layer QDL may include the light-transmissive pattern 230, the first wavelength conversion pattern 240 and the second wavelength conversion pattern 250.

The light-transmissive pattern 230 may be disposed in the first opening OP1, and may overlap each of the first light-emitting area EA1 and the first color filter CF1. The light-transmissive pattern 230 may transmit light incident thereto therethrough. The first light emitting from the light-emitting element LE disposed in the first light-emitting area EA1 may be blue light. The first light as the blue light may pass through the light-transmissive pattern 230 and may be output out of the first light-emitting area EA1.

In an embodiment, the light-transmissive pattern 230 may include a second base resin BRS2. The second base resin BRS2 may include a material having high light transmittance. In an embodiment, the second base resin BRS2 may include an organic material. The second base resin BRS2 may include substantially the same material as that of the above-mentioned first base resin BRS1. In an embodiment, the second base resin BRS2 may include an organic material such as an epoxy-based resin, an acrylic-based resin, a cardo-based resin or an imide-based resin.

The first wavelength conversion pattern 240 may be disposed in the second opening OP2, and may overlap each of the second light-emitting area EA2 and the second color filter CF2. The first wavelength conversion pattern 240 may convert or shift a peak wavelength of incident light thereto to a predetermined peak wavelength different therefrom and may output light having the predetermined peak wavelength. In an embodiment, the first wavelength conversion pattern 240 may convert the first light emitting from the light-emitting element LE in the second light-emitting area EA2 to the second light as green light having a peak wavelength in a range of about 510 nm to about 550 nm and may emit the green light.

The first wavelength conversion pattern 240 may include a third base resin BRS3 and second wavelength conversion particles WCP2 dispersed in the third base resin BRS3.

The third base resin BRS3 may include a material having high light transmittance. In an embodiment, the third base resin BRS3 may include an organic material. The third base resin BRS3 may include the same material as that of the first base resin BRS1 or the second base resin BRS2, or may include at least one of the materials as the embodiments of the constituent material of the first base resin BRS1 or the second base resin BRS2.

The second wavelength conversion particles WCP2 may convert or shift a peak wavelength of incident light thereto to a predetermined peak wavelength different therefrom. In an embodiment, the second wavelength conversion particles WCP2 may convert the first color light as the blue light from the light-emitting element LE into green light having a peak wavelength in a range of about 510 nm to about 550 nm and emit the green light.

An embodiment of the second wavelength conversion particle WCP2 may include a quantum dot, a quantum rod, or phosphor. A more detailed description of the second wavelength conversion particle WCP2 is substantially the same as or similar to the description of the first wavelength conversion particle WCP1, and thus will be omitted.

A portion of the first light as the blue light emitting from the light-emitting element LE may not be converted to the second light as the green light by the second wavelength conversion particle WCP2, but may pass through the first wavelength conversion pattern 240. However, the portion of the first light that has not been converted to the green light may be blocked with the second color filter CF2. To the contrary, the green light into which a portion of the first light emitting from the light-emitting element LE has been converted by the first wavelength conversion pattern 240 may pass through the second color filter CF2 and may emit to an outside.

The second wavelength conversion pattern 250 may be disposed in the third opening OP3, and may overlap each of the third light-emitting area EA3 and the third color filter CF3. The second wavelength conversion pattern 250 may convert or shift a peak wavelength of light incident thereto into a predetermined peak wavelength different therefrom and may emit light having the predetermined peak wavelength. In an embodiment, the second wavelength conversion pattern 250 may convert the first light emitting from the light-emitting element LE in the third light-emitting area EA3 into the third light as red light having a peak wavelength in a range of about 610 nm to about 650 nm, and may emit the third light.

The second wavelength conversion pattern 250 may include a fourth base resin BRS4 and third wavelength conversion particles WCP3 dispersed in the fourth base resin BRS4.

The fourth base resin BRS4 may include a material having high light transmittance. In an embodiment, the fourth base resin BRS4 may include an organic material. The fourth base resin BRS4 may include the same material as that of the above-mentioned first base resin BRS1, second base resin BRS2, and third base resin BRS3, or may include at least one of the materials as the embodiments of the constituent material of the first base resin BRS1 or the second base resin BRS2.

The third wavelength conversion particles WCP3 may convert or shift a peak wavelength of incident light thereto to a predetermined peak wavelength different therefrom. In an embodiment, the third wavelength conversion particles WCP3 may convert the first color light as the blue light from the light-emitting element LE into red light having a single peak wavelength in a range of about 610 nm to about 650 nm and emit the red light.

An embodiment of the third wavelength conversion particle WCP3 may include a quantum dot, a quantum rod, or phosphor. A more detailed description of the third wavelength conversion particle WCP3 is substantially the same as or similar to the description of the first wavelength conversion particle WCP1, and thus will be omitted.

A portion of the first light as the blue light emitting from the light-emitting element LE may not be converted to the third light as the red light by the third wavelength conversion particle WCP3, but may pass through the second wavelength conversion pattern 250. However, the portion of the first light that has not been converted to the red light may be blocked with the third color filter CF3 disposed on the second wavelength conversion pattern 250. To the contrary, the red light into which a portion of the first light emitting from the light-emitting element LE has been converted by the second wavelength conversion pattern 250 may pass through the third color filter CF3 and may emit to an outside.

Each of the first wavelength conversion pattern 240 and the second wavelength conversion pattern 250 may further include the scattering material as described. However, the invention is not limited thereto.

The display device 10 in an embodiment as described above may include the wavelength conversion layer QDL including the light-transmissive pattern 230, the first wavelength conversion pattern 240 and the second wavelength conversion pattern 250, thereby improving light emission efficiency of each of the blue, green and red light beams.

Figure 14:
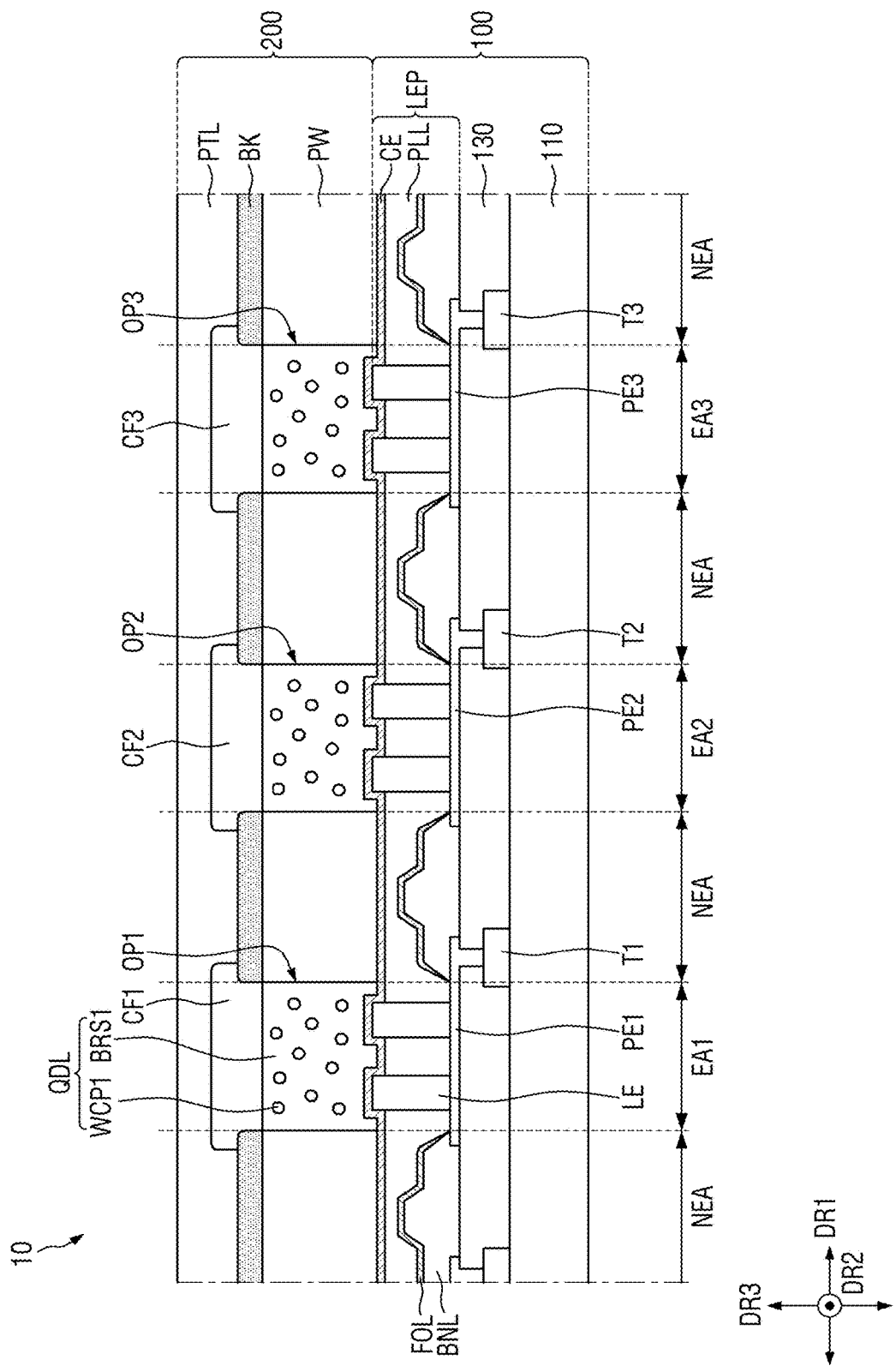
FIG. 14 is a cross-sectional view showing another embodiment of a display device.
Figure 15:
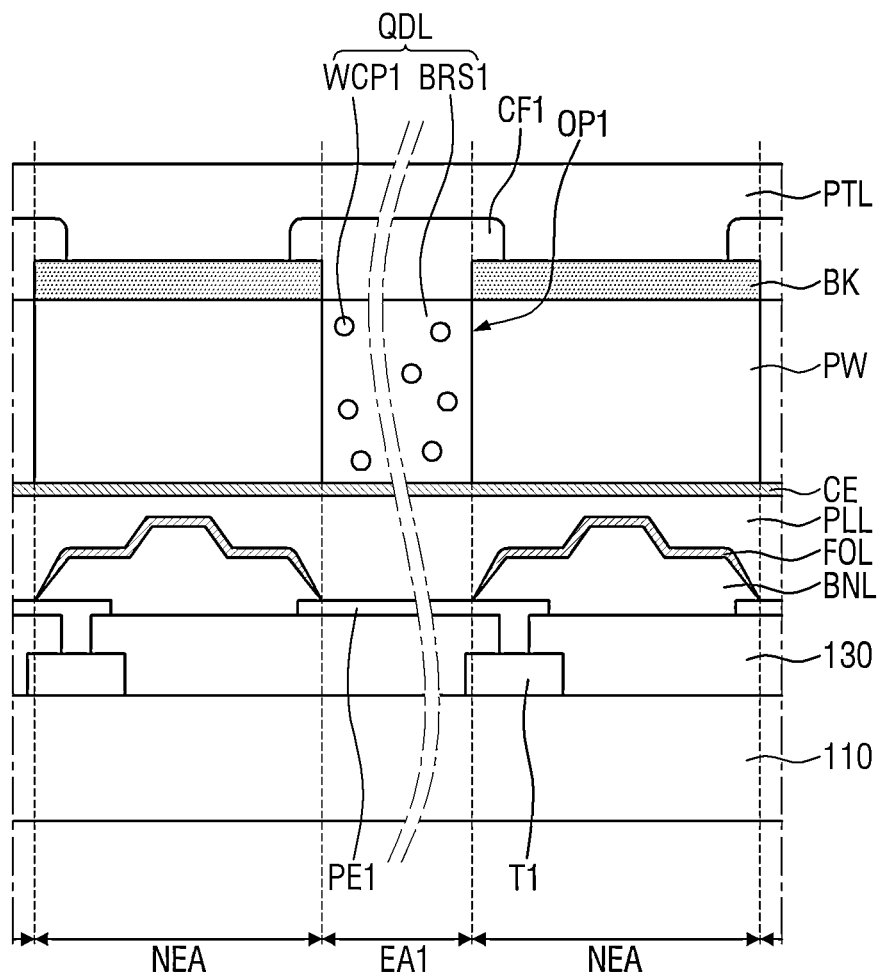
FIG. 15 is an enlarged view showing a first light-emitting area.
Figure 16:
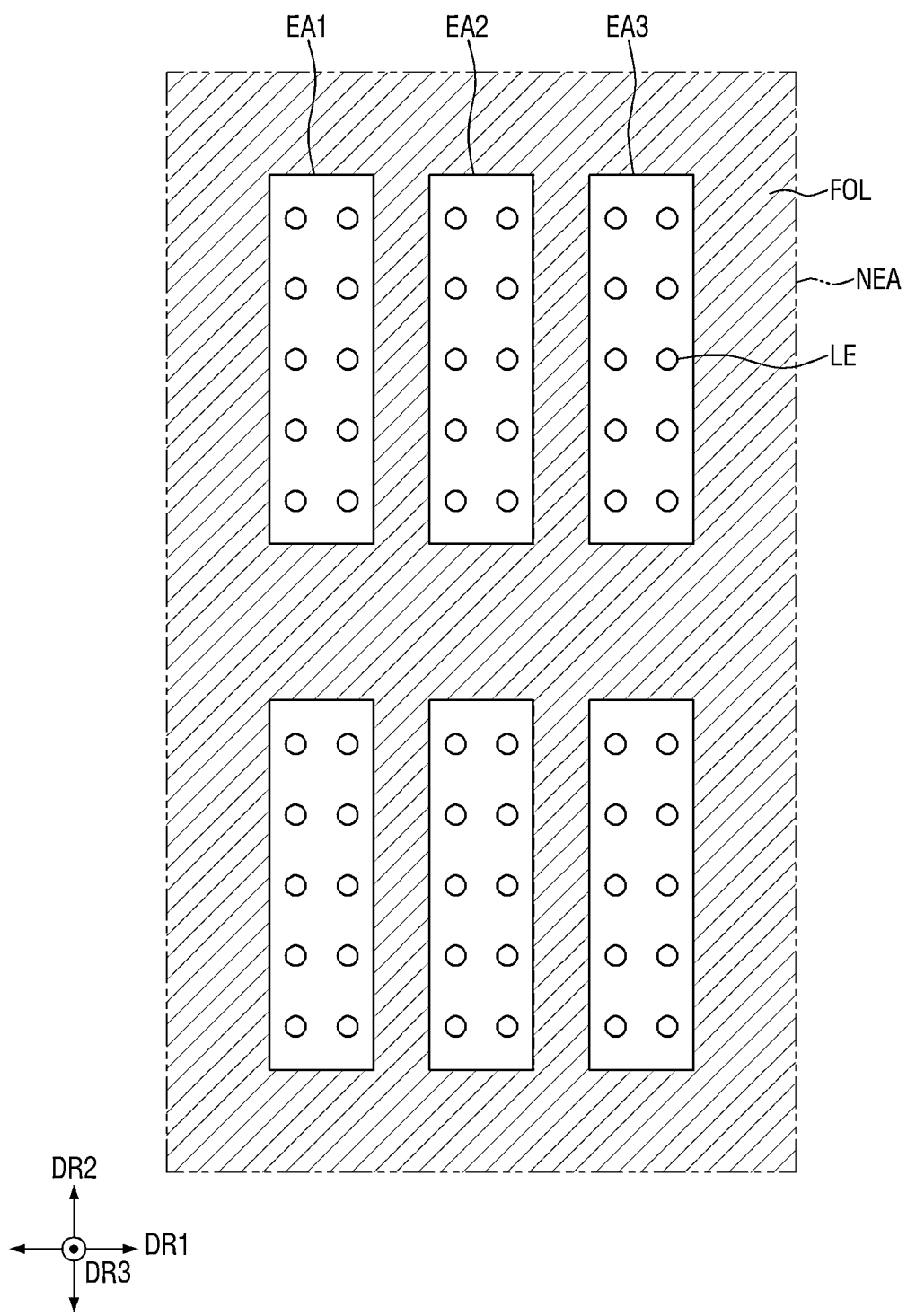
FIG. 16 is a plan view schematically showing a plurality of light-emitting areas.

FIG. 14 is a cross-sectional view showing another embodiment of a display device. FIG. 15 is an enlarged view showing a first light-emitting area. FIG. 16 is a plan view schematically showing a plurality of light-emitting areas.

Referring to FIG. 14 to FIG. 16, this embodiment is different from the embodiments of FIG. 4 and FIG. 13 in that the first organic layer FOL of the display device 10 is formed or provided in an entirety of the non-light-emitting area NEA and is not overlapped with the light-emitting areas EA1, EA2, and EA3. Hereinafter, the description of the same components therebetween will be simplified or omitted, and the differences therebetween will be described in detail.

The first organic layer FOL may overlap the non-light-emitting area NEA and may not overlap the light-emitting areas EA1, EA2, and EA3. The first organic layer FOL may be disposed directly on the bank BNL, and may not be overlapped with each of the plurality of pixel electrodes PE1, PE2, and PE3. The first organic layer FOL may be disposed over an entire area of the first substrate 110 and may surround each of the plurality of light-emitting areas EA1, EA2, and EA3. The first organic layer FOL may be formed or provided in a grid-like pattern.

The first organic layer FOL may be disposed on an entire top face of the bank BNL, and thus may be disposed in the entirety of the non-light-emitting area NEA. In this connection, the first organic layer FOL may be disposed in the display area DPA of FIG. 1 and may not be disposed in the non-display area NDA of FIG. 1. In the previous embodiment, a case in which the first organic layer FOL is spaced apart from each of the light-emitting areas EA1, EA2, and EA3 by a predetermined spacing is described. However, in this embodiment, the first organic layer FOL may be disposed in the entire non-light-emitting area NEA, and may contact each of the light-emitting areas EA1, EA2, and EA3.

At least one side of the first organic layer FOL may be aligned with a side of the bank BNL. Further, at least one side of the first organic layer FOL may be aligned with and coincide with one side of the partitioning wall PW disposed above the first organic layer FOL. Although the drawing shows that both opposing sides of the first organic layer FOL are aligned with both opposing sides of each of the partitioning wall PW and the bank BNL, the invention is not limited thereto. In another embodiment, at least one side of the first organic layer FOL may be aligned with a side of each of the partitioning wall PW and the bank BNL.

As described above, the first organic layer FOL may allow the plurality of light-emitting elements LE in contact with the first organic layer FOL in the non-light-emitting area NEA to be detached therefrom. Accordingly, as the first organic layer FOL is disposed in the entirety of the non-light-emitting area NEA, the light-emitting elements LE which are disposed adjacent to each of the light-emitting areas EA1, EA2 and EA3 and do not emit light may be detached therefrom.

This embodiment discloses that both opposing sides of the first organic layer FOL are respectively aligned with both opposing sides of the bank BNL, and the first organic layer FOL is disposed in the entirety of the non-light-emitting area NEA. However, the invention is not limited thereto. In another embodiment, the first organic layer FOL may cover the bank BNL and may partially overlap each of the light-emitting areas EA1, EA2, and EA3. In this case, the first organic layer FOL may partially contact each of the pixel electrodes PE1, PE2, and PE3. That is, a planar area of the first organic layer FOL may be larger than a planar area of the bank BNL.

Figure 17:
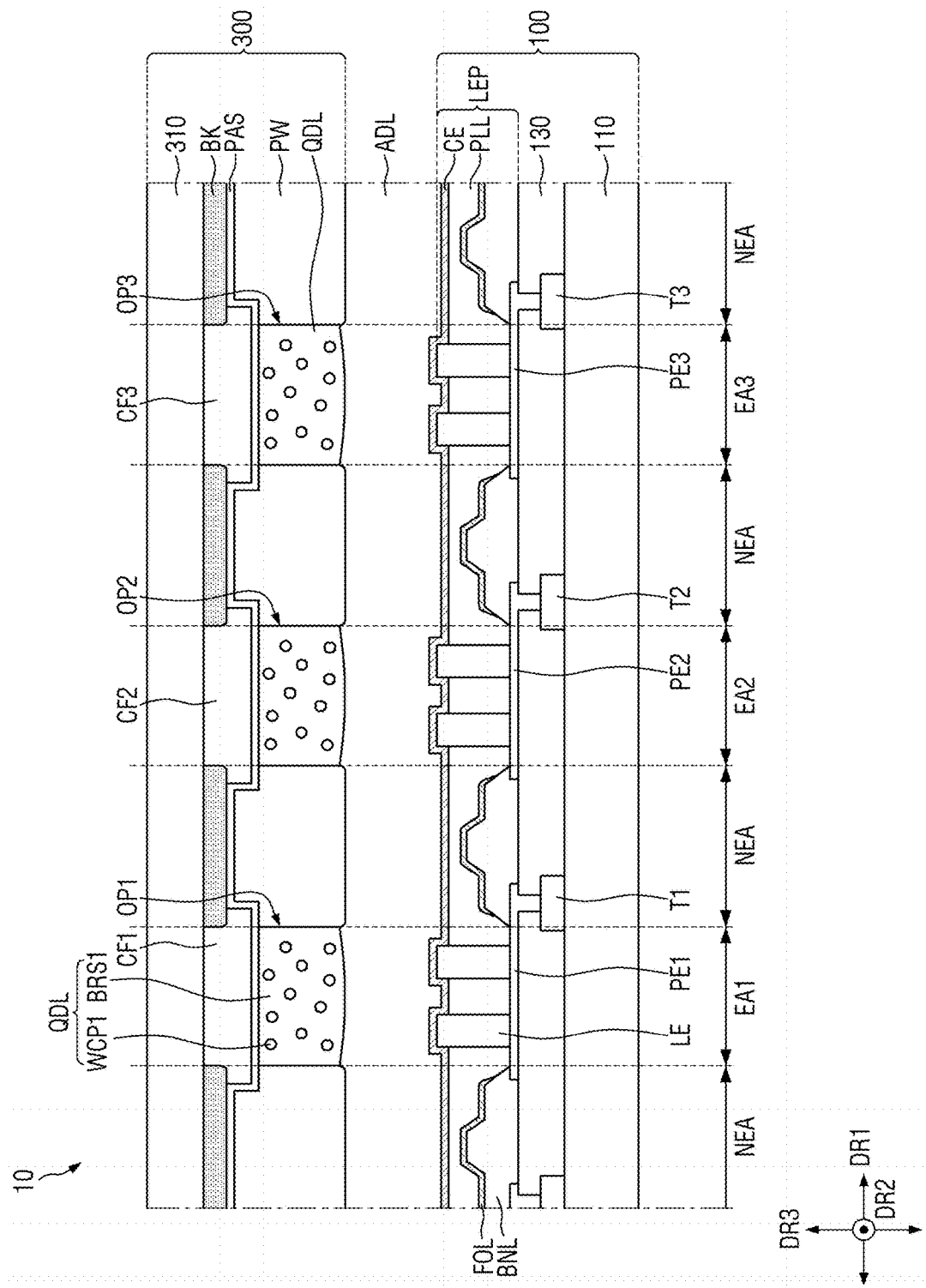
FIG. 17 is a cross-sectional view showing another embodiment of a display device according to still another embodiment.

FIG. 17 is a cross-sectional view showing another embodiment of a display device.

Referring to FIG. 17, a display device 10 in this embodiment is different from the display devices of the previous embodiments in that the former includes a wavelength conversion substrate 300 opposite to the display substrate 100 instead of the wavelength converter 200 shown in FIG. 4. Hereinafter, the description of the same components therebetween will be simplified or omitted, and the differences therebetween will be described in detail.

The wavelength conversion substrate 300 may be opposite to the display substrate 100. The wavelength conversion substrate 300 may include a second substrate 310. The second substrate 310 may be an insulating substrate. The second substrate 310 may include a transparent material. In an embodiment, the second substrate 310 may include a transparent insulating material such as glass, quartz, or the like, for example. The second substrate 310 may be a rigid substrate. However, the second substrate 310 may not be limited thereto, and may include plastic such as polyimide or the like, and may be flexible, for example, bendable, rollable, or foldable. As described above, the plurality of light-emitting areas EA1, EA2, and EA3 and the plurality of the non-light-emitting areas NEA may be defined on the second substrate 310.

A light-blocking member BK may be disposed on one face of the second substrate 310 facing toward the display substrate 100. The plurality of color filters CF1, CF2, and CF3 may be respectively disposed in areas of the second substrate 310 partitioned from each other via the light-blocking member BK. The descriptions of the light-blocking member BK and the plurality of color filters CF1, CF2, and CF3 are the same as have been described above, and thus will be omitted.

A passivation layer PAS may be disposed on a bottom face of each of the light-blocking member BK and each of the plurality of color filters CF1, CF2, and CF3. The passivation layer PAS may cover the light-blocking member BK and the plurality of color filters CF1, CF2, and CF3. The passivation layer PAS may prevent impurities such as moisture or air from an outside from invading and thus damaging or contaminating the plurality of color filters CF1, CF2, and CF3. Further, the passivation layer PAS may prevent colorants of the plurality of color filters CF1, CF2, and CF3 from being diffused into another component.

The passivation layer PAS may include an inorganic material. In an embodiment, the passivation layer PAS may include silicon nitride, aluminum nitride, zirconium nitride, titanium nitride, hafnium nitride, tantalum nitride, silicon oxide, aluminum oxide, titanium oxide, tin oxide and silicon oxynitride, for example.

The partitioning wall PW in which the plurality of openings OP1, OP2, and OP3 is defined may be disposed on a bottom face of the passivation layer PAS. Each wavelength conversion layer QDL may be disposed in each of the plurality of openings OP1, OP2, and OP3 of the partitioning wall PW.

The wavelength conversion substrate 300 may be bonded to the display substrate 100 via an adhesive member ADL. The adhesive member ADL may be disposed between the wavelength conversion substrate 300 and the display substrate 100, and may bond the wavelength conversion substrate 300 and the display substrate 100 to each other.

The drawing shows that the adhesive member ADL is in direct contact with the common electrode CE of the display substrate 100 and is in direct contact with the partitioning wall PW and the wavelength conversion layer QDL of the wavelength conversion substrate 300. However, the invention is not limited thereto. In another embodiment, a passivation layer may be further disposed on the common electrode CE of the display substrate 100 to protect the common electrode CE. A passivation layer may be further disposed on a bottom face of each of the partitioning wall PW and the wavelength conversion layer QDL of the wavelength conversion substrate 300 to protect the partitioning wall PW and the wavelength conversion layer QDL.

As described above, the display substrate 100 and the wavelength conversion substrate 300 may be bonded to each other to produce the display device 10. Thus, the manufacturing process of the display device 10 may be easy.

Figure 18:
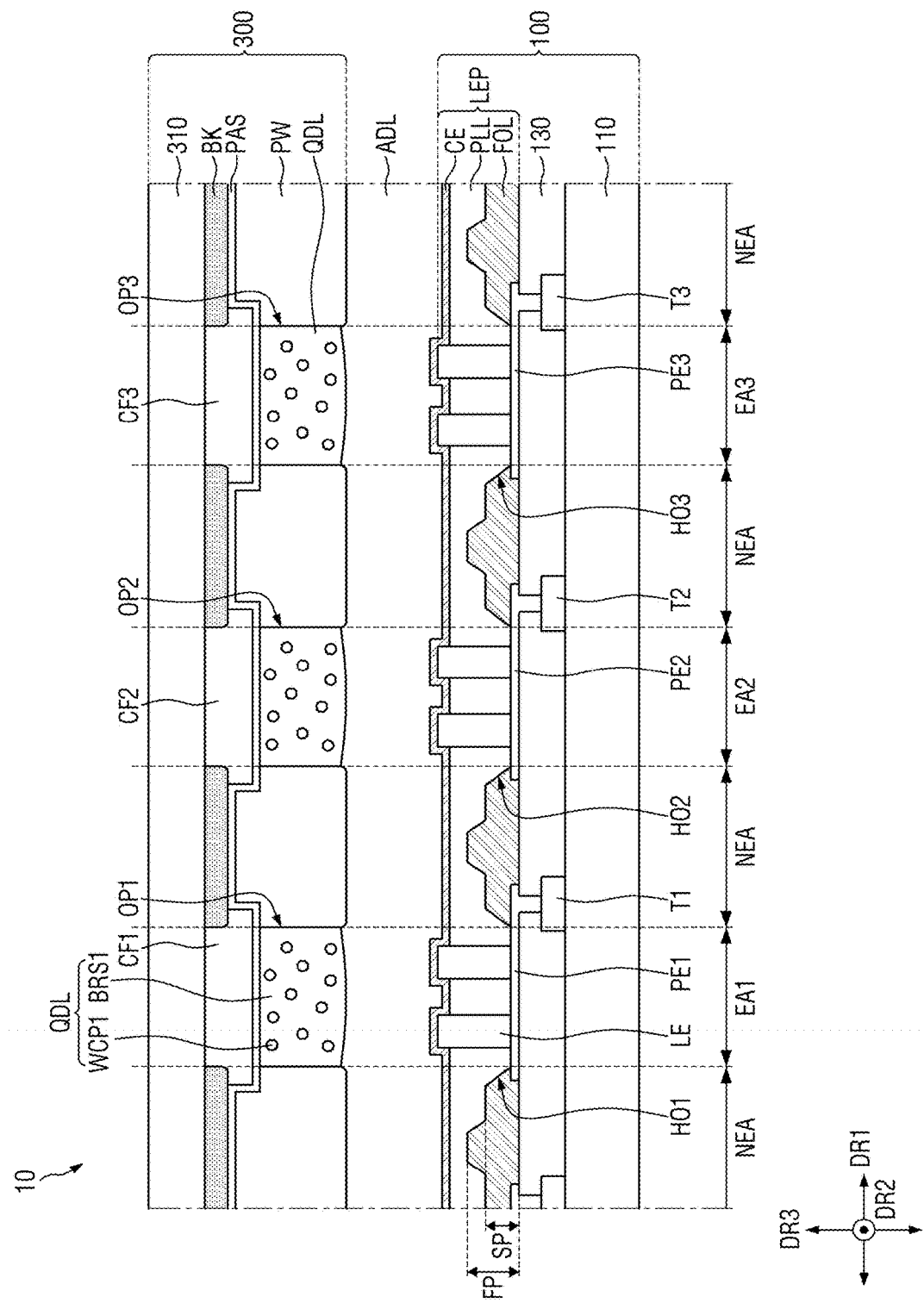
FIG. 18 and FIG. 19 are cross-sectional views showing a display device according to still yet further another embodiment.
Figure 19:
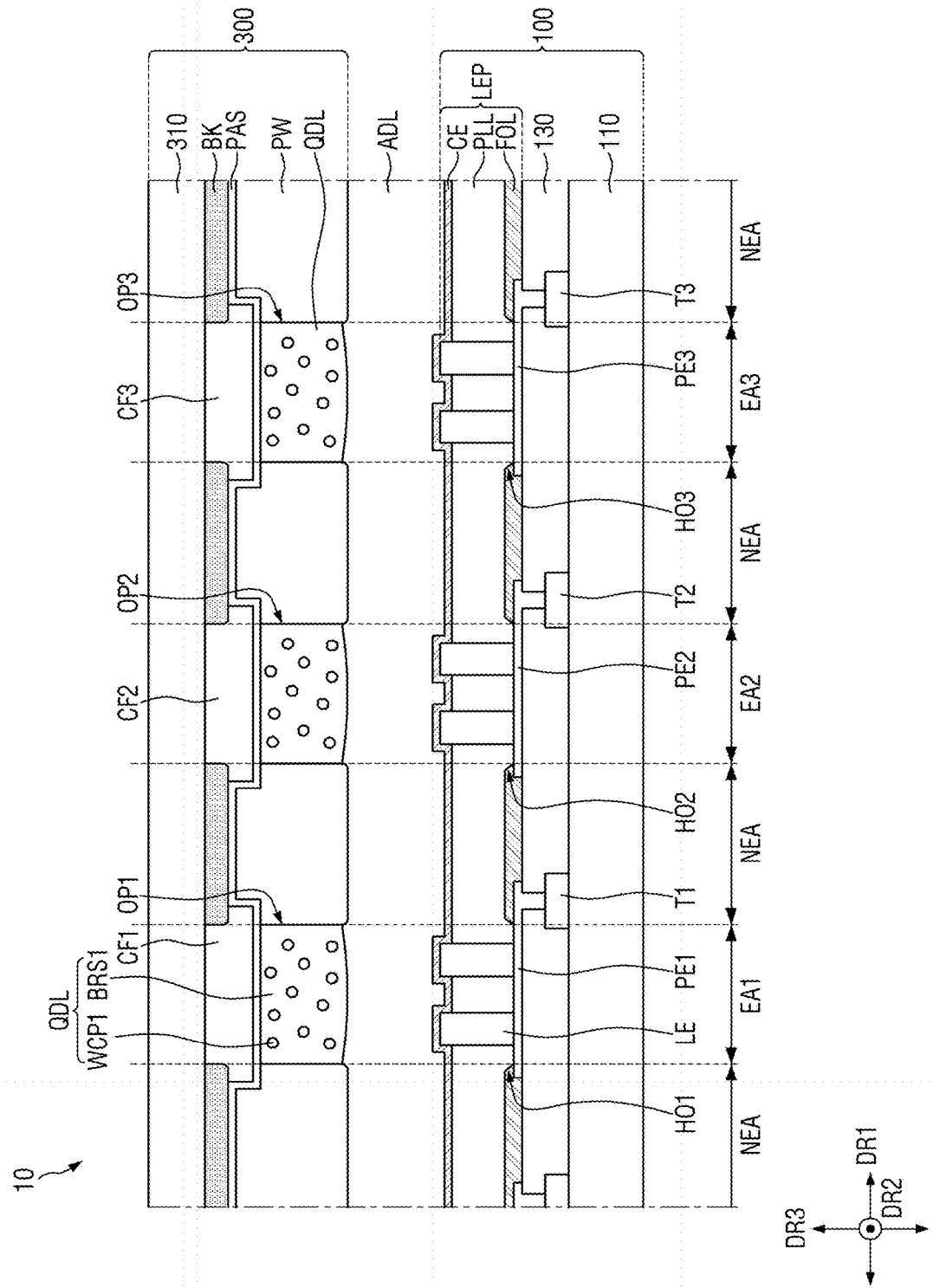

FIG. 18 and FIG. 19 are cross-sectional views showing a display device according to still yet further another embodiment.

Referring to FIG. 18 and FIG. 19, a display device 10 in this embodiment is different from the display devices of the previous embodiments in that the first organic layer FOL acts as the bank BNL as shown in FIG. 4. Hereinafter, the description of the same components therebetween will be simplified or omitted, and the differences therebetween will be described in detail.

The first organic layer FOL may be partially disposed on each of the first pixel electrode PE1, the second pixel electrode PE2, and the third pixel electrode PE3. A first hole H01 exposing a portion of the first pixel electrode PE1, a second hole H02 exposing a portion of the second pixel electrode PE2, and a third hole H03 exposing a portion of the third pixel electrode PE3 may be defined in the first organic layer FOL. The first hole H01 of the first organic layer FOL may define the first light-emitting area EA1, the second hole H02 may define the second light-emitting area EA2, and the third hole H03 may define the third light-emitting area EA3. Further, an area overlapping the first organic layer FOL may be defined as the non-light-emitting area NEA.

The first organic layer FOL may overlap the plurality of color filters CF1, CF2, and CF3 and the light-blocking member BK of the wavelength converter 200. In an embodiment, the first organic layer FOL may entirely overlap the light-blocking member BK. The first organic layer FOL may be disposed over an entire area of the display substrate 100 and may surround each of the plurality of light-emitting areas EA1, EA2, and EA3. The first organic layer FOL may be formed or provided in a grid-like pattern. Further, the first organic layer FOL may be directly disposed on the insulating layer 130 and the plurality of pixel electrodes PE1, PE2, and PE3.

The first organic layer FOL may include a first area FP having the largest thickness as measured from a top face of the insulating layer 130, and a second area SP having a thickness smaller than that of the first area FP. The first area FP may serve to buffer an impact applied to the display substrate 100 when a base substrate BSUB as described later on which the light-emitting element LE is formed or disposed is bonded to the display substrate 100. The first area FP may be surrounded with the second area SP and may be spaced apart from each of the plurality of light-emitting areas EA1, EA2, and EA3. The second area SP may serve to substantially define each of the plurality of light-emitting areas EA1, EA2, and EA3. The second area SP may contact each of the plurality of light-emitting areas EA1, EA2, and EA3, and may contact each of the plurality of pixel electrodes PE1, PE2, and PE3.

As shown in FIG. 19, in another embodiment, a thickness of the first organic layer FOL may be uniform. Thus, a top face thereof may be flat. In this case, the first organic layer FOL may have a thickness ranging from about 2 Å to about 10 μm. When the thickness of the first organic layer FOL is uniform, a step of the display substrate 100 is reduced such that the light-emitting elements may be reliably attached to each of the plurality of pixel electrodes PE1, PE2, and PE3 in a process of bonding the base substrate BSUB on which the light-emitting elements LE are formed or disposed to the display substrate.

In another embodiment, the first organic layer FOL may be disposed on the insulating layer 130 and may not overlap each of the pixel electrodes PE1, PE2, and PE3. In this case, the first organic layer FOL may be spaced apart from each of the pixel electrodes PE1, PE2, and PE3 in the first direction DR1. In an alternative embodiment, a side of the first organic layer FOL and a side of each of the pixel electrodes PE1, PE2, and PE3 may be aligned with and coincide with each other.

As described above, in the display device 10 according to the above embodiments, the bank may be replaced with the first organic layer FOL. Thus, a bank formation process may be omitted. Thus, the manufacturing process of the display device may be simplified.

Hereinafter, a manufacturing process of the display device 10 in an embodiment will be described with reference to other drawings.

Figure 20:
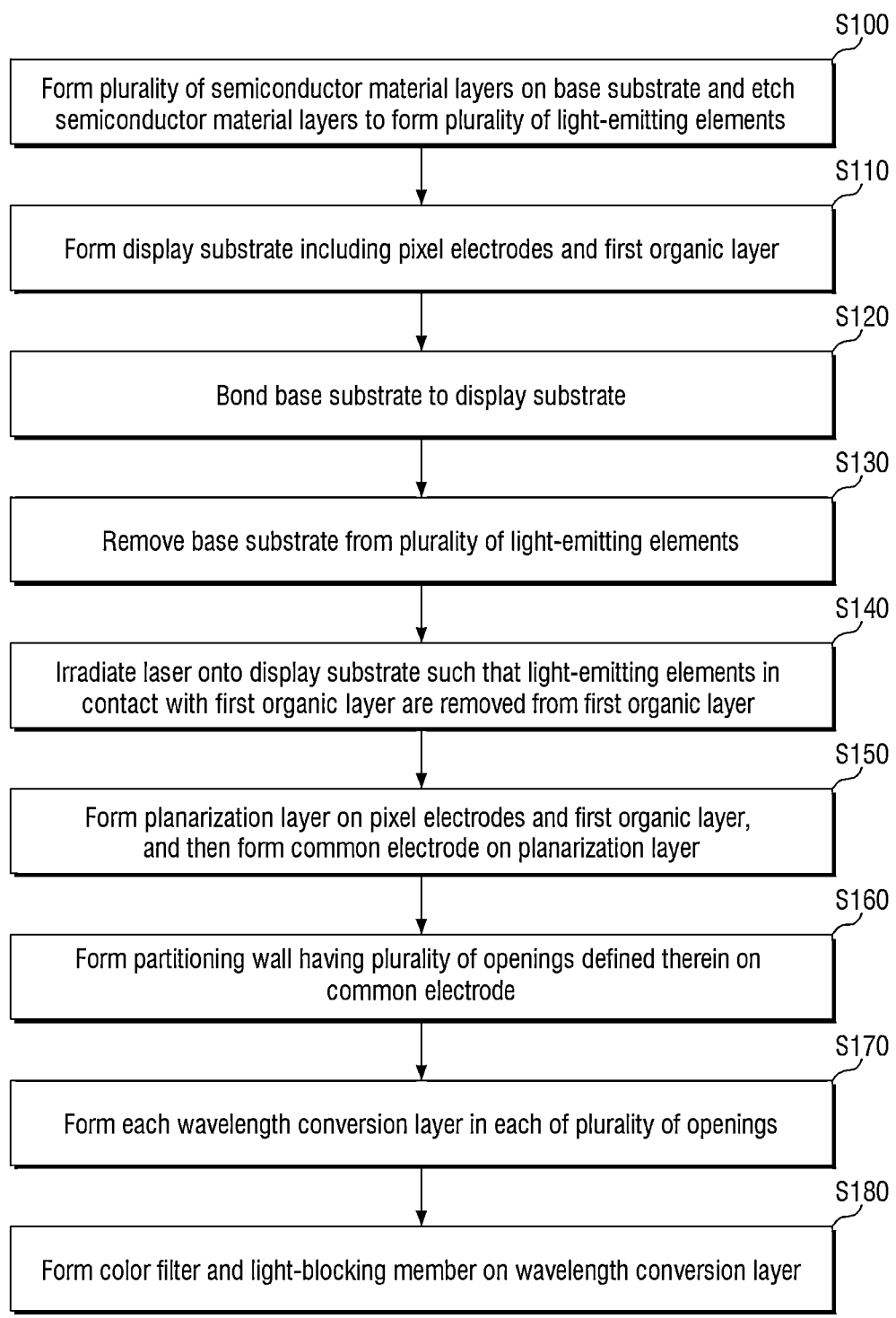
FIG. 20 is a flowchart showing an embodiment of a manufacturing method of a display device.

FIG. 20 is a flowchart showing an embodiment of the manufacturing method of a display device. FIG. 21 to FIG. 29 are cross-sectional views for illustrating an embodiment of the manufacturing method of the display device.

FIG. 21 to FIG. 29 are cross-sectional views of structures according to a formation order of the layers of the display device 10, respectively. FIG. 21 to FIG. 29 mainly show a manufacturing process of the light-emitter LEP and the wavelength converter 200. FIG. 21 to FIG. 29 may correspond to the cross-sectional view of FIG. 5. Further, in following descriptions, the first light-emitting area EA1 of the display device 10 is mainly mentioned. In the following descriptions, the manufacturing method of the display device as shown in FIG. 21 to FIG. 29 will be described in conjunction with FIG. 20.

Figure 21:
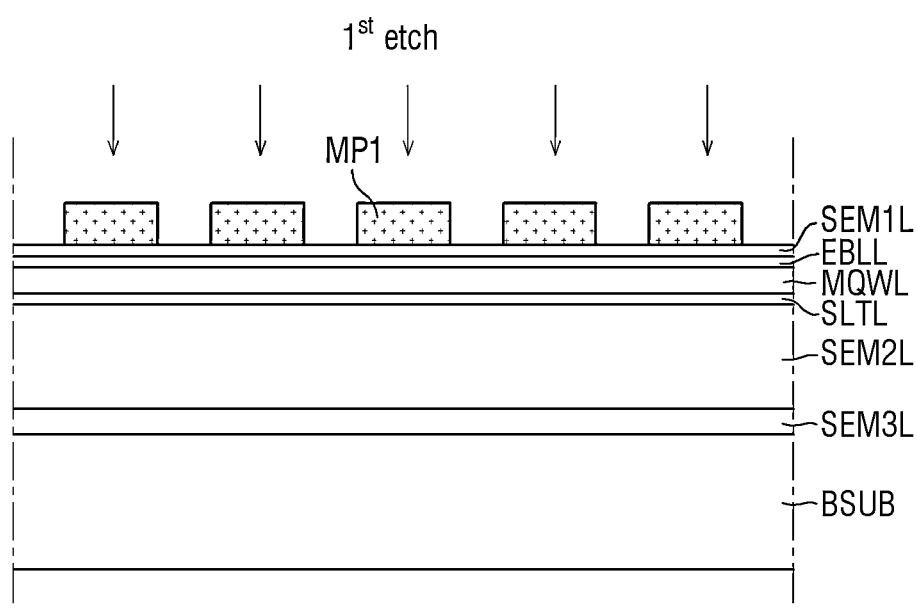
FIG. 21 to FIG. 29 are cross-sectional views for illustrating an embodiment of a manufacturing method of a display device.

Referring to FIG. 21, a plurality of semiconductor material layers SEM3L, SEM2L, SLTL, MQML, EBLL, and SEM1L is formed or disposed on the base substrate BSUB, and then the plurality of light-emitting elements LE is formed or provided (S100 in FIG. 20).

First, the base substrate BSUB is provided. The base substrate BSUB may be a sapphire substrate ($Al_2O_3$) or a silicon wafer including silicon. However, the invention is not limited thereto. In an embodiment, a case where the base substrate BSUB is embodied as the sapphire substrate will be described by way of example.

The plurality of semiconductor material layers SEM3L, SEM2L, SLTL, MQML, EBLL, and SEM1L is formed or disposed on the base substrate BSUB. The plurality of semiconductor material layers may be grown using an epitaxial method and may be formed or provided by growing a seed crystal. In this connection, each of the semiconductor material layers may be formed or provided using electron beam deposition, physical vapor deposition ("PVD"), chemical vapor deposition ("CVD"), plasma laser deposition ("PLD"), dual-type thermal evaporation, sputtering, metal organic chemical vapor deposition ("MOCVD"), etc. Preferably, the metal-organic chemical vapor deposition ("MOCVD") may be employed. However, the invention is not limited thereto.

A precursor material for forming the plurality of semiconductor material layers may not be particularly limited and may include materials used conventionally for forming a target material. In one example, the precursor material may be a metal precursor including an alkyl group such as a methyl group or an ethyl group. In an embodiment, the precursor material may be a compound such as trimethyl gallium ($Ga(CH_3)_3$), trimethyl aluminum ($Al(CH_3)_3$), triethyl phosphate ($(C_2H_5)_3PO_4$), for example. However, the invention is not limited thereto.

Specifically, the third semiconductor material layer SEM3L is formed or disposed on the base substrate BSUB. Although the drawing shows that one third semiconductor material layer SEM3L is stacked, the invention is not limited thereto. A plurality of third semiconductor material layers SEM3L may be formed or provided. The third semiconductor material layer SEM3L may be disposed to reduce a difference between lattice constants of the second semiconductor material layer SEM2L and the base substrate BSUB. In one example, the third semiconductor material layer SEM3L may include a semiconductor material which is undoped with an n-type or p-type dopant. In an embodiment, the third semiconductor material layer SEM3L may include at least one of InAlGaN, GaN, AlGaN, InGaN, AlN and InN as undoped. However, the invention is not limited thereto.

Using the above-described method, a second semiconductor material layer SEM2L, a superlattice material layer SLTL, an active material layer MQWL, an electron blocking material layer EBLL, and a first semiconductor material layer SEM1L are sequentially formed or disposed on the third semiconductor material layer SEM3L.

Subsequently, the plurality of semiconductor material layers SEM2L, SLTL, MQML, EBLL, and SEM1L is etched to form the plurality of light-emitting elements LE.

Specifically, a plurality of first mask patterns MP1 is formed or disposed on the first semiconductor material layer SEM1L. Each of the first mask pattern MP1 may be embodied as a hard mask including an inorganic material or a photoresist mask including an organic material. The first mask pattern MP1 may prevent a portion of each of the plurality of semiconductor material layers SEM2L, SLTL, MQML, EBLL, and SEM1L beneath each of the first mask patterns MP1 from being etched away. Using the plurality of first mask patterns MP1 as masks, a portion of each of the plurality of semiconductor material layers is etched (first etch) to form the plurality of light-emitting elements LE.

Figure 22:
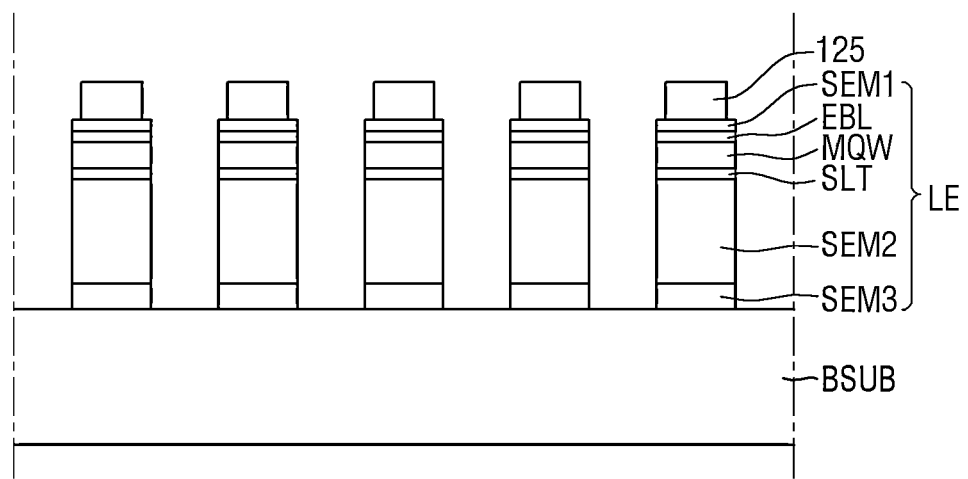

Referring to FIG. 22, the portion of each of the plurality of semiconductor material layers SEM3L, SEM2L, SLTL, MQML, EBLL, and SEM1L that does not overlap with the first mask pattern MP1 may be etched and removed such that an unetched portion thereof overlapping with the first mask pattern MP1 may act as the plurality of light-emitting elements LE.

The semiconductor material layers may be etched using a conventional method. In an embodiment, a process of etching the semiconductor material layers may include dry etching, wet etching, reactive ion etching ("RIE"), deep reactive ion etching ("DRIE"), inductively coupled plasma reactive ion etching ("ICP-RIE"), etc., for example. The dry etching may realize anisotropic etching and thus may be suitable for vertical etching. When the above-described etching method is used, an etchant may be $Cl_2$ or $O_2$. However, the invention is not limited thereto.

The portion of each of the plurality of semiconductor material layers SEM3L, SEM2L, SLTL, MQML, EBLL, and SEM1L overlapping the first mask pattern MP1 may not be etched but may constitute each of the plurality of light-emitting elements LE. Accordingly, each of the plurality of light-emitting elements LE may be formed or provided to include the third semiconductor layer SEM3, the second semiconductor layer SEM2, the superlattice layer SLT, the active layer MQW, the electron blocking layer EBL, and the first semiconductor layer SEM1.

Then, a connection electrode material layer is deposited on the base substrate BSUB and is etched. Thus, the connection electrodes 125 are respectively formed or disposed on the plurality of light-emitting elements LE. The connection electrode 125 may be formed or disposed directly on a top face of the first semiconductor layer SEM1 of the light-emitting element LE. The connection electrode 125 may include a transparent conductive material. In an embodiment, the connection electrode 125 may include a transparent conductive oxide ("TCO") such as indium tin oxide ("ITO") or indium zinc oxide ("IZO"), for example.

Figure 23:
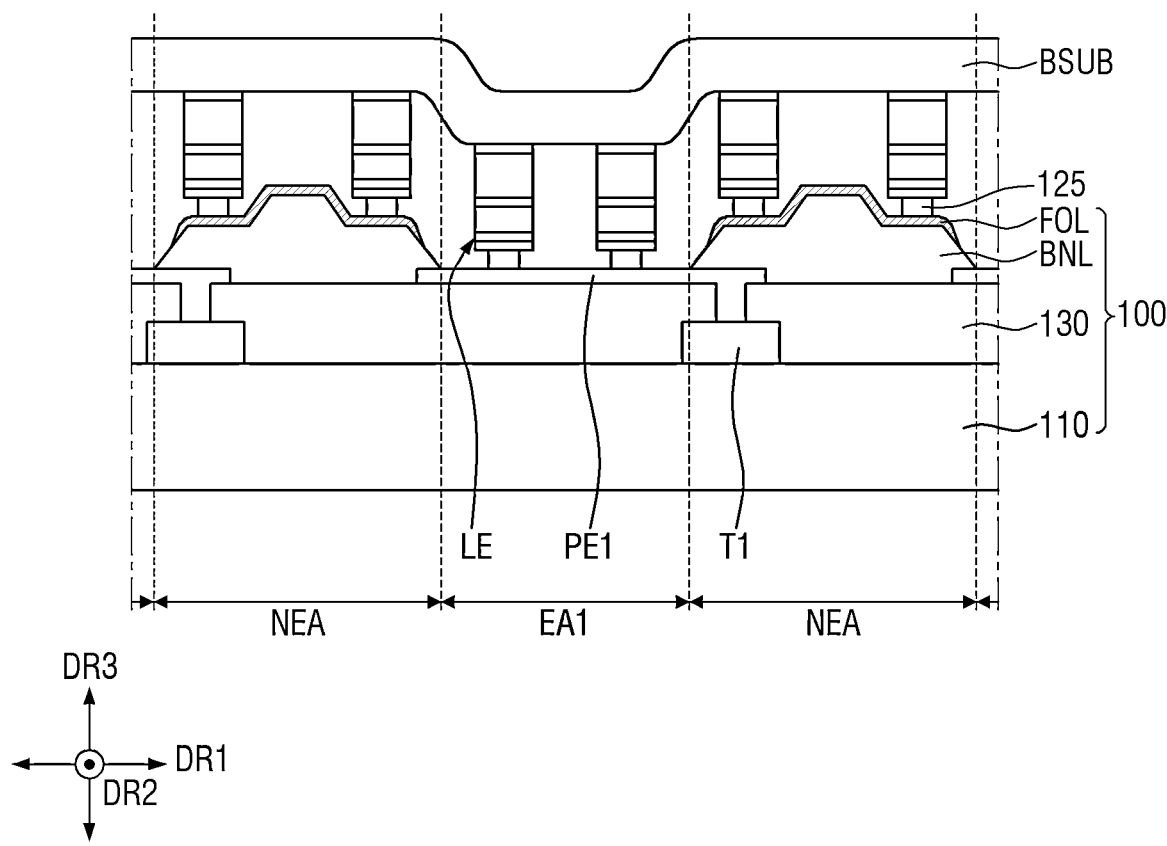

Referring to FIG. 23, the display substrate 100 including the first pixel electrode PE1 and the first organic layer FOL is formed or provided (S110 in FIG. 20).

The first switching element T1 is formed or disposed on the first substrate 110, and the insulating layer 130 is formed or disposed on the first switching element T1. The first substrate 110 may be a transparent insulating substrate which may be a glass or quartz substrate. The first switching element T1 may include a plurality of TFTs and a capacitor. A contact hole exposing the first switching element T1 may be defined in the insulating layer 130.

Subsequently, a transparent conductive material is deposited on the insulating layer 130 and patterned to form a plurality of pixel electrodes, for example, the first pixel electrode PE1. The first pixel electrode PE1 may be connected to the first switching element T1 via the contact hole defined in the insulating layer 130. Then, a first organic material is applied on the first substrate 110 and is patterned to form the bank BNL. The first opening which exposes the underlying first pixel electrode PE1 and defines the first light-emitting area EA1 is defined in the bank BNL.

Subsequently, a second organic material is applied on the first substrate 110 and is patterned to form the first organic layer FOL. The first organic layer FOL may be formed or disposed on the bank BNL and may be spaced apart from the first light-emitting area EA1. As described above, the first organic layer FOL may include a polyimide including the cyano group.

Subsequently, the base substrate BSUB is bonded to the display substrate 100 (S120 in FIG. 20).

Specifically, the base substrate BSUB is aligned with the first substrate 110. In this connection, the connection electrode 125 of the light-emitting element LE formed or disposed on the base substrate BSUB faces toward the first substrate 110.

Subsequently, the first substrate 110 and the base substrate BSUB are bonded to each other. Specifically, the connection electrode 125 of the light-emitting element LE formed or disposed on the base substrate BSUB is brought into contact with the first pixel electrode PE1 and the first organic layer FOL of the display substrate 100. Subsequently, the display substrate 100 and the base substrate BSUB are bonded to each other by melt-bonding the connection electrode 125 to each of the first pixel electrode PE1 and the first organic layer FOL at a predefined temperature. In this connection, the plurality of light-emitting elements LE is adhered to the top face of the first pixel electrode PE1 and to the top face of the first organic layer FOL. In particular, a layer of the connection electrode 125 contacting the first pixel electrode PE1 and a layer of the first pixel electrode PE1 contacting the connection electrode 125 include the same material, for example, ITO. Thus, adhesiveness therebetween may be excellent.

Subsequently, the base substrate BSUB is removed from the plurality of light-emitting elements LE (S130 in FIG. 20).

Figure 24:
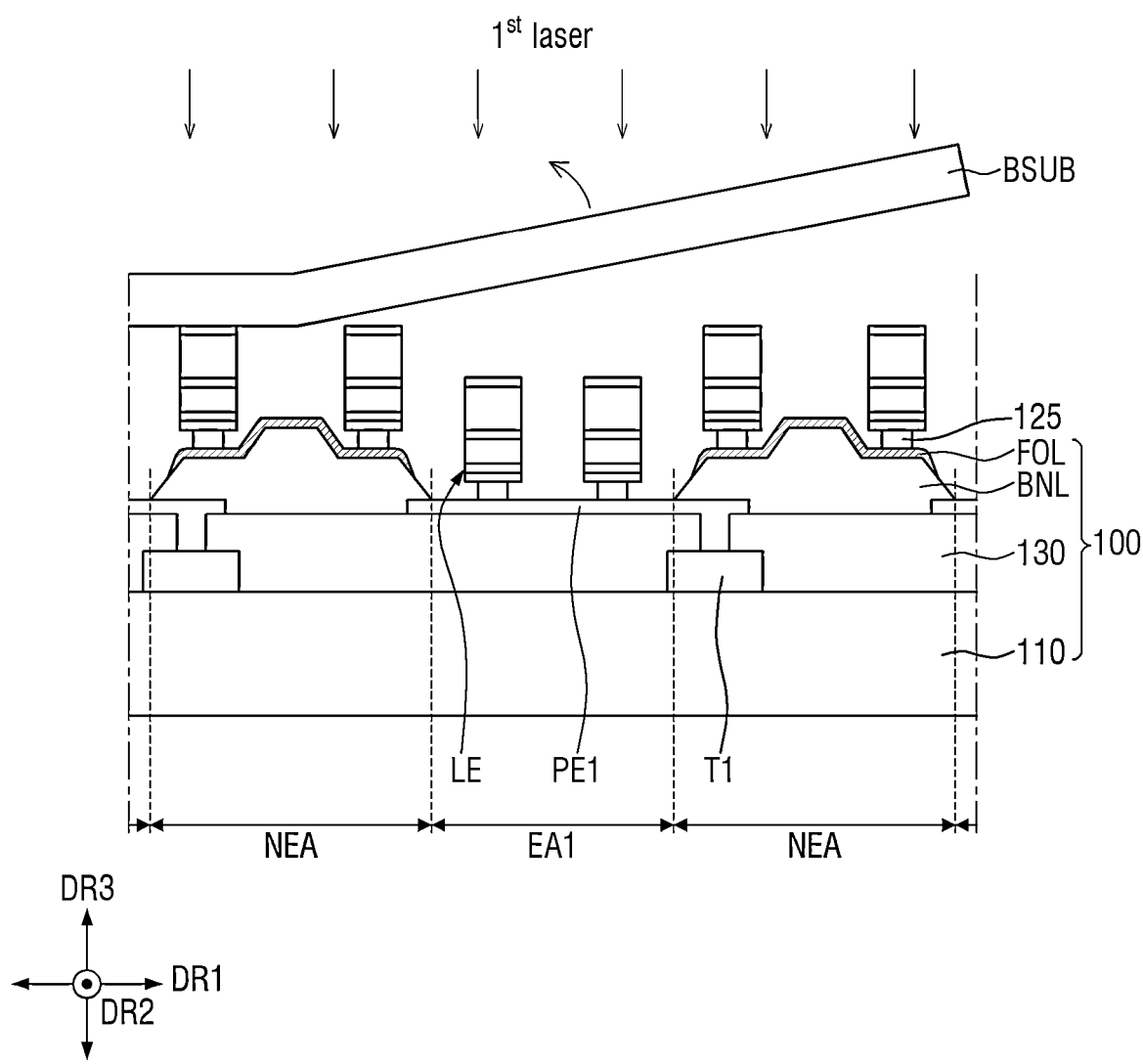

Referring to FIG. 24, the base substrate BSUB is removed from the third semiconductor layer SEM3 of the light-emitting element LE. A process of removing the base substrate BSUB may include a laser lift off ("LLO") process. The laser lift-off process may use first laser $1^{st}$ laser. KrF excimer laser (248 nm wavelength) may be used as a source of the first laser. The excimer laser may be irradiated at an energy density of the excimer laser in a range of about 550 millijoule per square centimeter ($mJ/cm^2$) to about 950 $mJ/cm^2$. An incident area thereof may be in a range of 50×50 square micrometer ($\mu m^2$) to 1×1 square centimeter ($cm^2$). However, the invention is not limited thereto.

Subsequently, further laser is irradiated onto the display substrate 100 such that the light-emitting elements LE in contact with the first organic layer FOL are removed from the first organic layer FOL (S140 in FIG. 20).

Figure 25:
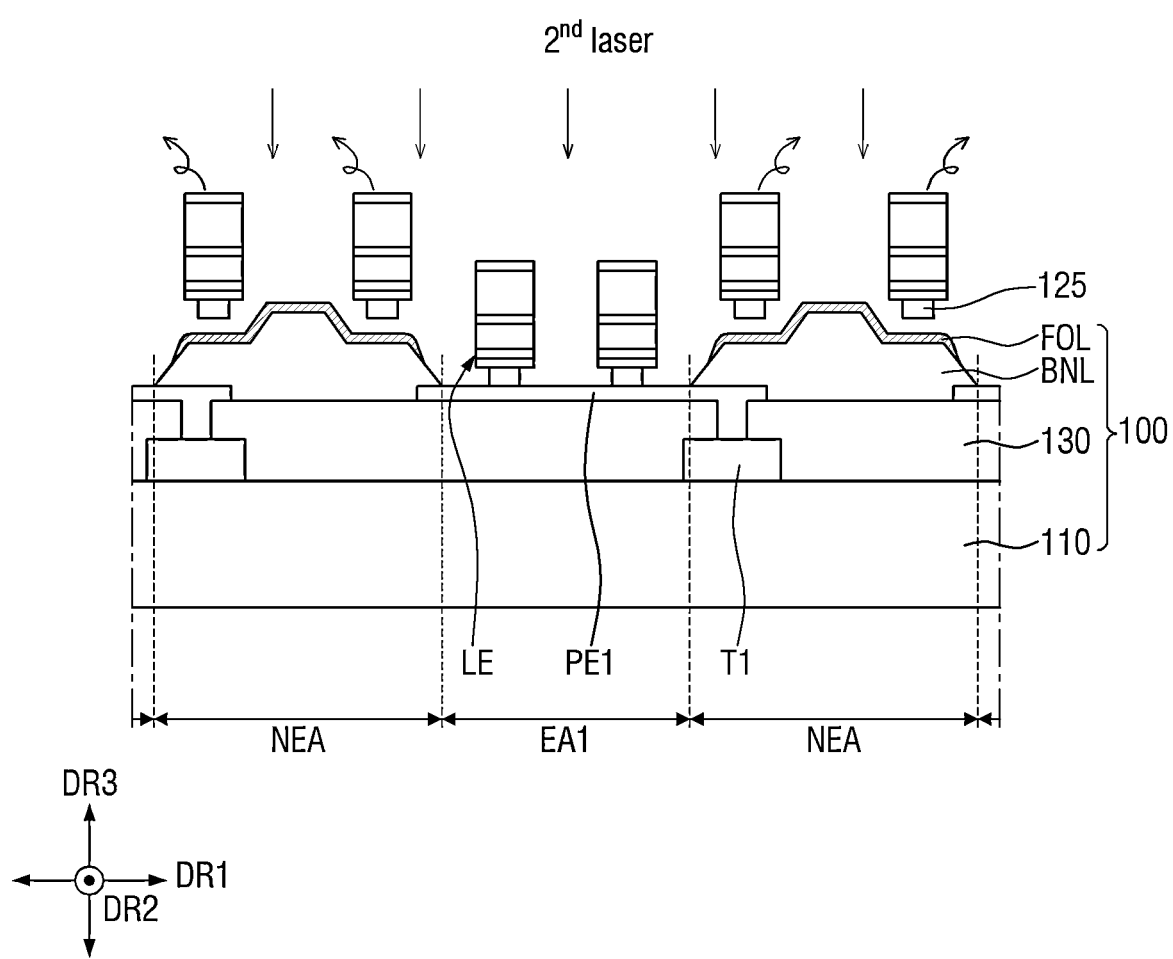

Referring to FIG. 25, second laser 2nd laser is irradiated onto the display substrate 100 on which the plurality of light-emitting elements LE is formed or provided. XeCl excimer laser (308 nm wavelength) may be used as a source of the second layer. The second laser may be irradiated under the same condition as mentioned above with reference to the first laser. However, the invention is not limited thereto.

When the second laser is irradiated to the first organic layer FOL, the first organic layer FOL absorbs energy and thus a temperature thereof instantaneously increases. Thus, the first organic layer FOL is ablated. Accordingly, the plurality of light-emitting elements LE bonded to the surface of the first organic layer FOL is removed or detached therefrom. That is, the plurality of light-emitting elements LE is detached from the first organic layer FOL by irradiating the second laser to the first organic layer FOL. At this time, the plurality of light-emitting elements LE disposed in the first light-emitting area EA1 is not detached from the first pixel electrode PE1, while the plurality of light-emitting elements LE disposed in the non-light-emitting area NEA are detached and removed from the first organic layer FOL.

Subsequently, the planarization layer PLL is formed or disposed on the pixel electrode (e.g., PE1) and the first organic layer FOL, and then the common electrode CE is formed or disposed on the planarization layer PLL (S150 in FIG. 20).

Figure 26:
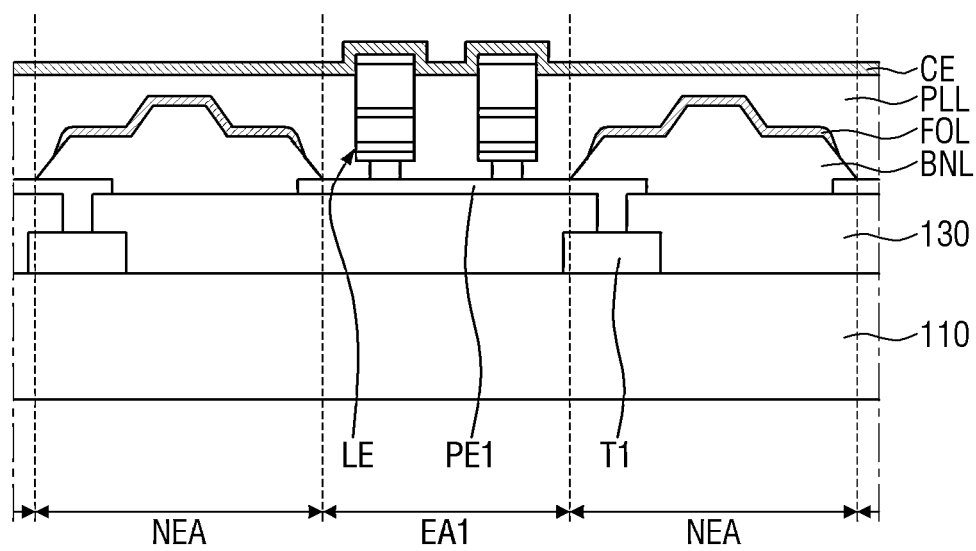

Referring to FIG. 26, the planarization layer PLL is formed or provided by applying a third organic material on the display substrate 100. The planarization layer PLL has a thickness smaller than a vertical dimension of the light-emitting element LE so that a portion of the second semiconductor layer SEM2 and the third semiconductor layer SEM3 of the light-emitting element LE are exposed.

Then, the common electrode CE is formed or provided by depositing a transparent conductive material on the planarization layer PLL. The common electrode CE covers the plurality of light-emitting elements LE and the planarization layer PLL. The common electrode CE contacts the exposed third semiconductor layer SEM3 and an exposed portion of the second semiconductor layer SEM2 of the light-emitting element LE protruding beyond the planarization layer PLL.

Subsequently, the partitioning wall PW in which the plurality of openings OP1 is defined is formed or disposed on the common electrode CE (S160 in FIG. 20).

Figure 27:
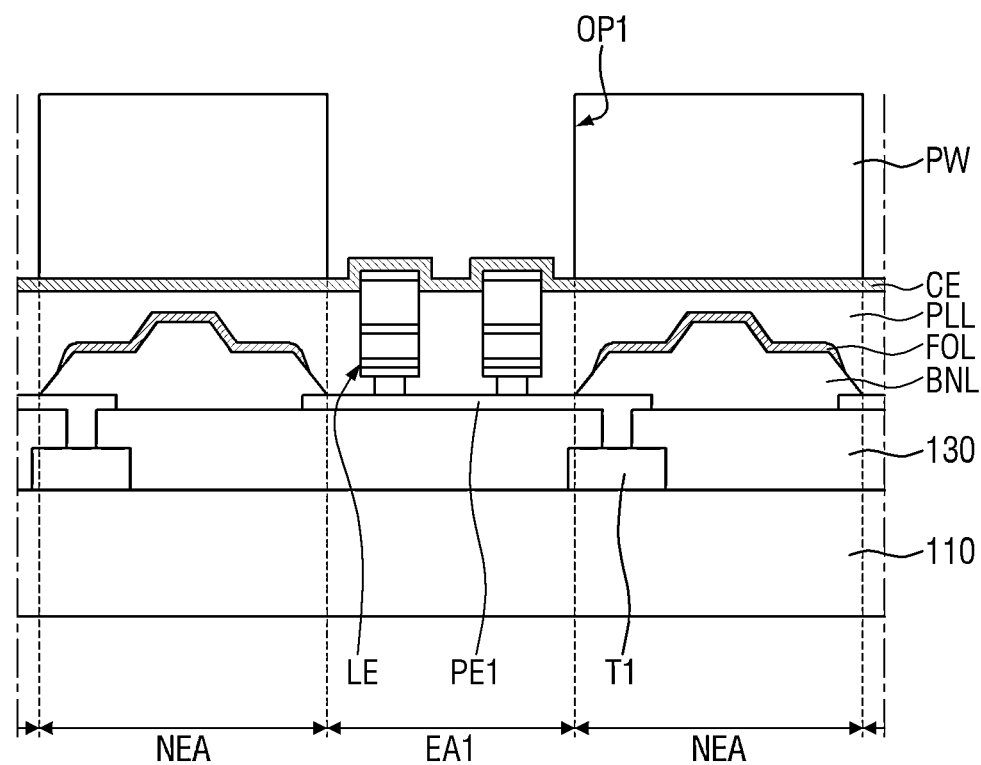

Referring to FIG. 27, a fourth organic material is applied on the display substrate 100 including the common electrode CE and is patterned to form the partitioning wall PW.

The plurality of openings is defined in a corresponding manner to the plurality of light-emitting areas. In an embodiment, the first opening OP1 is defined in a corresponding manner to the first light-emitting area EA1. Although not shown, other openings are also defined in a corresponding manner to other light-emitting areas, for example.

Then, each wavelength conversion layer QDL is formed or provided in each of the plurality of openings OP1 (S170 in FIG. 20).

Figure 28:
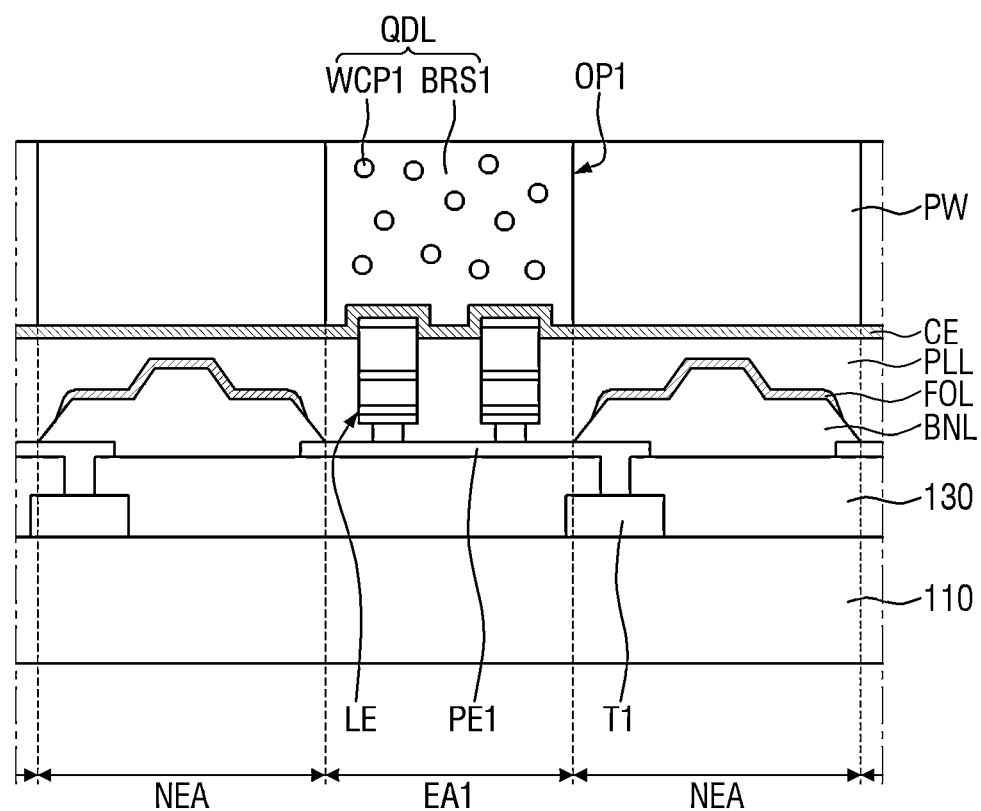
Figure 28:
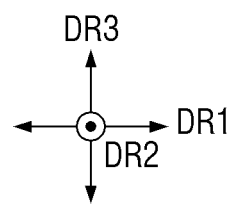

Referring to FIG. 28, the wavelength conversion layer QDL may fill the first opening OP1. The wavelength conversion layer QDL may be formed or provided using a solution process such as inkjet printing, imprinting, etc., but may not be limited thereto. Each wavelength conversion layer QDL may be formed or provided in each of the plurality of openings and may overlap each of the plurality of light-emitting areas. Referring to FIG. 28, each wavelength conversion layer QDL is formed or provided in the first opening OP1 and overlaps the first light-emitting area EA1.

Subsequently, the color filter CF1 and the light-blocking member BK are formed or disposed on the wavelength conversion layer QDL (S180 in FIG. 20).

Figure 29:
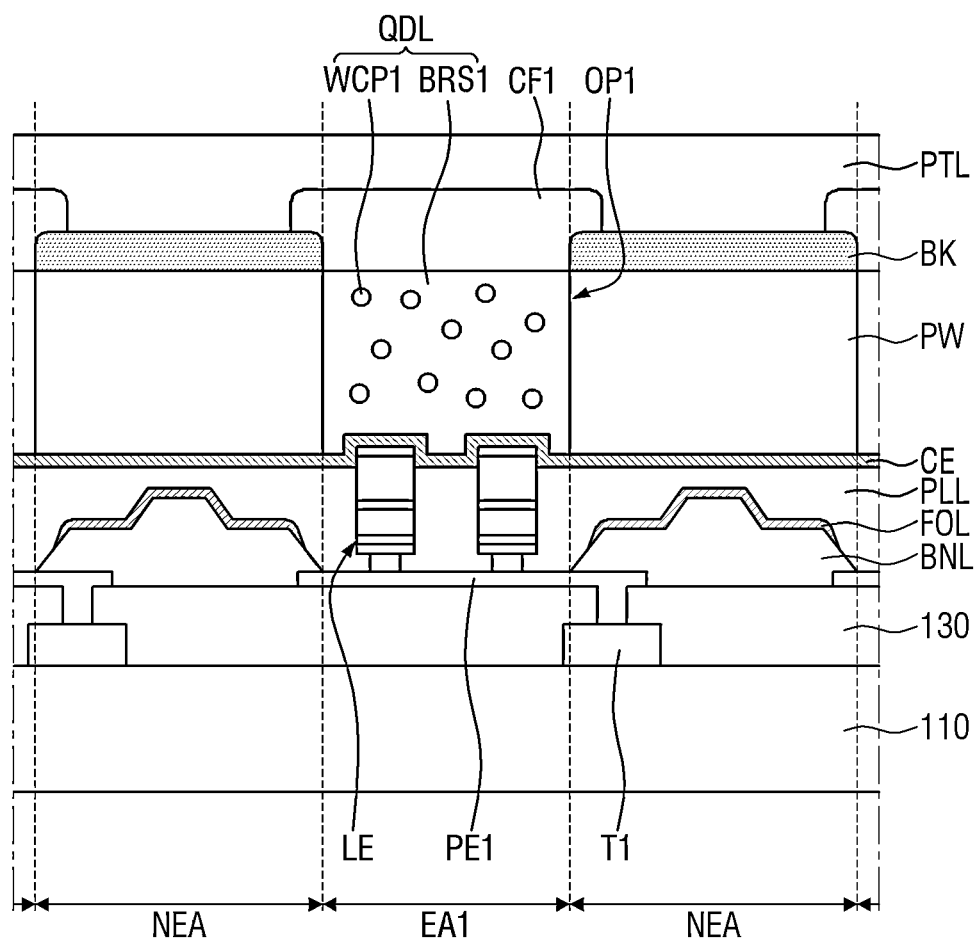

Referring to FIG. 29, the light-blocking member BK is formed or disposed on the partitioning wall PW. The light-blocking member BK is formed or provided by applying a light-blocking material and patterning the same. The light-blocking member BK overlaps the non-light-emitting area NEA and does not overlap the light-emitting area EA1.

Then, the color filter CF1 is formed or disposed on the wavelength conversion layer QDL defined by the light-blocking member BK. The color filter CF1 may be formed or provided using a photo process. A thickness of the color filter CF1 may be smaller than 1 μm, but may not be limited thereto.

Specifically, a first color filter material layer is applied on the partitioning wall PW and the wavelength conversion layer QDL and then is patterned using a photo process to form the first color filter CF1 overlapping the first opening OP1. In a similar manner, other color filters may be formed or provided so as to respectively overlap other openings using a patterning process.

Then, the protective layer PTL is formed or disposed on the light-blocking member BK and the color filter CF1. In this way, the display device 10 in an embodiment is manufactured.

As described with reference to FIG. 21 to FIG. 29, in the manufacturing process of the display device 10 in an embodiment, the light-emitting elements LE formed or provided in the non-light-emitting area NEA may be removed from the first organic layer FOL by irradiating the laser to the first organic layer FOL. Thus, a short circuit that may occur due to the light-emitting element LE formed or provided in the non-light-emitting area NEA may be prevented.

FIG. 30 to FIG. 42 are cross-sectional views showing another embodiment of a manufacturing process of a display device.

Referring to FIG. 30 to FIG. 42, this embodiment is different from the embodiment of FIG. 20 to FIG. 29 as described above in that each of a plurality of films is attached onto the plurality of light-emitting elements LE formed or disposed on the base substrate BSUB and then is stretched and then is removed from the plurality of light-emitting elements LE such that the light-emitting elements LE are attached to the display substrate 100. Processes different from those of the above embodiment will be described, and descriptions of remaining processes will be omitted because they are the same as those in FIG. 20 to FIG. 29.

Figure 30:
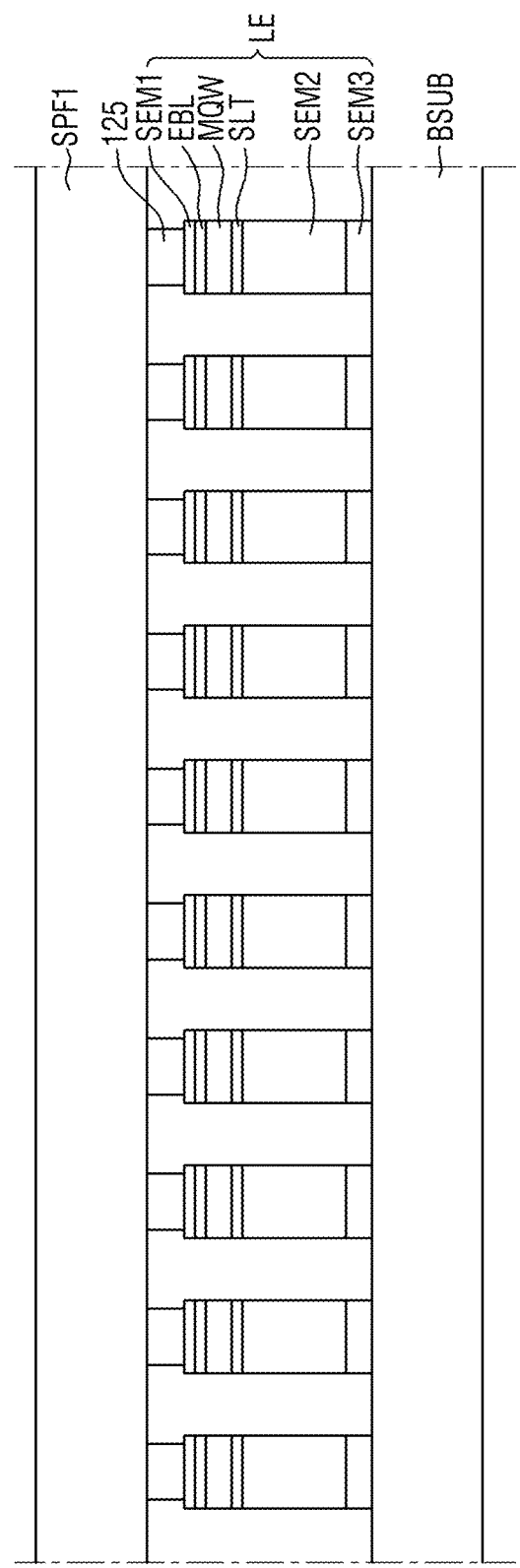
FIG. 30 to FIG. 42 are cross-sectional views showing another embodiment of a manufacturing process of a display panel.

Referring to FIG. 30, a first support film SPF1 is attached onto the plurality of light-emitting elements LE of the base substrate BSUB manufactured with reference to FIG. 22.

Specifically, the first support film SPF1 is attached onto the plurality of light-emitting elements LE. The first support film SPF1 may be aligned with the plurality of light-emitting elements LE and may be attached to each of the connection electrodes 125 of the plurality of light-emitting elements LE. The number of the plurality of light-emitting elements LE may be large so that the plurality of light-emitting elements LE may not be detached from the first support film SPF1.

The first support film SPF1 may consist of a support layer and an adhesive layer disposed on the support layer. The support layer may include a material that is transparent to allow light to pass therethrough and has mechanical stability. In an embodiment, the support layer may include a transparent polymer such as polyester, polyacrylic, polyepoxy, polyethylene, polystyrene, polyethylene terephthalate, or the like, for example. The adhesive layer may include an adhesive material for bonding the support layer to the light-emitting element LE. In an embodiment, the adhesive material may include urethane acrylate, epoxy acrylate, and polyester acrylate, or the like, for example. The adhesive material may have an adhesive strength varying as ultraviolet ("UV") or heat is applied thereto. Accordingly, the adhesive layer may be easily removed from the light-emitting element LE.

Figure 31:
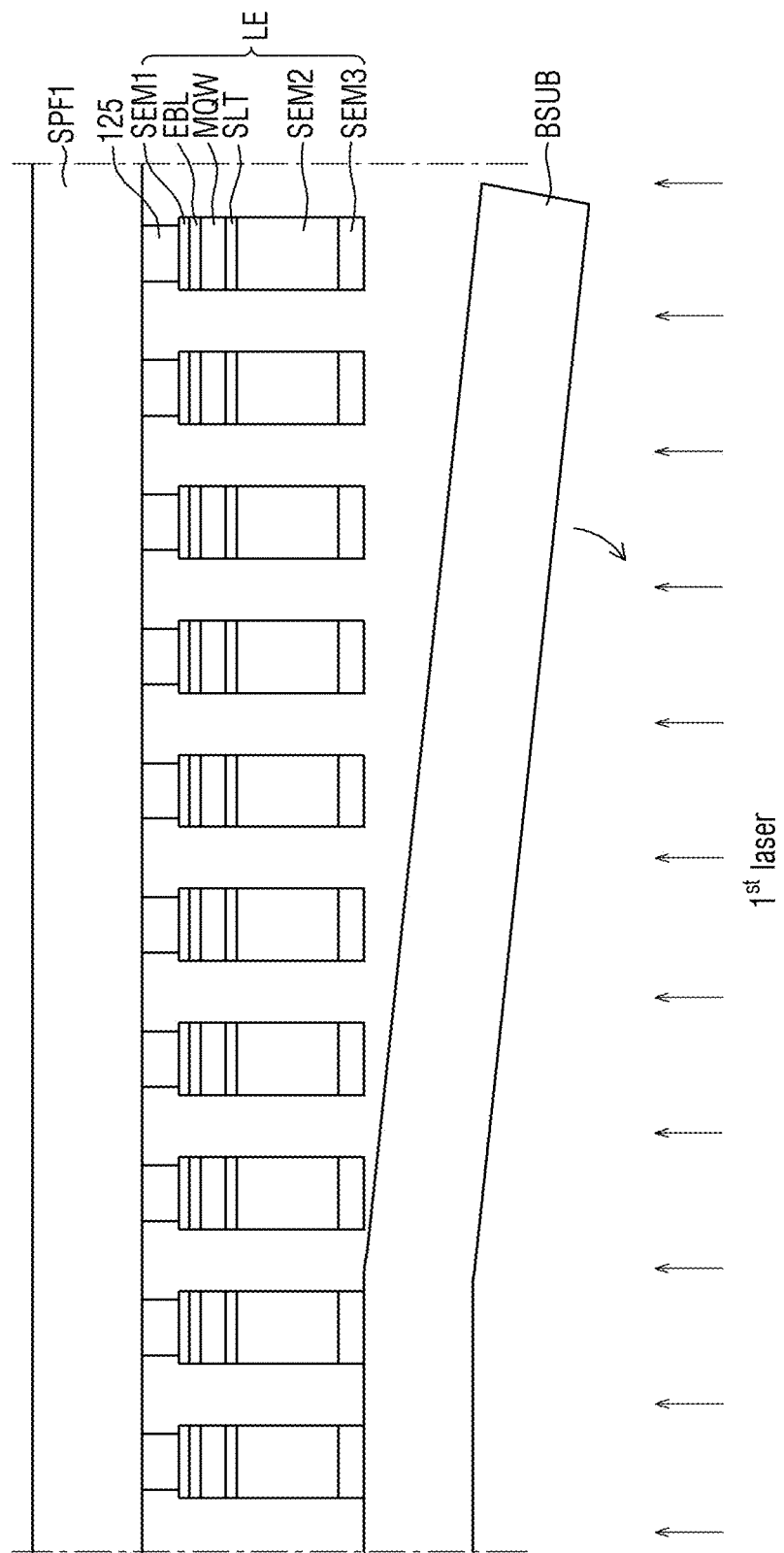

Then, referring to FIG. 31, the base substrate BSUB is removed from the light-emitting elements LE by irradiating first laser $1^{st}$ laser to the base substrate BSUB. The base substrate BSUB is removed from the third semiconductor layer SEM3 of each of the plurality of light-emitting elements LE. The removal process of the base substrate BSUB has been described above, and thus the description thereof is omitted.

Figure 32:
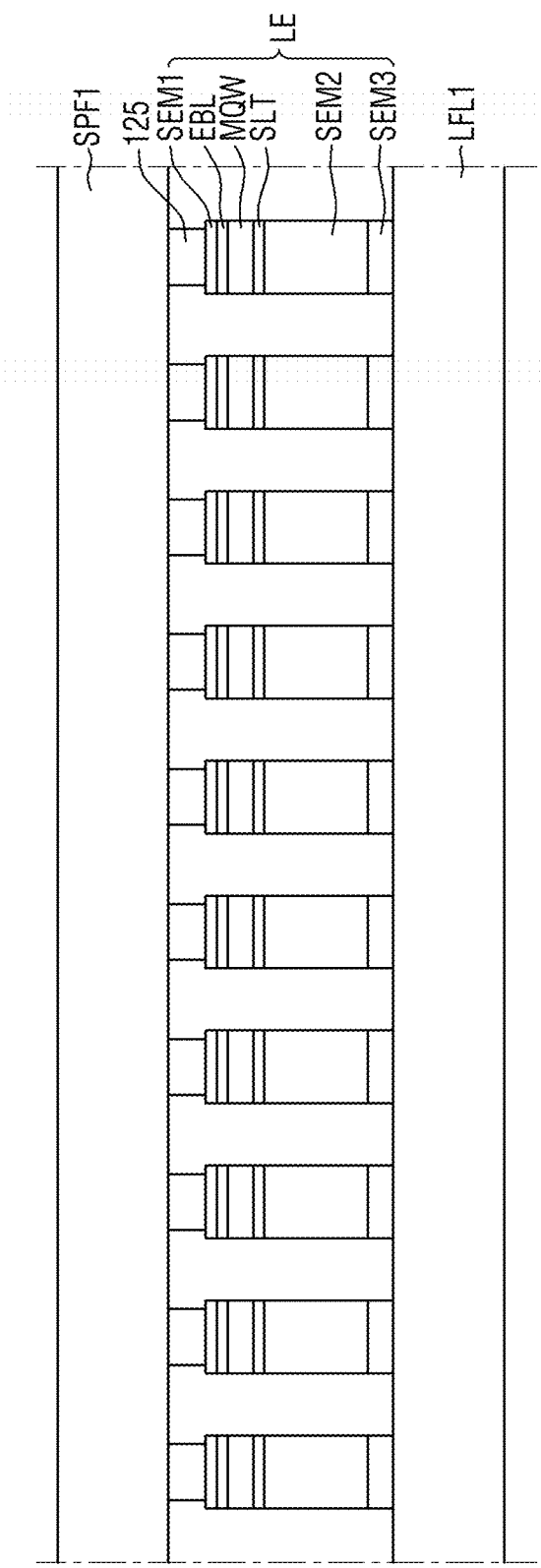

Subsequently, referring to FIG. 32, a first transfer film LFL1 is attached to the plurality of light-emitting elements LE from which the base substrate BSUB is removed.

Specifically, the first transfer film LFL1 is attached on the third semiconductor layer SEM3 of each of the plurality of light-emitting elements LE. The first transfer film LFL1 may be aligned with the plurality of light-emitting elements LE, and may be attached to the third semiconductor layer SEM3 of each of the plurality of light-emitting elements LE.

The first transfer film LFL1 may include a stretchable material. The stretchable material may include, for example, polyolefine, polyvinyl chloride ("PVC"), elastomeric silicone, elastomeric polyurethane, elastomeric polyisoprene, or the like. The first transfer film LFL1 may include a support layer and an adhesive layer as in the above-described first support film SPF1. Thus, the first transfer film LFL1 may be adhered to and support the plurality of light-emitting elements LE.

Figure 33:
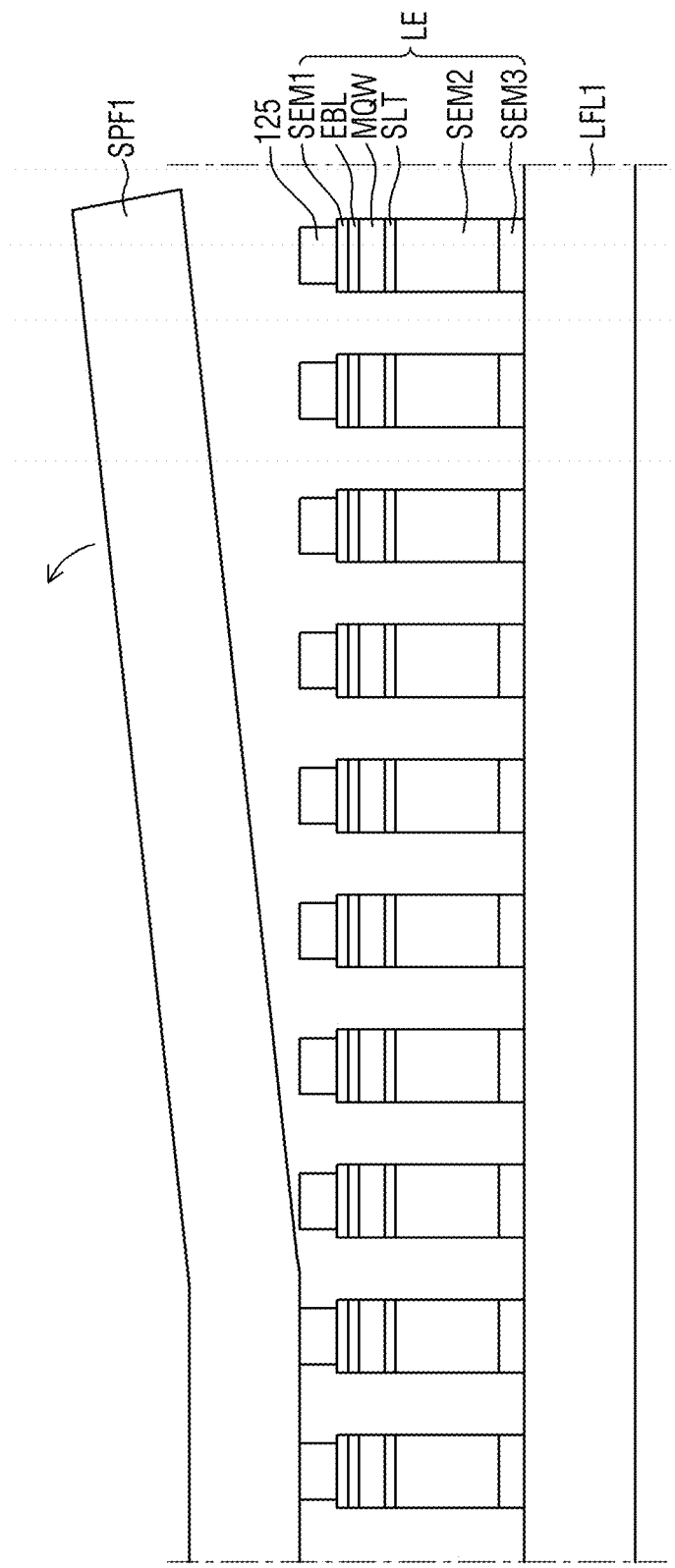
Figure 34:
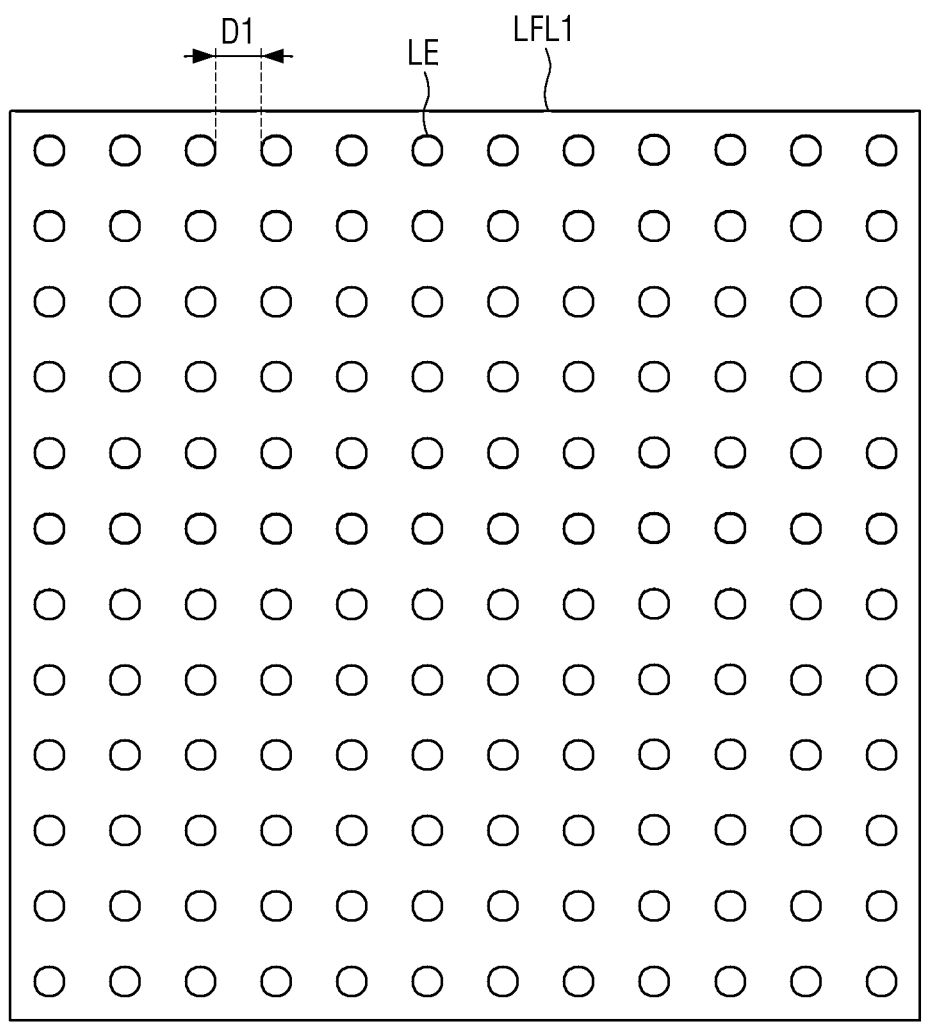

Then, referring to FIG. 33 and FIG. 34, the first support film SPF1 is removed from the plurality of light-emitting elements LE. The UV or heat may be applied to the first support film SPF1 to lower the adhesive strength of the adhesive layer of the first support film SPF1, and then the first support film SPF1 may be physically or naturally removed from the plurality of light-emitting elements LE. The plurality of light-emitting elements LE may be disposed on the first transfer film LFL1 and may be arranged in a dot array in which dots are spaced apart from each other by a predefined first spacing D1.

Figure 35:
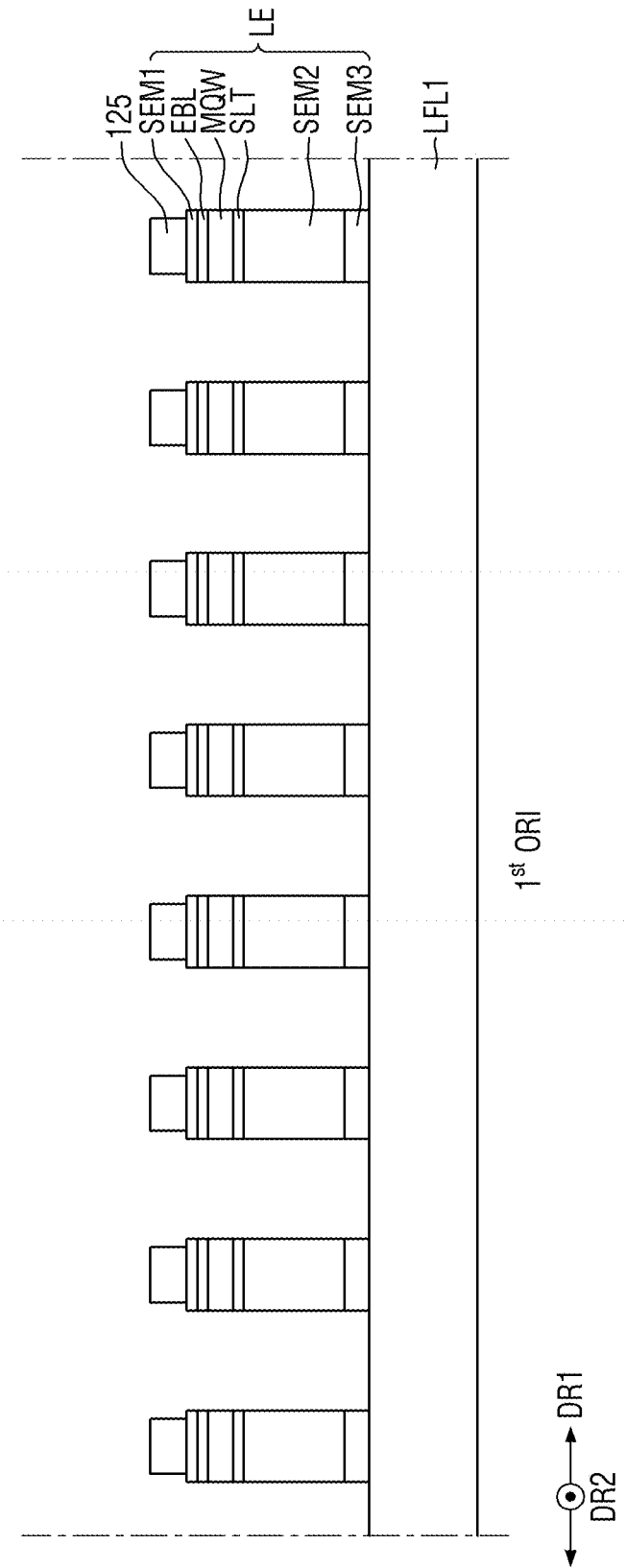
Figure 36:
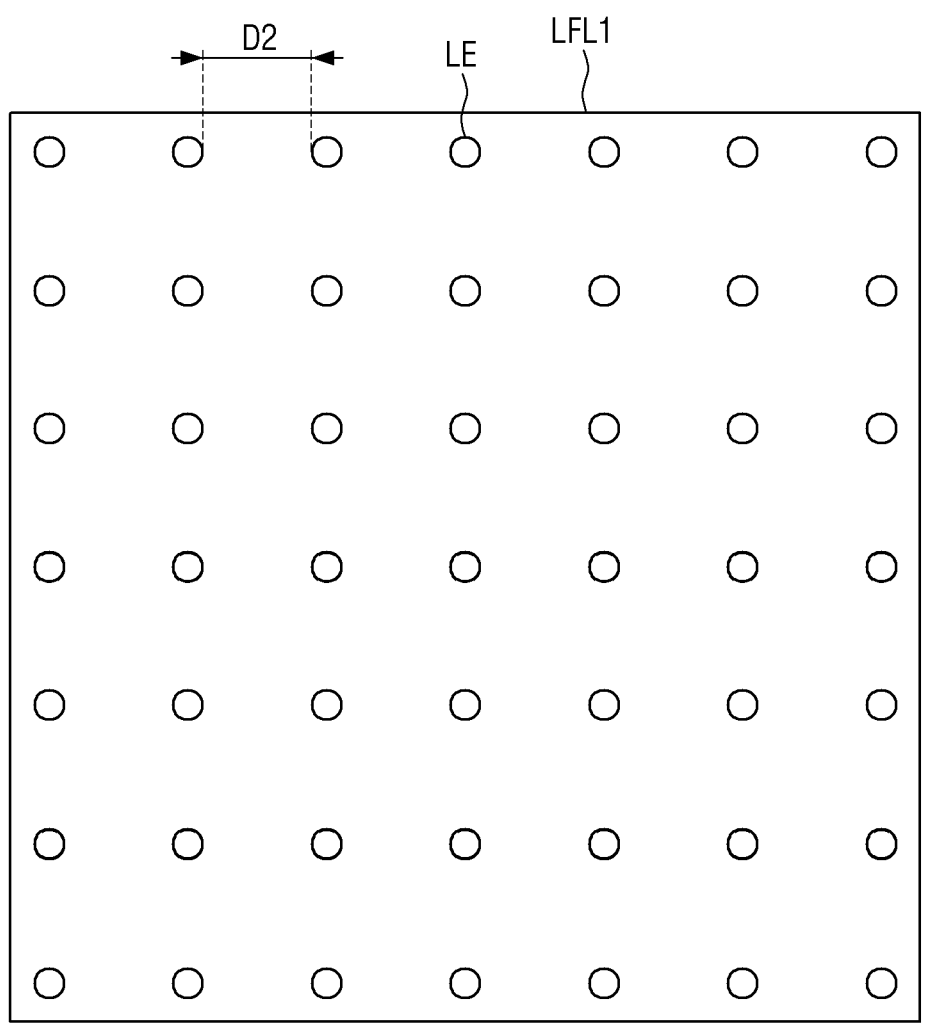

Subsequently, referring to FIG. 35 and FIG. 36, the first transfer film LFL1 is stretched ($1^{st}$ ORI). The first transfer film LFL1 may be stretched two-dimensionally, that is, along a plane including the first direction DR1 and the second direction DR2. As the first transfer film LFL1 is stretched, the plurality of light-emitting elements LE bonded onto the first transfer film LFL1 may be spaced apart from each other by a second spacing D2. The plurality of light-emitting elements LE may be uniformly spaced apart from each other by the second spacing D2 greater than the first spacing D1 as described above.

The stretching strength (or tensile strength) of the first transfer film LFL1 may be adjusted based on the target second spacing D2 between the light-emitting elements LE. In an embodiment, the stretching strength (or tensile strength) of the first transfer film LFL1 may be about 120 gf/inch, for example. However, the invention is not limited thereto. The stretching strength (or tensile strength) of the first transfer film LFL1 may be adjusted based on the target second spacing D2 between the light-emitting elements LE.

Figure 37:
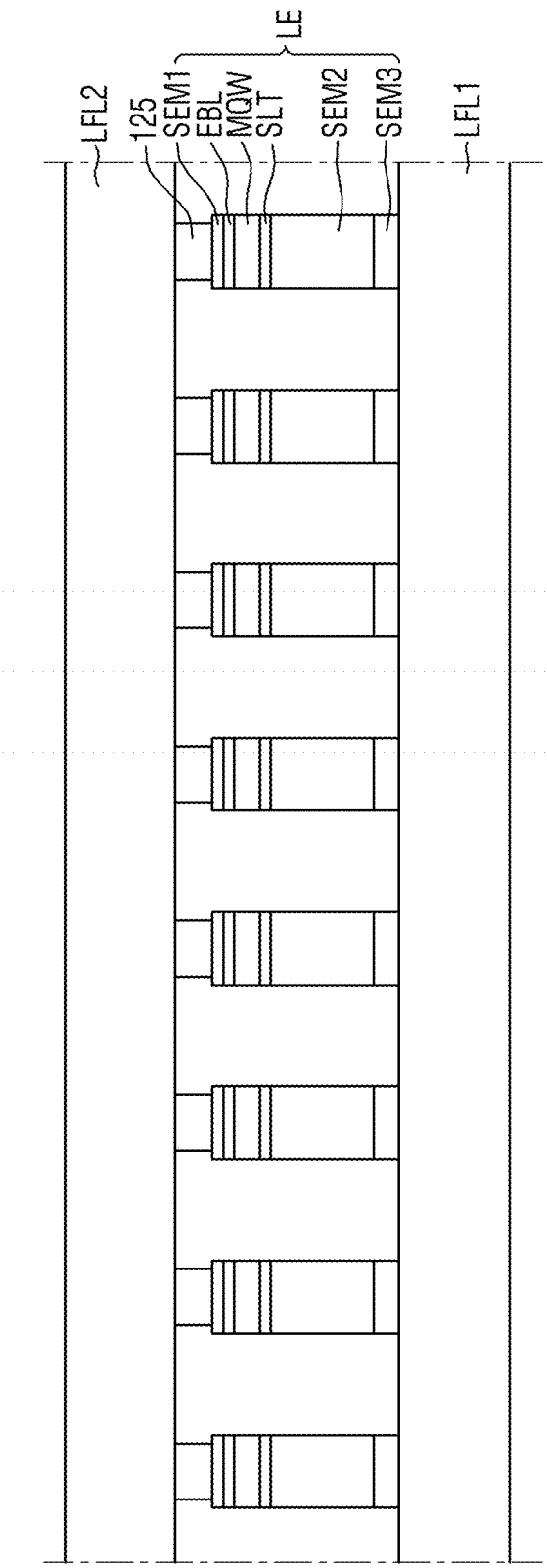

Then, referring to FIG. 37, a second transfer film LFL2 is attached onto the plurality of light-emitting elements LE from which the first support film SPF1 is removed. The second transfer film LFL2 may be aligned with the plurality of light-emitting elements LE and may be attached to the connection electrode 125 of each of the plurality of light-emitting elements LE. The second transfer film LFL2 may include a support layer and an adhesive layer as in the first transfer film LFL1 as described above. The detailed description thereof has been described above and thus is omitted.

Figure 38:
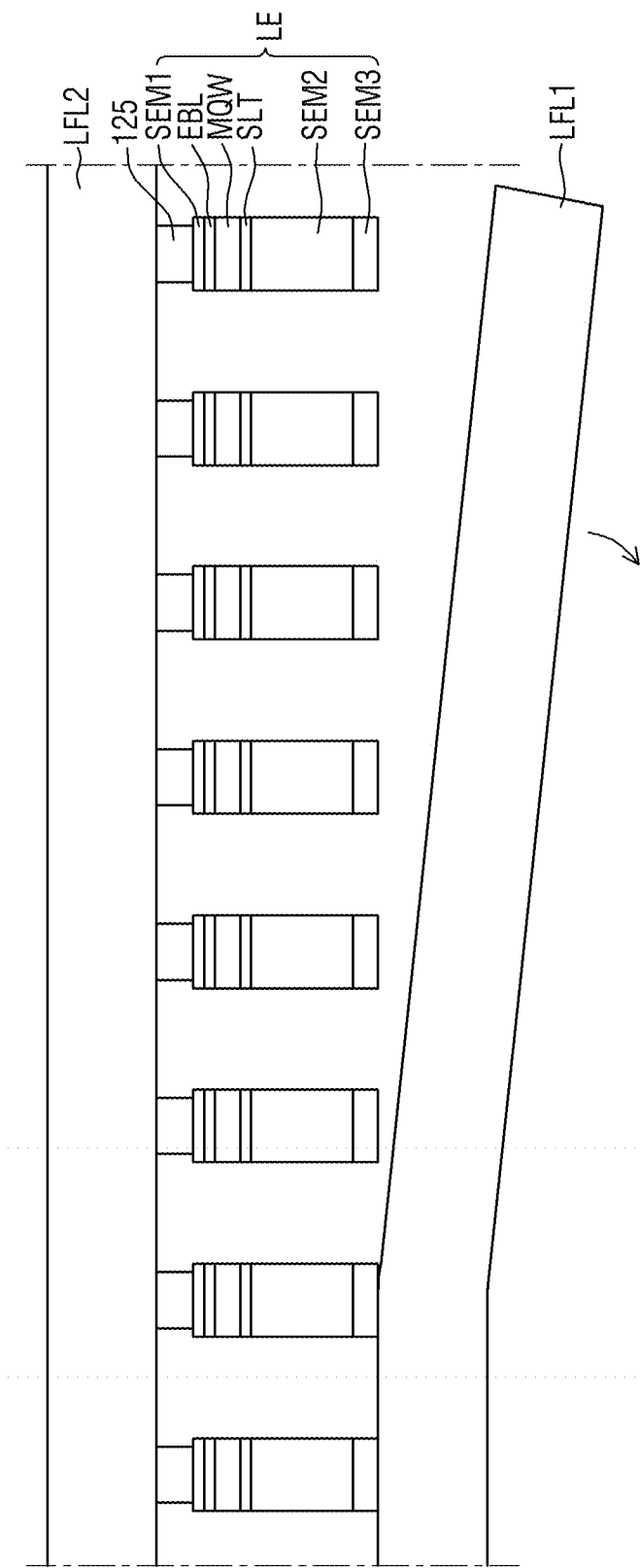

Subsequently, referring to FIG. 38, the first transfer film LFL1 is removed from the plurality of light-emitting elements LE. The UV or heat may be applied to the first transfer film LFL1 to reduce the adhesion of the adhesive layer of the first transfer film LFL1, and then the first transfer film LFL1 may be physically or naturally removed therefrom.

Figure 39:
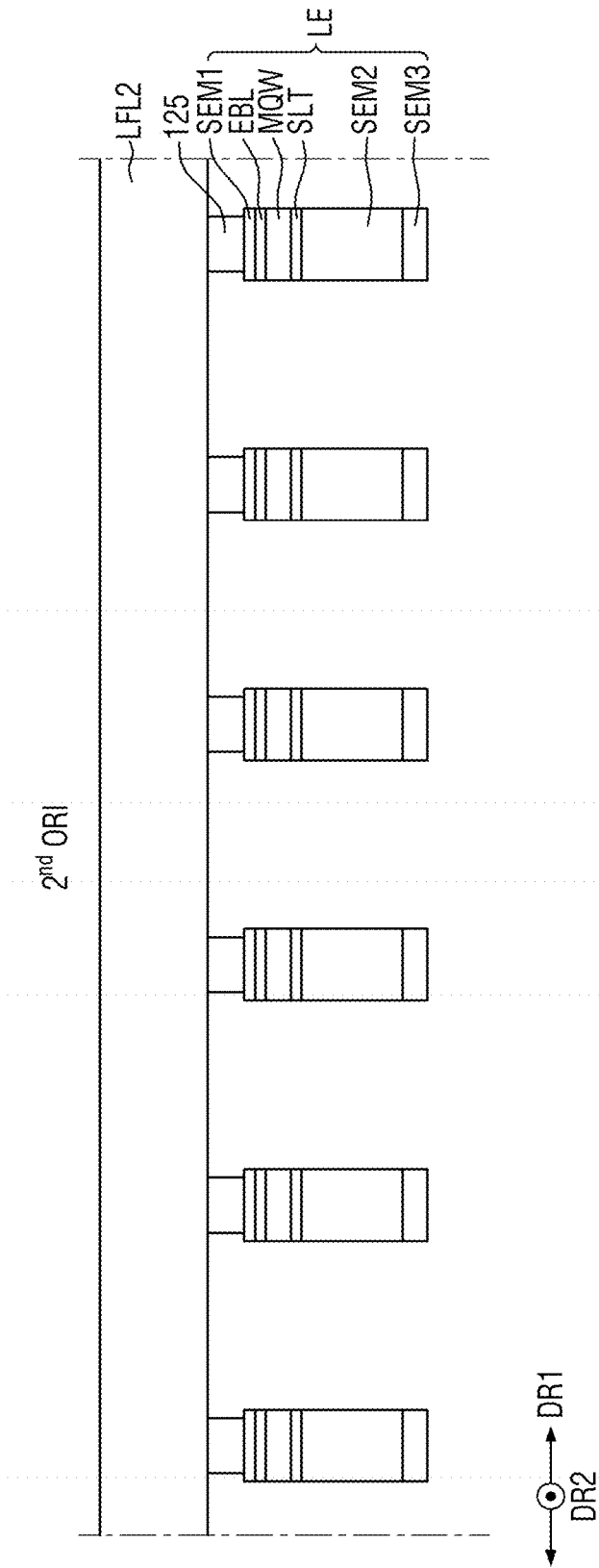
Figure 40:
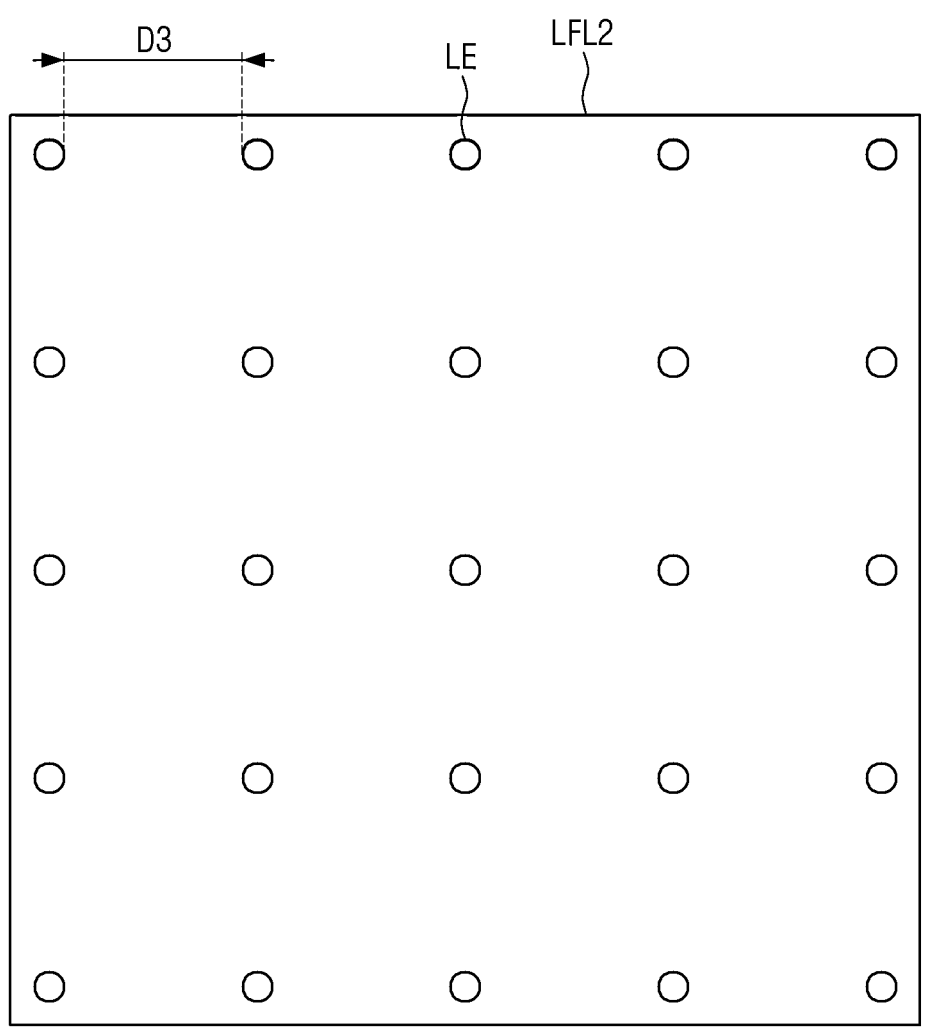

Then, referring to FIG. 39 and FIG. 40, the second transfer film LFL2 is stretched ($2^{nd}$ ORI). The second transfer film LFL2 may be stretched two-dimensionally, that is, along a plane including the first direction DR1 and the second direction DR2. As the second transfer film LFL2 is stretched, the plurality of light-emitting elements LE adhered to the second transfer film LFL2 may be spaced apart from each other by a third spacing D3. The plurality of light-emitting elements LE may be uniformly spaced apart from each other by the third spacing D3 greater than the second spacing D2 as described above.

The stretching strength (or tensile strength) of the second transfer film LFL2 may be adjusted based on the target third spacing D3 between the light-emitting elements LE. In an embodiment, the stretching strength (or tensile strength) of the second transfer film LFL2 may be about 270 gram-force per inch (gf/inch), for example. However, the invention is not limited thereto. The stretching strength (or tensile strength) of the second transfer film LFL2 may be adjusted based on the target third spacing D3 between the light-emitting elements LE.

Figure 41:
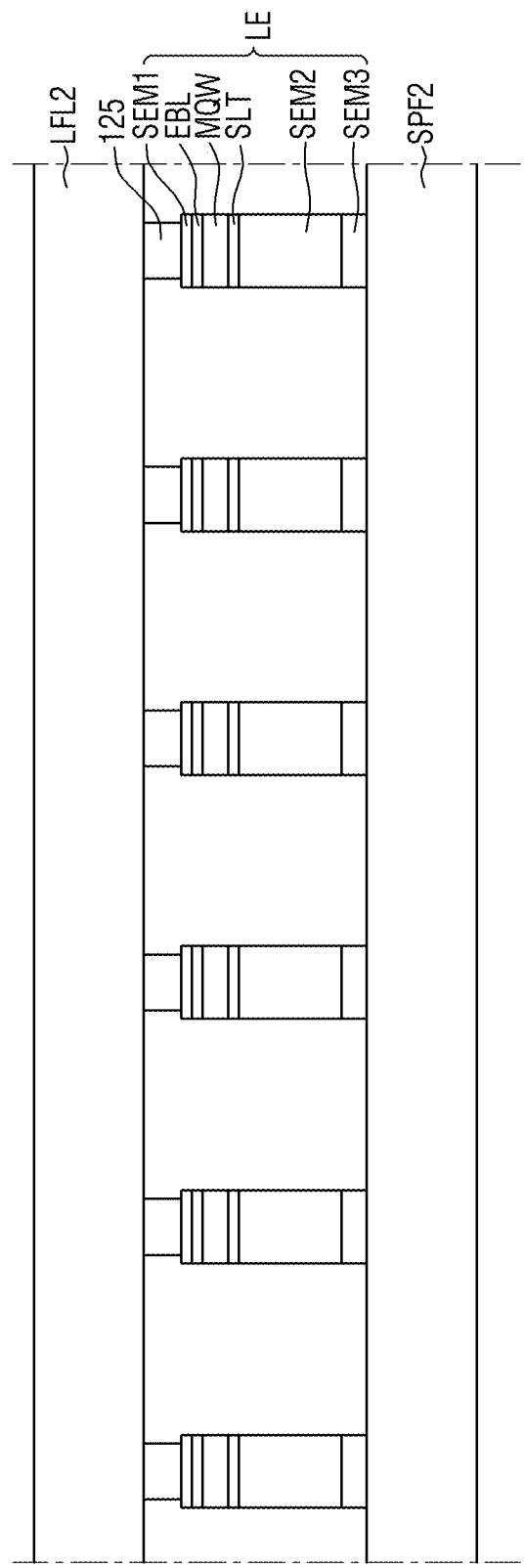

Subsequently, referring to FIG. 41, a second support film SPF2 is attached onto the plurality of light-emitting elements LE from which the first transfer film LFL1 is removed. The second support film SPF2 may be aligned with the plurality of light-emitting elements LE and may be attached to the third semiconductor layer SEM3 of each of the plurality of light-emitting elements LE. The second support film SPF2 may include a support layer and an adhesive layer as in the first support film SPF1 as described above. The detailed description thereof has been described above and thus is omitted.

Figure 42:
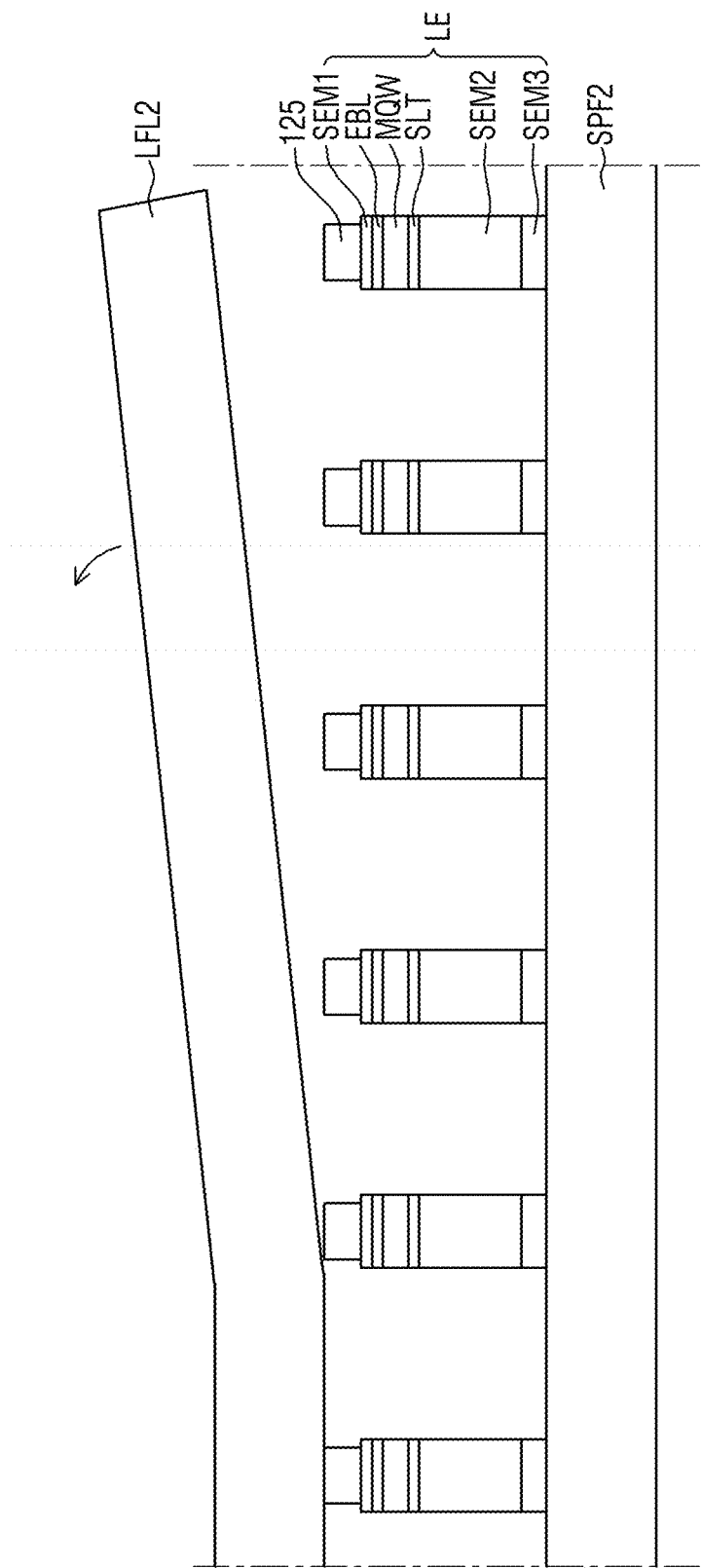

Then, referring to FIG. 42, the second transfer film LFL2 is removed from the plurality of light-emitting elements LE. Specifically, the second transfer film LFL2 attached to the connection electrode 125 of each of the plurality of light-emitting elements LE is removed therefrom. The removal process of the second transfer film LFL2 is the same as the removal process of the first transfer film LFL1 as described above, and thus the description thereof is omitted. The second transfer film LFL2 may be removed from the connection electrode 125 of the plurality of light-emitting elements LE.

Then, a second support film SPF2 is deposited on the display substrate 100. Then, the plurality of light-emitting elements LE is attached to the display substrate 100. Then, the process shown in FIG. 23 to FIG. 29 as described above is carried out. Thus, the display device 10 may be manufactured.

In this embodiment, manufacturing the display device 10 using the transfer film may allow the density of the light-emitting elements LE to be controlled based on the pixel size. Accordingly, the light-emitting elements Les may be arranged in a corresponding manner to the pixels of various sizes. Thus, the display device may be easily manufactured.

Figure 43:
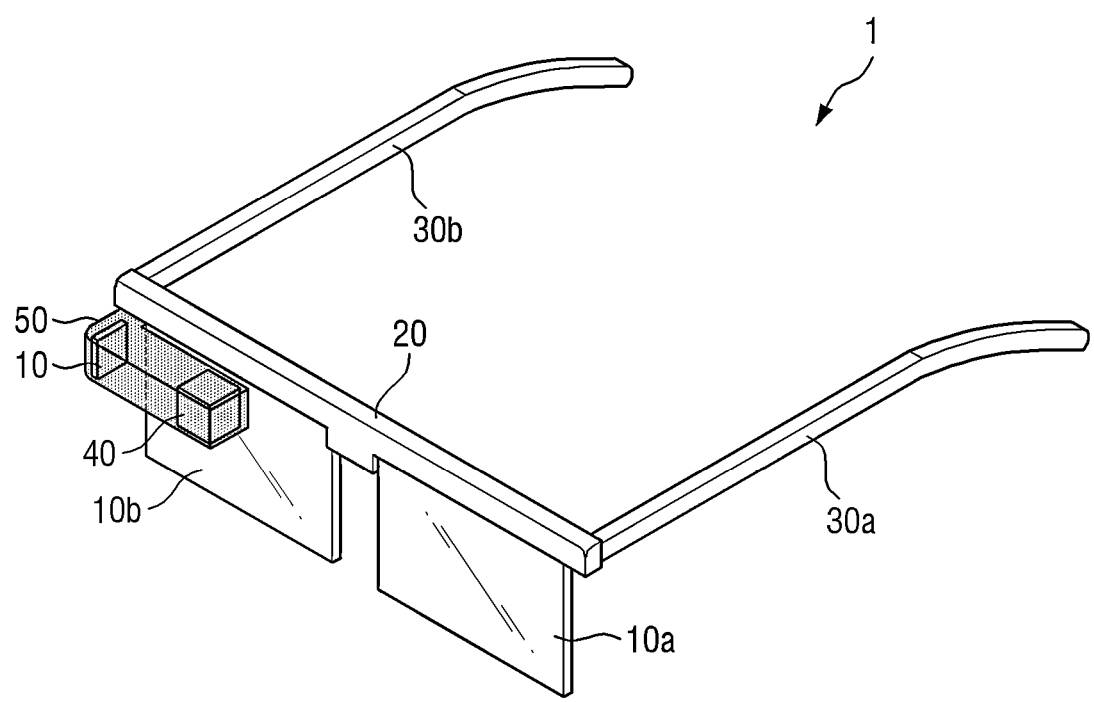
FIG. 43 is an example diagram showing an embodiment of a virtual reality device including a display device.

FIG. 43 is an example diagram showing an embodiment of a virtual reality device including a display device. FIG. 43 shows an embodiment of a virtual reality device 1 to which the display device 10 is applied.

Referring to FIG. 43, the virtual reality device 1 in an embodiment may be a device in a form of glasses. The virtual reality device 1 in an embodiment may include a display device 10, a left-eye lens 10a, a right-eye lens 10b, a support frame 20, left and right legs 30a and 30b, a reflective member 40, and a display device housing 50.

FIG. 43 exemplifies the virtual reality device 1 including the two legs 30a and 30b. However, the invention is not limited thereto. The virtual reality device 1 in an embodiment may be applied to a head mounted display including a head disposed (e.g., mounted) band that may be disposed (e.g., mounted) on a head instead of the legs 30a and 30b. That is, the virtual reality device 1 in an embodiment may not be limited to the example shown in FIG. 43, and may be applied in various forms and in various electronic devices.

The display device housing 50 may receive the display device 10 and the reflective member 40. An image displayed on the display device 10 may be reflected from the reflective member 40 and provided to a user's right-eye through the right-eye lens 10b. Thus, the user may view a virtual reality image displayed on the display device 10 via the right-eye.

FIG. 43 illustrates that the display device housing 50 is disposed at a right end of the support frame 20. However, the invention is not limited thereto. In an embodiment, the display device housing 50 may be disposed at a left end of the support frame 20, for example. In this case, the image displayed on the display device 10 may be reflected from the reflective member 40 and provided to the user's left-eye via the left-eye lens 10a. Thus, the user may view the virtual reality image displayed on the display device 10 via the left-eye. In an alternative embodiment, the display device housing 50 may be disposed at each of the left end and the right end of the support frame 20. In this case, the user may view the virtual reality image displayed on the display device 10 via both the left-eye and the right-eye.

Figure 44:
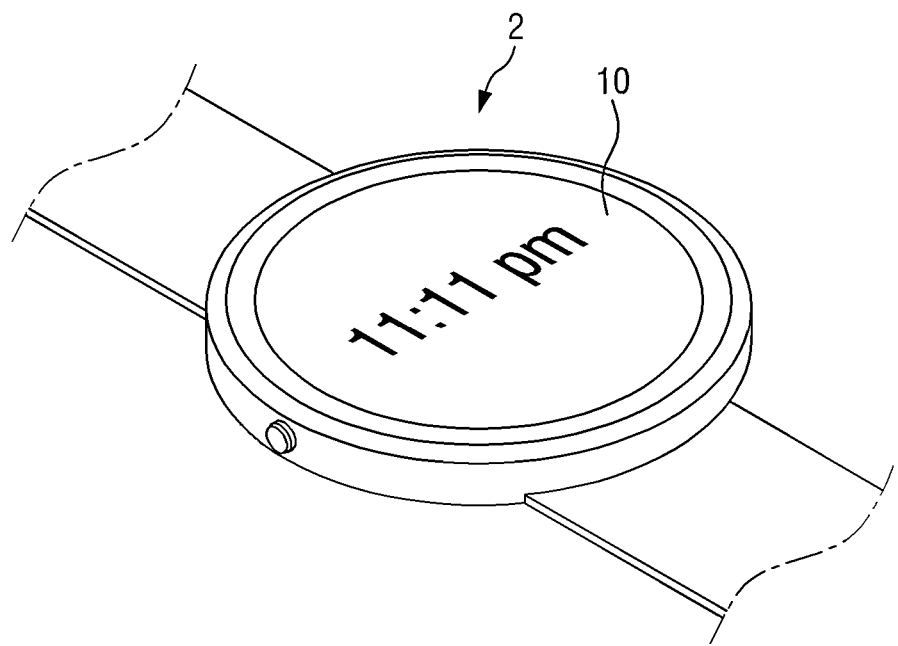
FIG. 44 is an example diagram showing an embodiment of a smart device including a display device.

FIG. 44 is an example diagram showing an embodiment of a smart device including a display device.

Referring to FIG. 44, an embodiment of a display device 10 may be applied to a smart watch 2 as one of smart devices.

Figure 45:
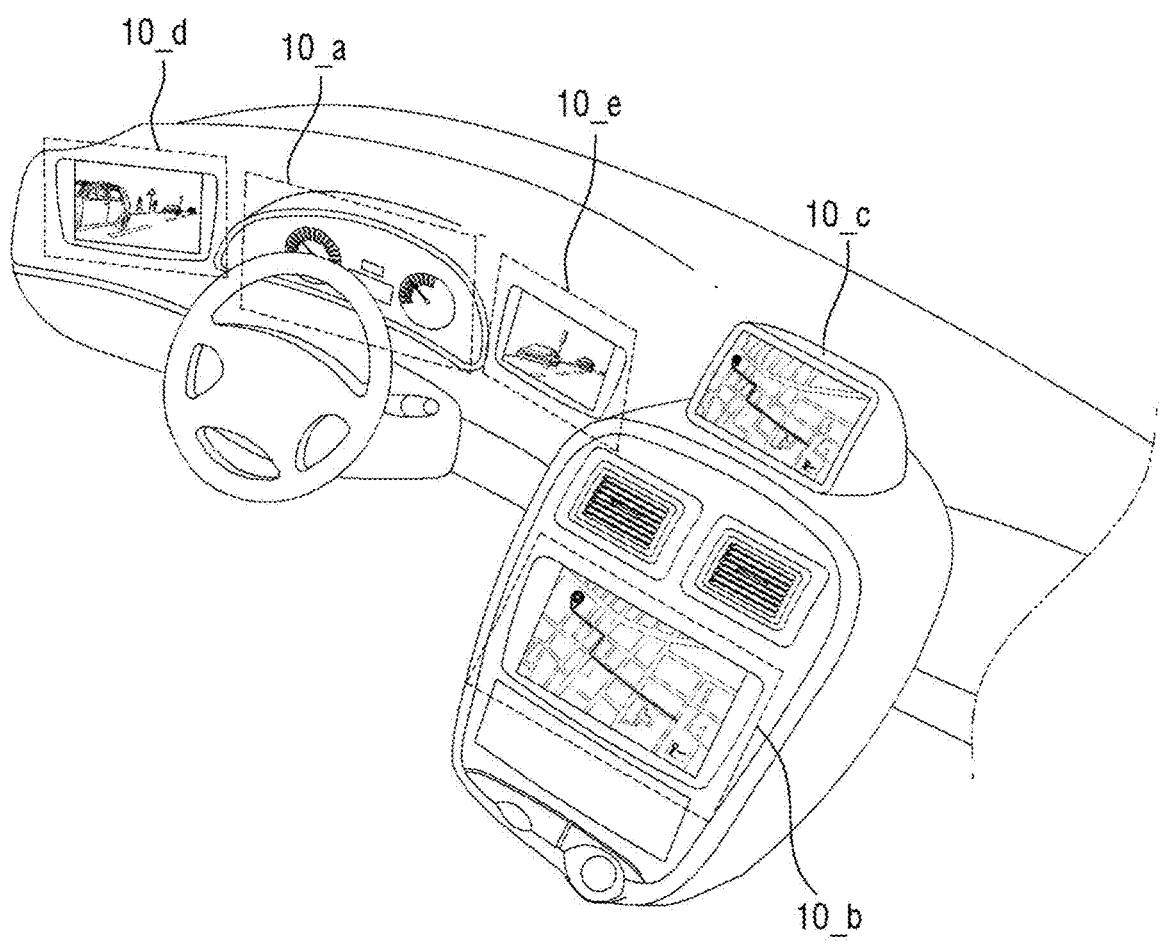
FIG. 45 is a diagram for one example showing an embodiment of a vehicle including a display device.

FIG. 45 is a diagram showing an embodiment of a vehicle including a display device. FIG. 45 shows an embodiment of a vehicle to which display devices are applied.

Referring to FIG. 45, the display devices 10_a, 10_b, and 10_c in an embodiment may be applied to the dashboard of the vehicle, applied to the center fascia of the vehicle, or applied to a center information display ("CID") disposed on the dashboard of the vehicle. Further, each of the display devices 10_d and 10_e in an embodiment may be applied to each room mirror display that replaces each of side mirrors of the vehicle.

Figure 46:
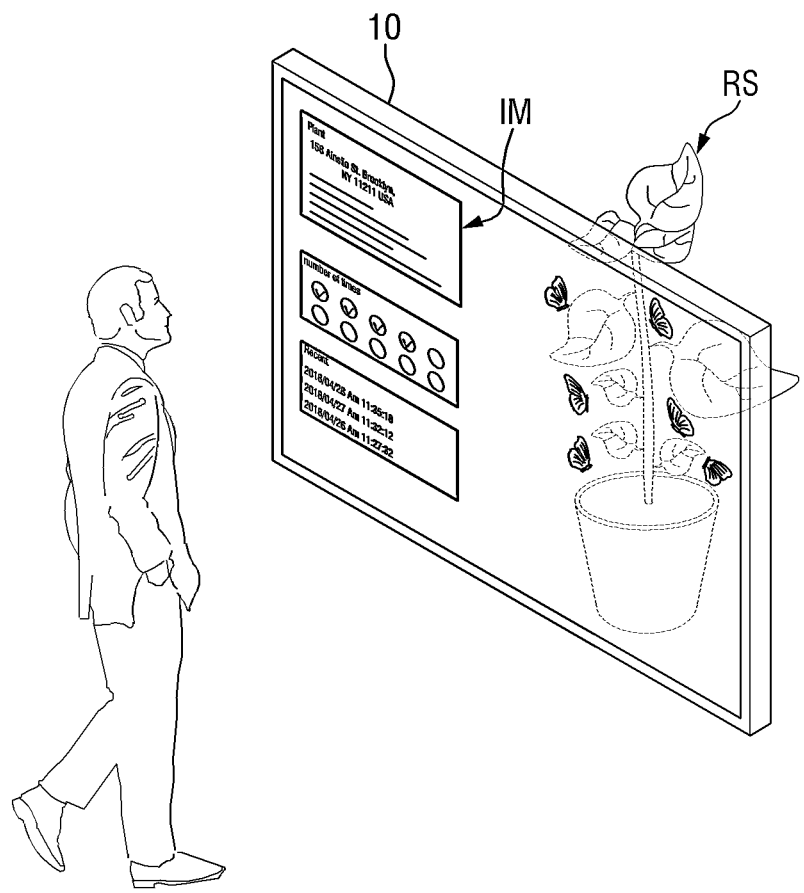
FIG. 46 is a diagram for one example showing an embodiment of a transparent display device including a display device.

FIG. 46 is one example diagram showing an embodiment of a transparent display device including a display device.

Referring to FIG. 46, a display device in an embodiment may be applied to a transparent display device. The transparent display device may transmit light therethrough while displaying an image IM thereon. Therefore, a user disposed in front of the transparent display device may not only view the image IM displayed on the display device 10, but also see an object RS or a background disposed in rear of the transparent display device. When the display device 10 is applied to the transparent display device, the first substrate 110 of the display device 10 shown in FIG. 4 may include a light transmitting portion that may transmit light therethrough or may include a material that may transmit light therethrough.

In concluding the detailed description, those skilled in the art will appreciate that many variations and modifications may be made to the preferred embodiments without substantially departing from the principles of the invention. Therefore, the disclosed preferred embodiments of the invention are used in a generic and descriptive sense only and not for purposes of limitation.

What is claimed is:

1. A display device comprising:
   a substrate;
   a pixel electrode disposed on the substrate;
   a bank covering an edge of the pixel electrode and defining a light-emitting area;
   a first organic layer disposed on the bank and non-overlapping the light-emitting area;
   a plurality of light-emitting elements arranged on the pixel electrode, each of the plurality of light-emitting elements extending perpendicular to the pixel electrode;
   a planarization layer disposed on the pixel electrode, the bank and the first organic layer, and filled between the plurality of light-emitting elements; and a common electrode disposed on the planarization layer and the plurality of light-emitting elements,
wherein the first organic layer is disposed between the bank and the planarization layer, and overlaps the bank.

2. The device of claim 1, wherein each of the first organic layer and the bank includes a polyimide-based compound, wherein the first organic layer and the bank include different polyimide-based compounds from each other.

3. The device of claim 2, wherein the first organic layer includes the polyimide-based compound including a cyano group.

4. The device of claim 3, wherein a transmittance at which light of a wavelength of about 308 nanometers transmits through the first organic layer is smaller than a transmittance at which the light of the wavelength of about 308 nanometers transmits through the bank.

5. The device of claim 4, wherein the transmittance at which the light of the wavelength of about 308 nanometers transmits through the first organic layer is about 0 percent,
wherein an absorption at which the first organic layer absorbs the light of the wavelength of about 308 nanometers is about 100 percent.

6. The device of claim 1, wherein at least a portion of each of the plurality of light-emitting elements protrudes upwardly beyond a top face of the planarization layer.

7. The device of claim 6, wherein a vertical dimension of the planarization layer from a top face of the pixel electrode is smaller than a vertical dimension of each of the plurality of light-emitting elements from the top face of the pixel electrode.

8. The device of claim 1, wherein each of the plurality of light-emitting elements has one end connected to the pixel electrode and an opposite end connected to the common electrode.

9. The device of claim 1, wherein each of the plurality of light-emitting elements includes:
a first semiconductor layer;
an active layer disposed on the first semiconductor layer;
a second semiconductor layer disposed on the active layer; and
a third semiconductor layer disposed on the second semiconductor layer.

10. The device of claim 9, wherein the first semiconductor layer includes a p-type dopant and is adjacent to the pixel electrode,
wherein the second semiconductor layer includes an n-type dopant, and
wherein the third semiconductor layer is adjacent to the common electrode.

11. The device of claim 9, further comprising a connection electrode disposed on the first semiconductor layer of each of the plurality of light-emitting elements, wherein the connection electrode contacts the pixel electrode.

12. The device of claim 11, wherein the connection electrode and the pixel electrode include a same material as each other.

13. The device of claim 12, wherein the pixel electrode includes at least a reflective layer and an upper electrode layer disposed on the reflective layer, wherein the upper electrode layer is in contact with the connection electrode, wherein the connection electrode and the upper electrode layer include the same material as each other.

14. The device of claim 13, wherein each of the connection electrode and the upper electrode layer include indium-tin-oxide.

15. The device of claim 9, wherein the second semiconductor layer and the third semiconductor layer of each of the plurality of light-emitting elements protrude upwardly beyond a top face of the planarization layer.

16. The device of claim 15, wherein the common electrode covers a top face of the third semiconductor layer and is in contact with side faces of each of the third semiconductor layer and the second semiconductor layer.

17. A display device comprising:
a substrate;
a plurality of pixel electrodes disposed on the substrate;
a bank covering an edge of each of the plurality of pixel electrodes and defining each of a plurality of light-emitting areas;
a first organic layer disposed on the bank and non-overlapping the plurality of light-emitting areas;
a plurality of light-emitting elements arranged on each of the pixel electrodes, each of the plurality of light-emitting elements extending perpendicular to each pixel electrode;
a planarization layer disposed on the pixel electrode, the bank and the first organic layer, and interposed between the plurality of light-emitting elements; and
a common electrode disposed on the planarization layer and the plurality of light-emitting elements,
wherein the first organic layer and the bank include different materials from each other, and
wherein the first organic layer includes a polyimide-based compound including a cyano group.

18. The device of claim 17, further comprising:
a partitioning wall which is disposed on the common electrode and in which a plurality of openings is defined;
a wavelength conversion layer received in each of the plurality of openings; and
a plurality of color filters, each of the plurality of color filters being disposed on the wavelength conversion layer and the partitioning wall.

19. The device of claim 18, wherein the partitioning wall overlaps the bank and the first organic layer,
wherein the plurality of openings respectively overlaps the plurality of light-emitting areas.

20. The device of claim 18, wherein the plurality of color filters includes:
a first color filter which transmits therethrough first light emitting from each of the plurality of light-emitting elements;
a second color filter which transmits therethrough second light having a wavelength band different from a wavelength band of the first light; and
a third color filter which transmits therethrough third light having a wavelength band different from the wavelength bands of the first light and the second light.

21. The device of claim 20, wherein the wavelength conversion layer converts a portion of the first light into fourth light, and outputs fifth light as a combination of the first light and the fourth light,
wherein the fifth light emitting from the wavelength conversion layer is converted to the first light through the first color filter,
wherein the fifth light emitting from the wavelength conversion layer is converted to the second light through the second color filter, and
wherein the fifth light emitting from the wavelength conversion layer is converted to the third light through the third color filter.

22. The device of claim 20, wherein the wavelength conversion layer includes:

a light-transmissive pattern which transmits the first light therethrough;

a first wavelength conversion pattern which converts the first light to the second light; and a second wavelength conversion pattern which converts the first light to the third light, wherein the light-transmissive pattern overlaps the first color filter, the first wavelength conversion pattern overlaps the second color filter, and the second wavelength conversion pattern overlaps the third color filter.

23. A method for manufacturing a display device, the method comprising:

forming a plurality of light-emitting elements on a base substrate;

forming a display substrate including a pixel electrode and a first organic layer;

bonding the base substrate and the display substrate to each other such that the plurality of light-emitting elements is adhered onto the pixel electrode and the first organic layer;

irradiating first laser to the base substrate such that the base substrate is removed from the plurality of light-emitting elements;

irradiating second laser to the first organic layer such that the plurality of light-emitting elements adhered on the first organic layer is removed from the first organic layer;

forming a planarization layer on the pixel electrode and the first organic layer; and forming a common electrode on the planarization layer.

24. The method of claim 23, wherein the forming the display substrate includes:

forming the pixel electrode on a first substrate;

forming a bank on the pixel electrode; and forming the first organic layer on the bank.

25. The method of claim 23, wherein the first organic layer includes a polyimide-based compound including a cyano group.

26. The method of claim 23, wherein the first laser includes KrF excimer laser having a wavelength of about 248 nanometers, wherein the second laser includes XeCl excimer laser having a wavelength of about 308 nanometers.

27. The method of claim 23, wherein upon absorbing the second laser, the first organic layer is ablated, such that the plurality of light-emitting elements adhered on the first organic layer is removed from the first organic layer.

* * * * *